US012672552B2

(12) United States Patent
Kuo et al.

(10) Patent No.: US 12,672,552 B2
(45) Date of Patent: Jun. 30, 2026

(54) PASSIVE SEMICONDUCTOR DEVICE

(71) Applicant: Taiwan Semiconductor Manufacturing Company, Ltd., Hsinchu (TW)

(72) Inventors: Fu-Chiang Kuo, Hsinchu City (TW); Meei-Shiou Chern, Hsinchu County (TW); Jyun-Ting Hou, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 379 days.

(21) Appl. No.: 18/128,357

(22) Filed: Mar. 30, 2023

(65) Prior Publication Data

US 2024/0079353 A1     Mar. 7, 2024

Related U.S. Application Data

(60) Provisional application No. 63/374,432, filed on Sep. 2, 2022.

(51) Int. Cl.
H10W 70/65        (2026.01)
H01G 4/012        (2006.01)
        (Continued)

(52) U.S. Cl.
CPC .......... H10W 44/601 (2026.01); H10D 1/042 (2025.01); H10D 1/043 (2025.01);
        (Continued)

(58) Field of Classification Search
CPC .......... H01G 4/012; H01G 4/33; H01G 4/385; H01L 23/642; H01L 23/5386;
        (Continued)

(56) References Cited

U.S. PATENT DOCUMENTS

| | | | |
|---|---|---|---|
| 6,437,385 B1 * | 8/2002 | Bertin ................. | H10B 12/038 |
| | | | 257/E21.651 |
| 2013/0175666 A1 * | 7/2013 | Tran ........................ | H10D 1/68 |
| | | | 257/532 |

(Continued)

FOREIGN PATENT DOCUMENTS

| | | |
|---|---|---|
| TW | 202013724 A | 4/2020 |
| TW | 202218107 A | 5/2022 |

*Primary Examiner* — Omar F Mojaddedi
(74) *Attorney, Agent, or Firm* — Sterne, Kessler, Goldstein & Fox P.L.L.C.

(57)        ABSTRACT
A semiconductor device with capacitive structures and a method of fabricating the same are disclosed. The semiconductor device includes a substrate, first and second trenches disposed in the substrate and separated from each other by a substrate region of the substrate, first, second, and third conductive layers disposed in the first and second trenches and on the substrate region in a stacked configuration, a nitride layer including first and second nitride portions disposed on the first and second trenches and on the substrate region, and first and second contact structures configured to provide first and second voltages to the first and second conductive layers. The first nitride portion is disposed on the first conductive layer and on sidewalls of the second and third conductive layers. The second nitride portion is disposed on the second conductive layer and on sidewalls of the third conductive layers.

20 Claims, 50 Drawing Sheets

(51) Int. Cl.

| | |
|---|---|
| *H01G 4/33* | (2006.01) |
| *H10D 1/00* | (2025.01) |
| *H10D 1/68* | (2025.01) |
| *H10W 44/00* | (2026.01) |
| *H10W 70/05* | (2026.01) |
| *H10W 70/60* | (2026.01) |
| *H10W 90/00* | (2026.01) |

(52) U.S. Cl.

CPC ............. *H10D 1/696* (2025.01); *H10D 1/716* (2025.01); *H10W 70/095* (2026.01); *H10W 70/611* (2026.01); *H10W 70/65* (2026.01); *H10W 90/00* (2026.01); *H10W 90/401* (2026.01)

(58) Field of Classification Search

CPC ............. H01L 23/5385; H01L 23/3128; H01L 25/0655; H01L 25/16; H10D 1/042; H10D 1/043; H10D 1/696; H10D 1/716; H10D 1/68; H10W 44/601; H10W 90/00; H10W 90/401; H10W 74/117; H10W 70/095; H10W 70/611; H10W 70/065

See application file for complete search history.

(56) References Cited

U.S. PATENT DOCUMENTS

| | | | |
|---|---|---|---|
| 2020/0066922 A1 | 2/2020 | Cheng et al. | |
| 2020/0098855 A1* | 3/2020 | Kuo ....................... | H10D 1/042 |
| 2020/0161416 A1 | 5/2020 | Tsai et al. | |
| 2021/0005393 A1* | 1/2021 | Lu ........................... | H10D 1/716 |
| 2022/0130949 A1 | 4/2022 | Huang et al. | |

\* cited by examiner

600

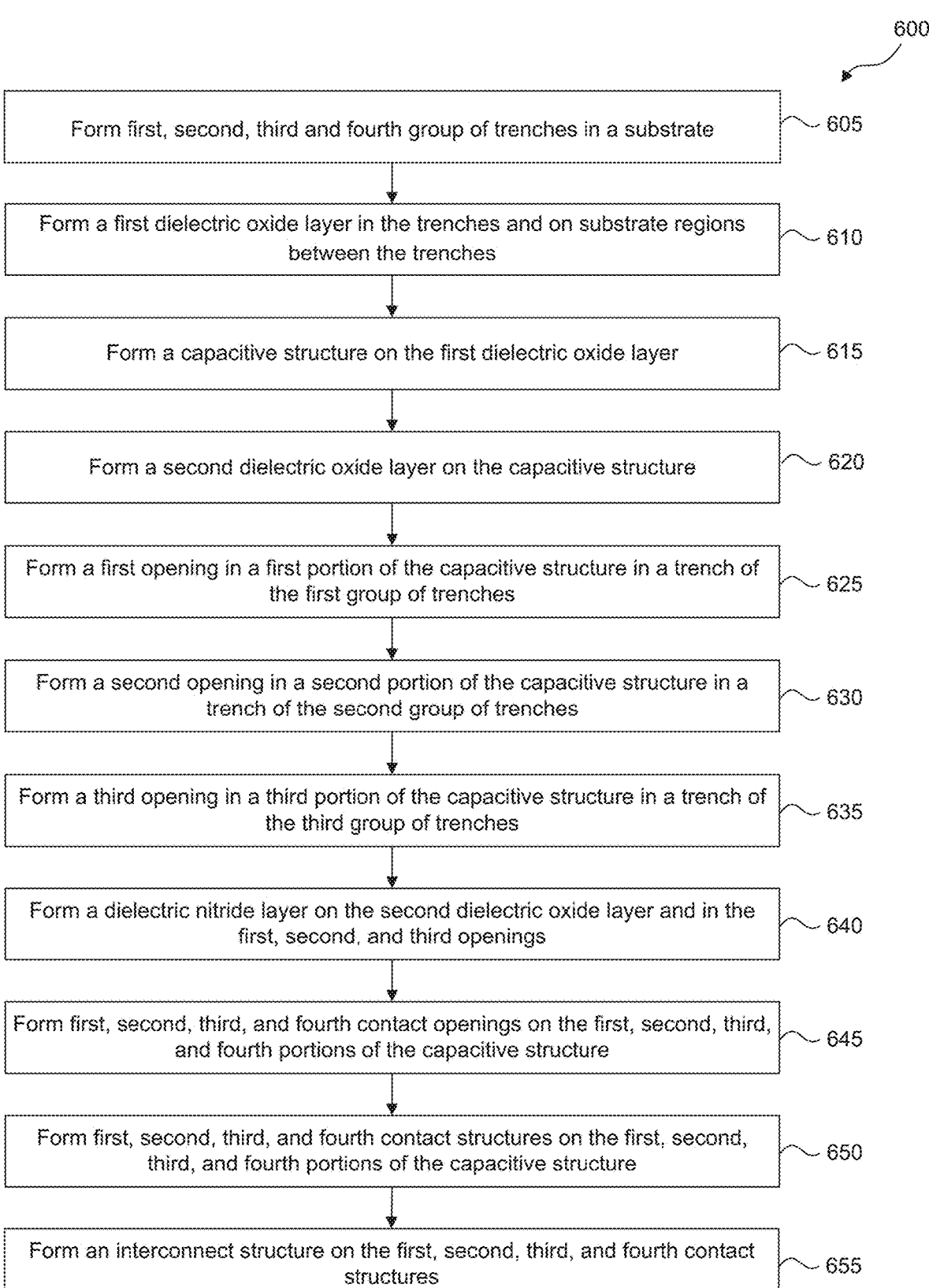

Form first, second, third and fourth group of trenches in a substrate — 605

Form a first dielectric oxide layer in the trenches and on substrate regions between the trenches — 610

Form a capacitive structure on the first dielectric oxide layer — 615

Form a second dielectric oxide layer on the capacitive structure — 620

Form a first opening in a first portion of the capacitive structure in a trench of the first group of trenches — 625

Form a second opening in a second portion of the capacitive structure in a trench of the second group of trenches — 630

Form a third opening in a third portion of the capacitive structure in a trench of the third group of trenches — 635

Form a dielectric nitride layer on the second dielectric oxide layer and in the first, second, and third openings — 640

Form first, second, third, and fourth contact openings on the first, second, third, and fourth portions of the capacitive structure — 645

Form first, second, third, and fourth contact structures on the first, second, third, and fourth portions of the capacitive structure — 650

Form an interconnect structure on the first, second, third, and fourth contact structures — 655

Fig. 6

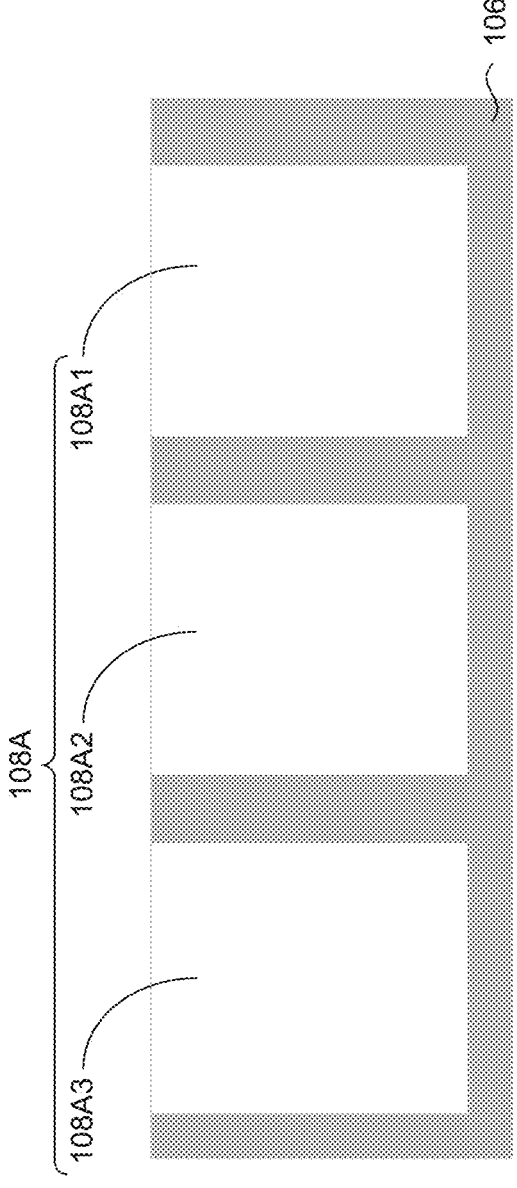
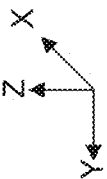
Fig. 7

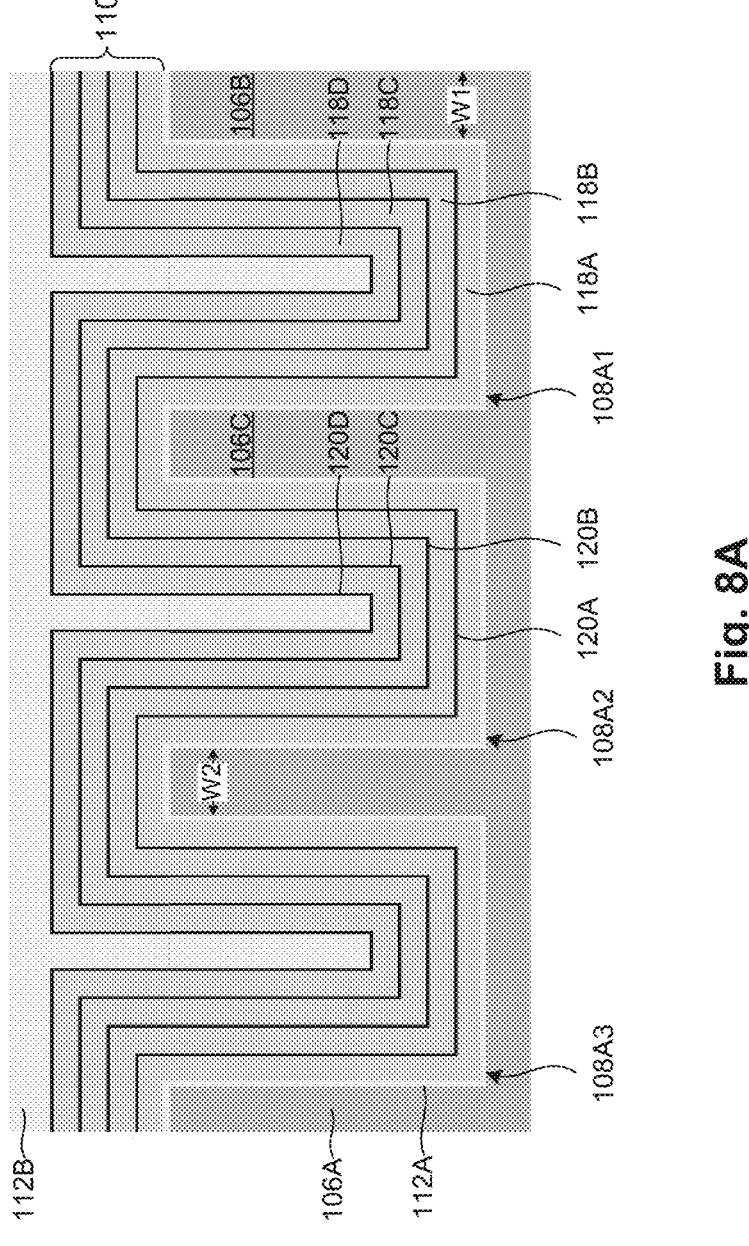
Fig. 8A
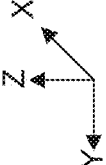

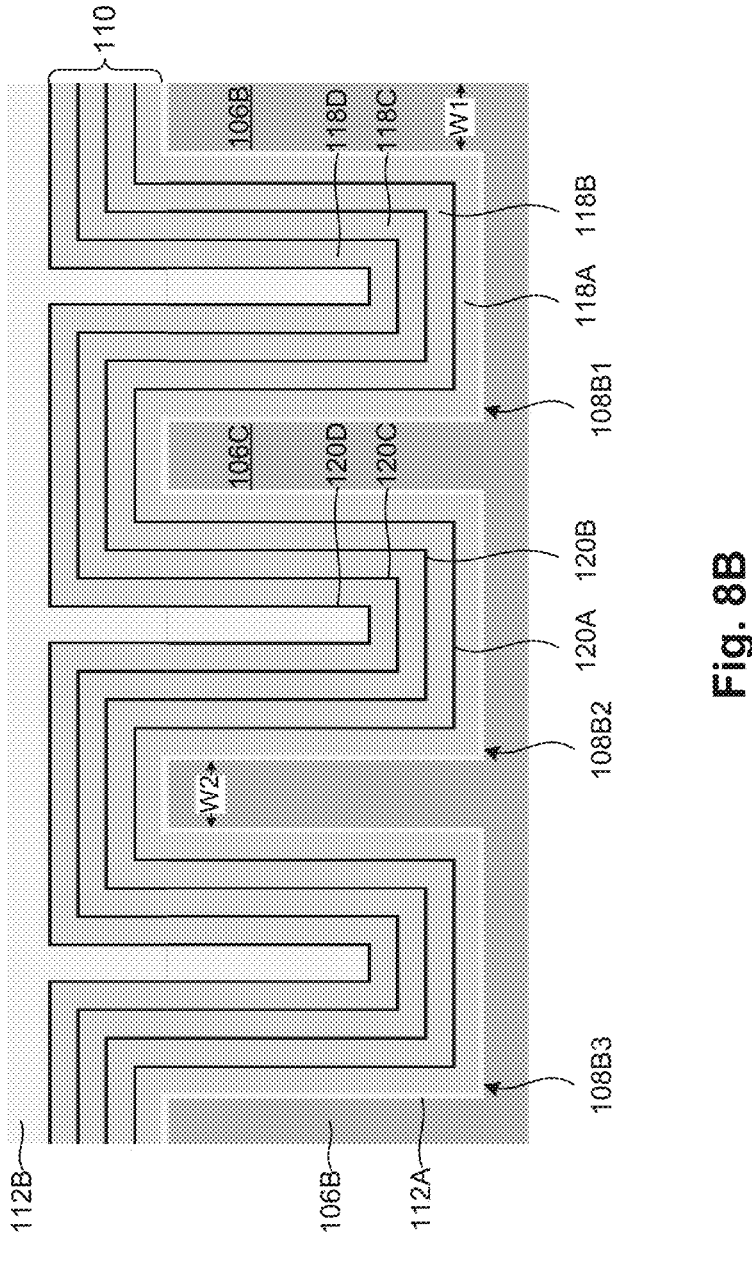
Fig. 8B
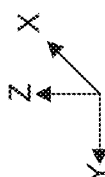

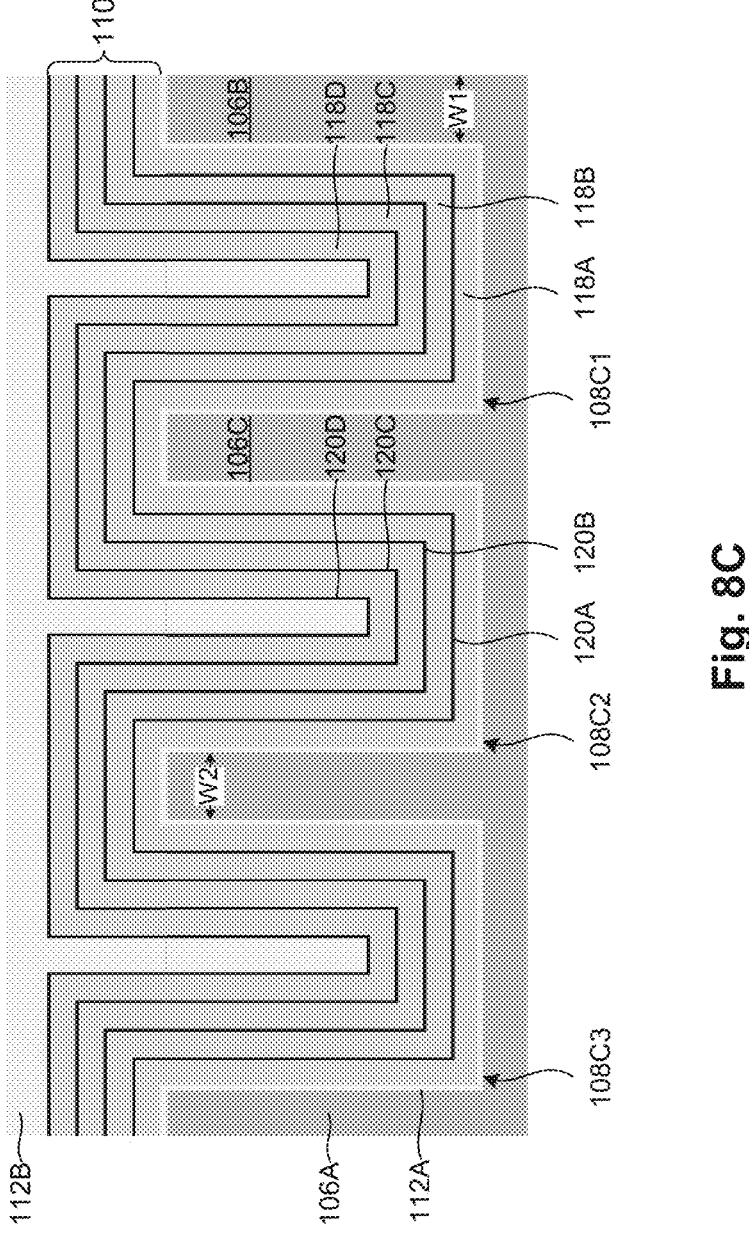
Fig. 8C
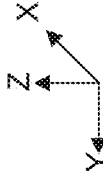

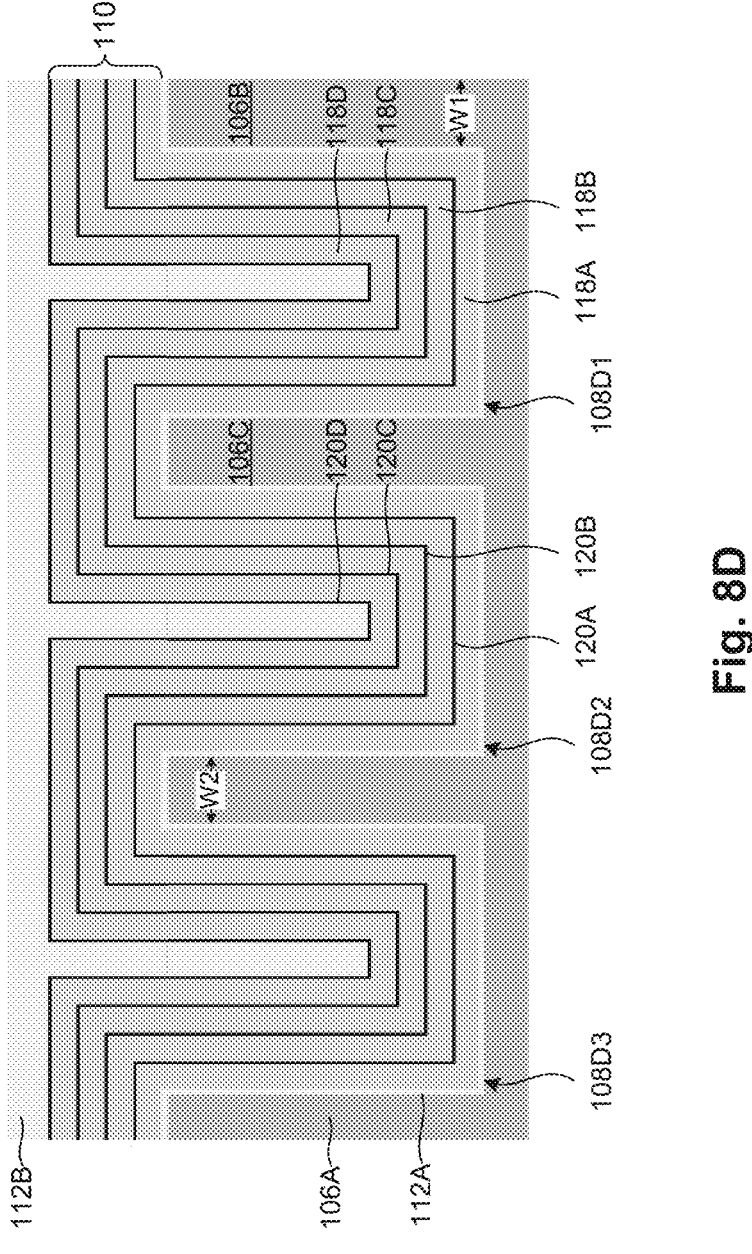
Fig. 8D
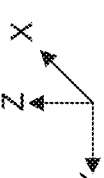

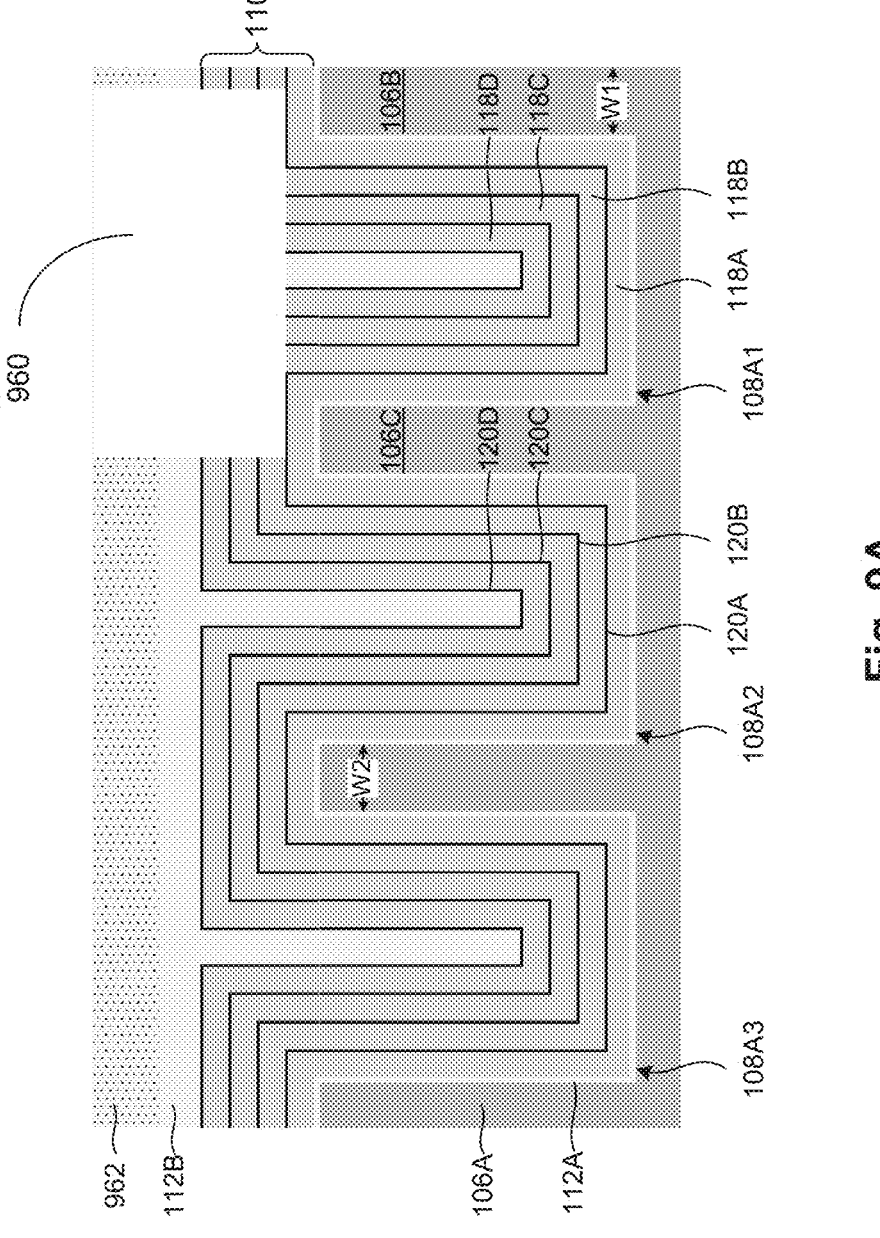
Fig. 9A
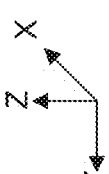

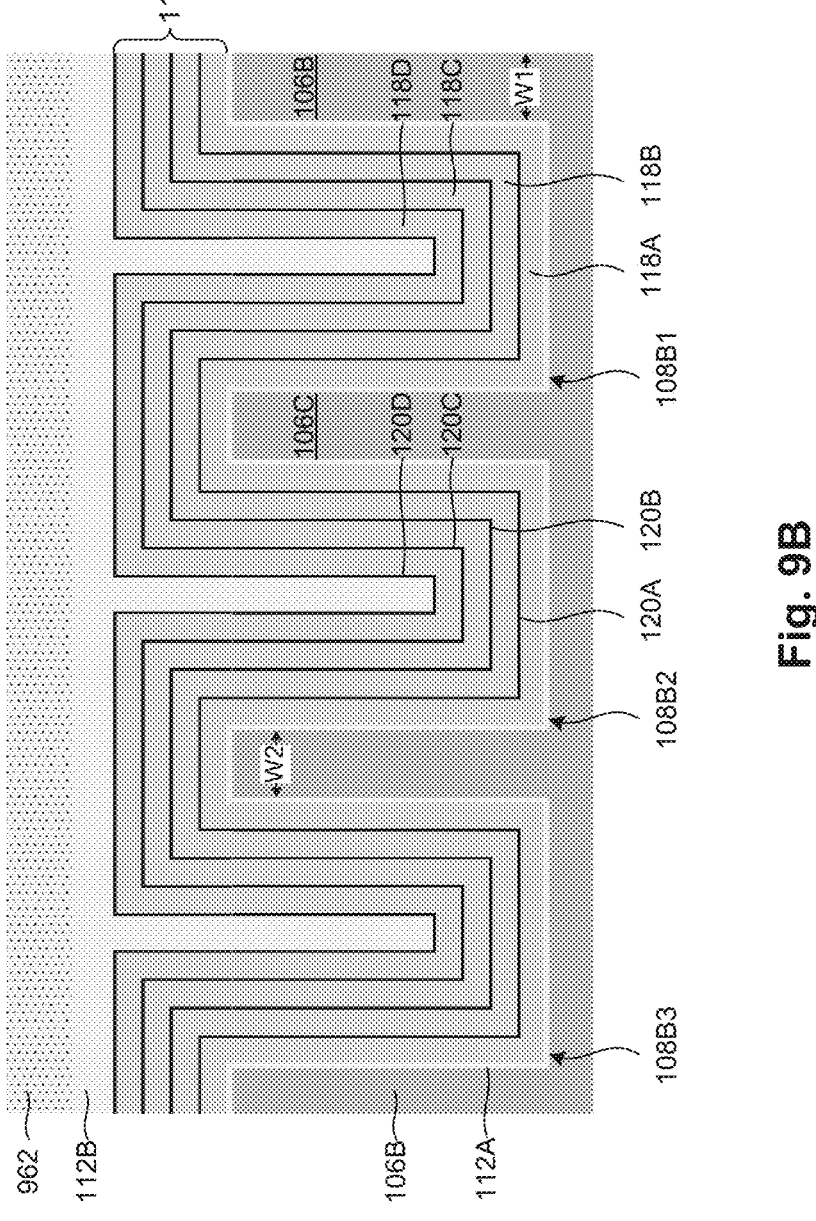
Fig. 9B

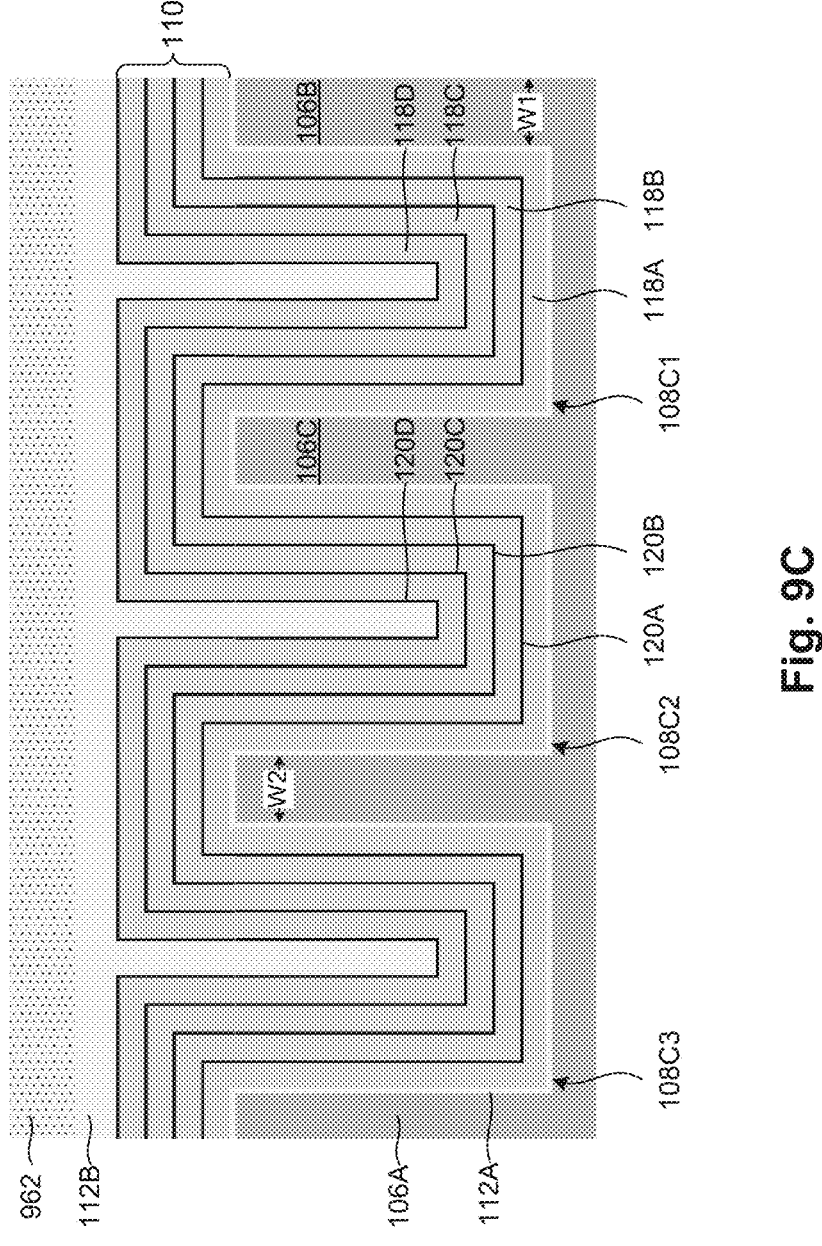
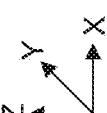
Fig. 9C

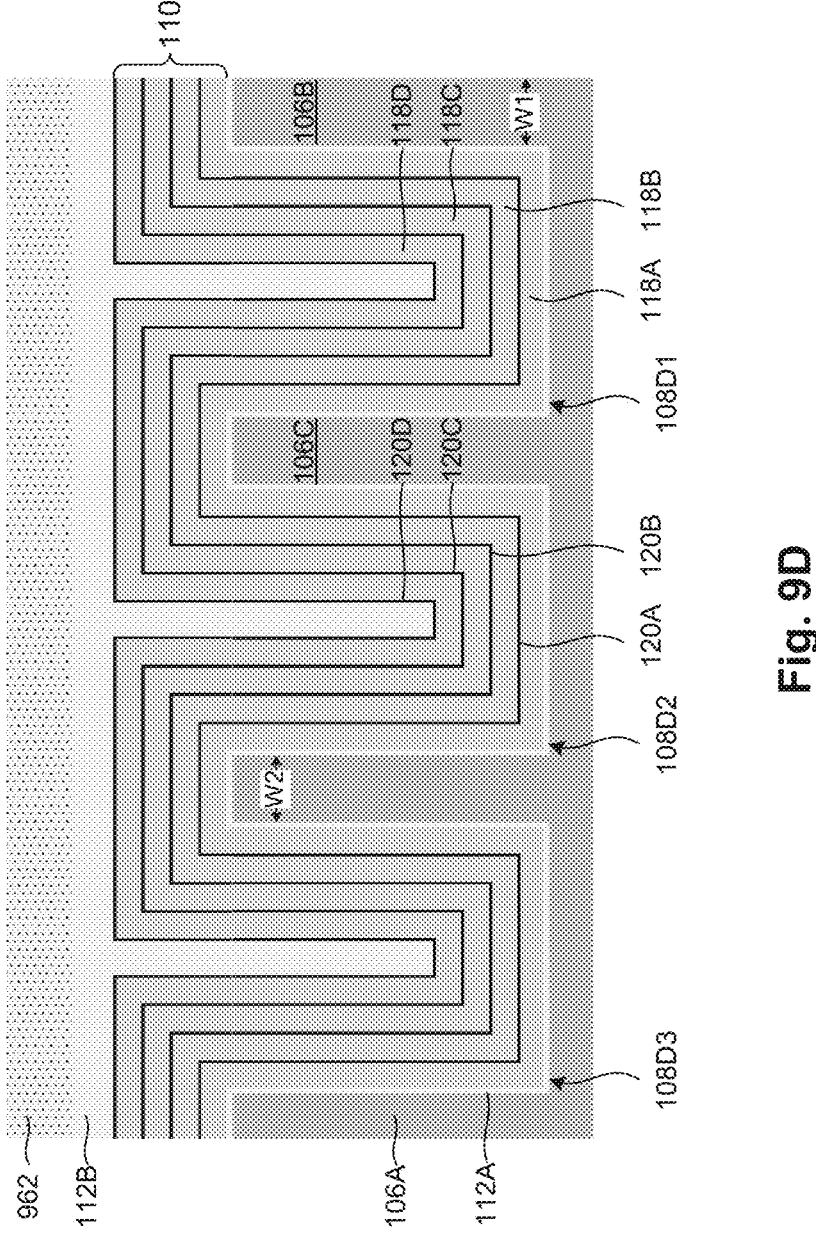
Fig. 9D
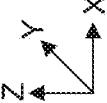

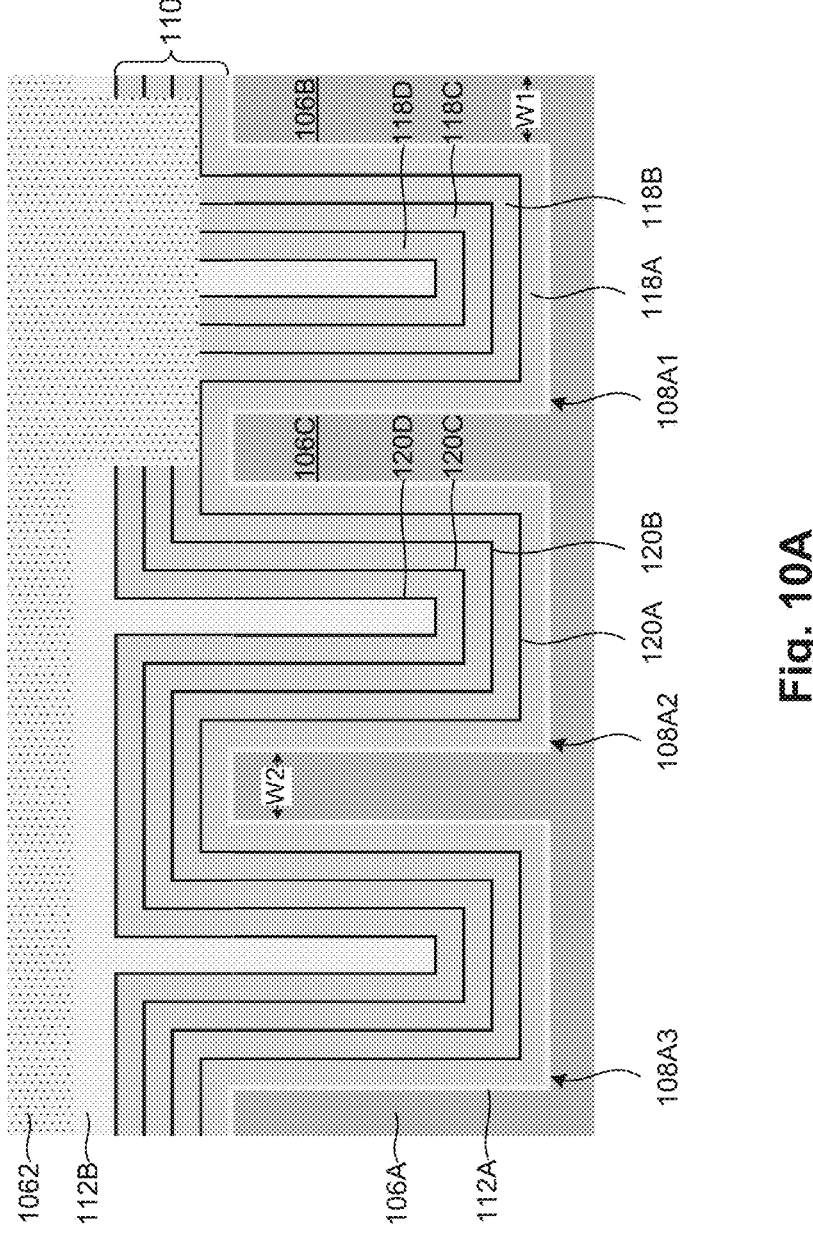
Fig. 10A
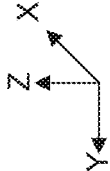

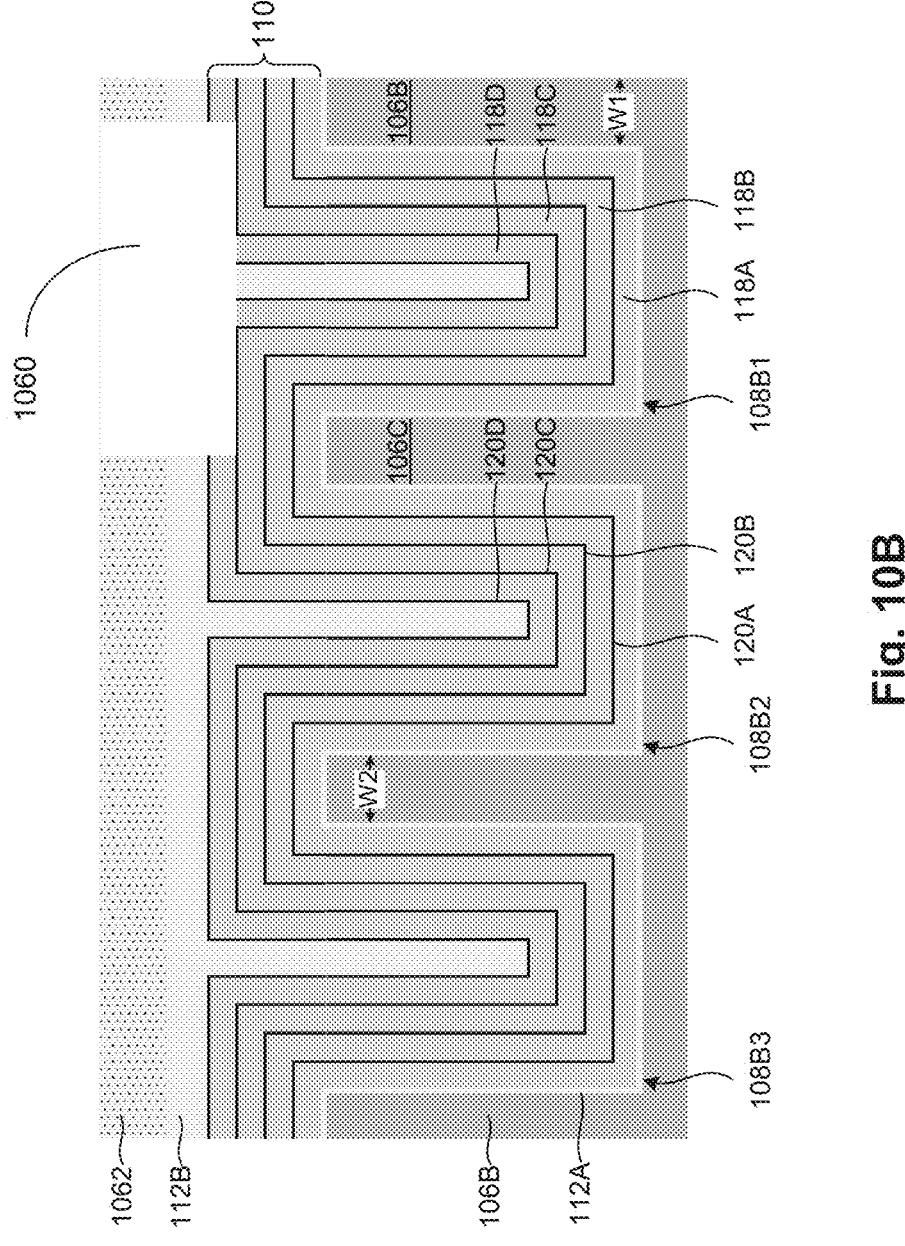
Fig. 10B
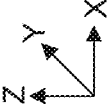

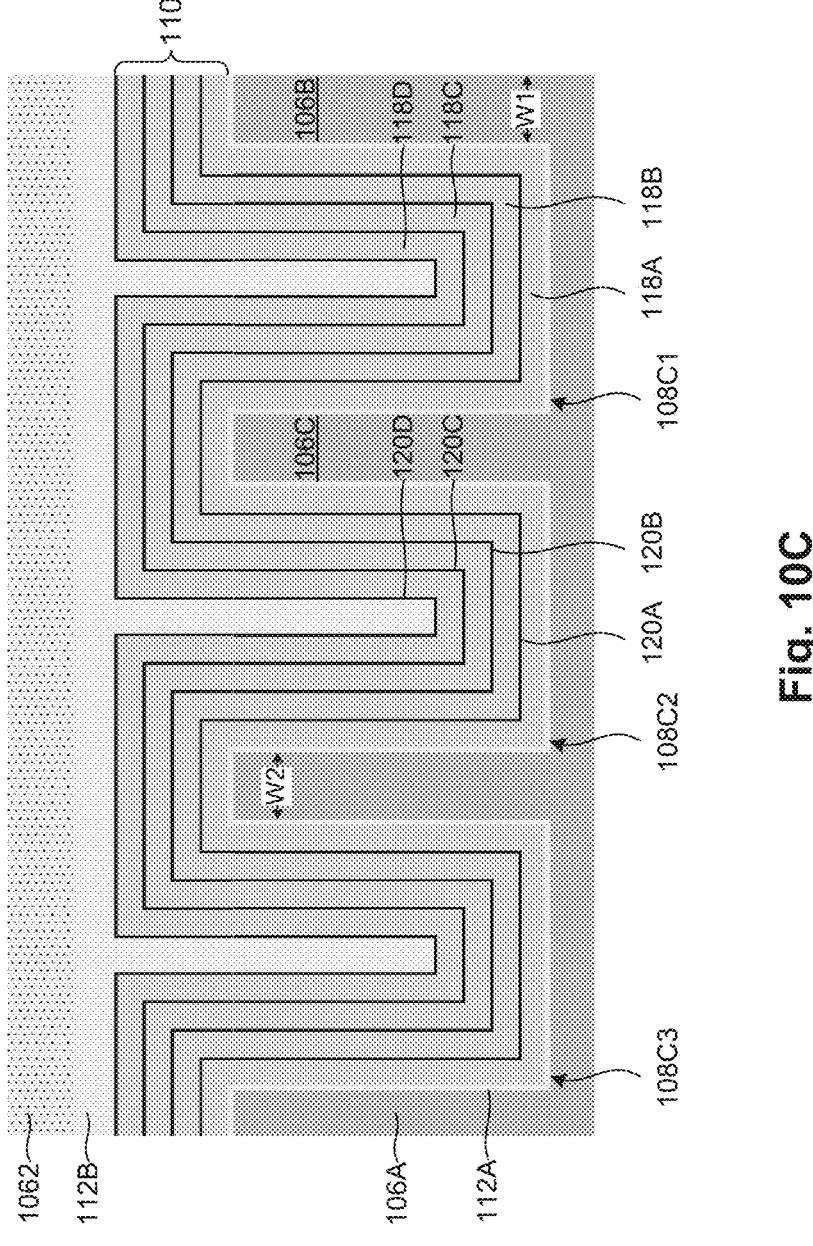
Fig. 10C
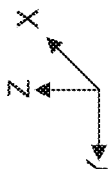

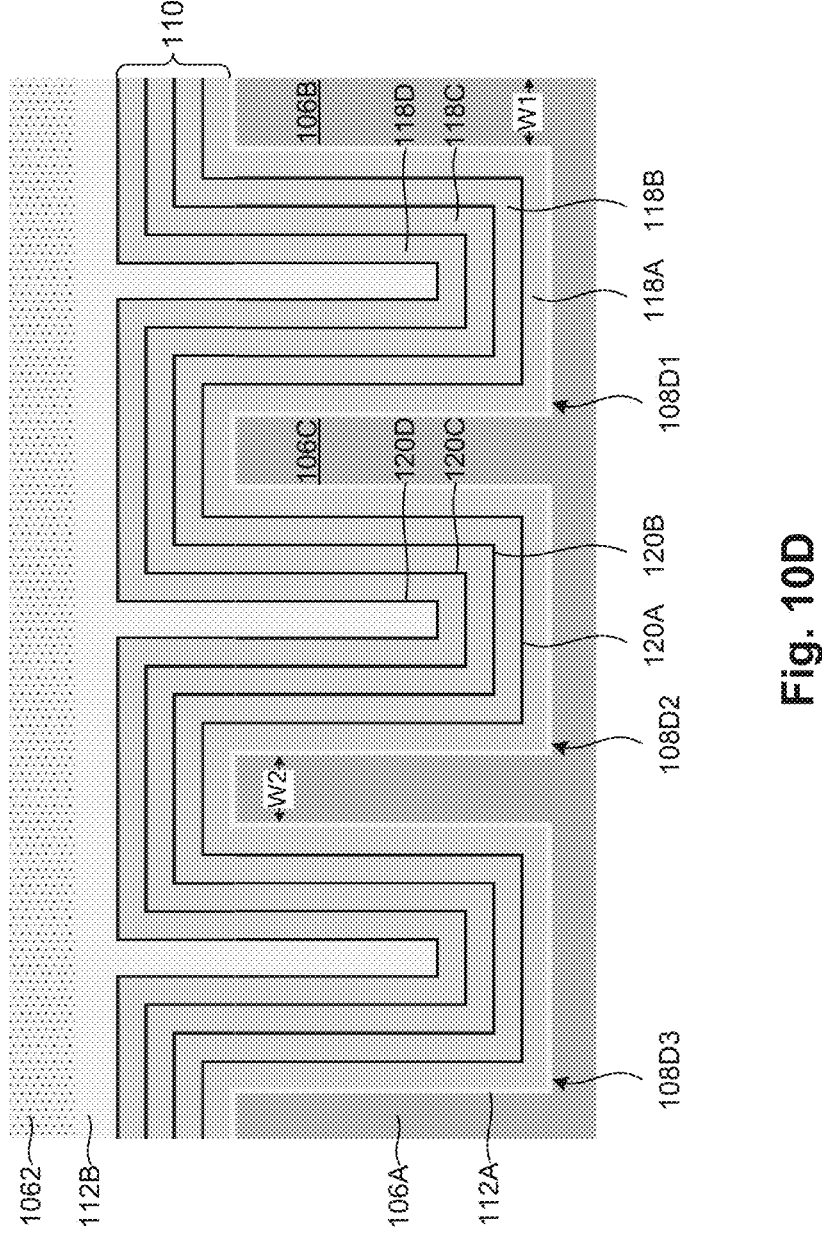
Fig. 10D
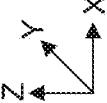

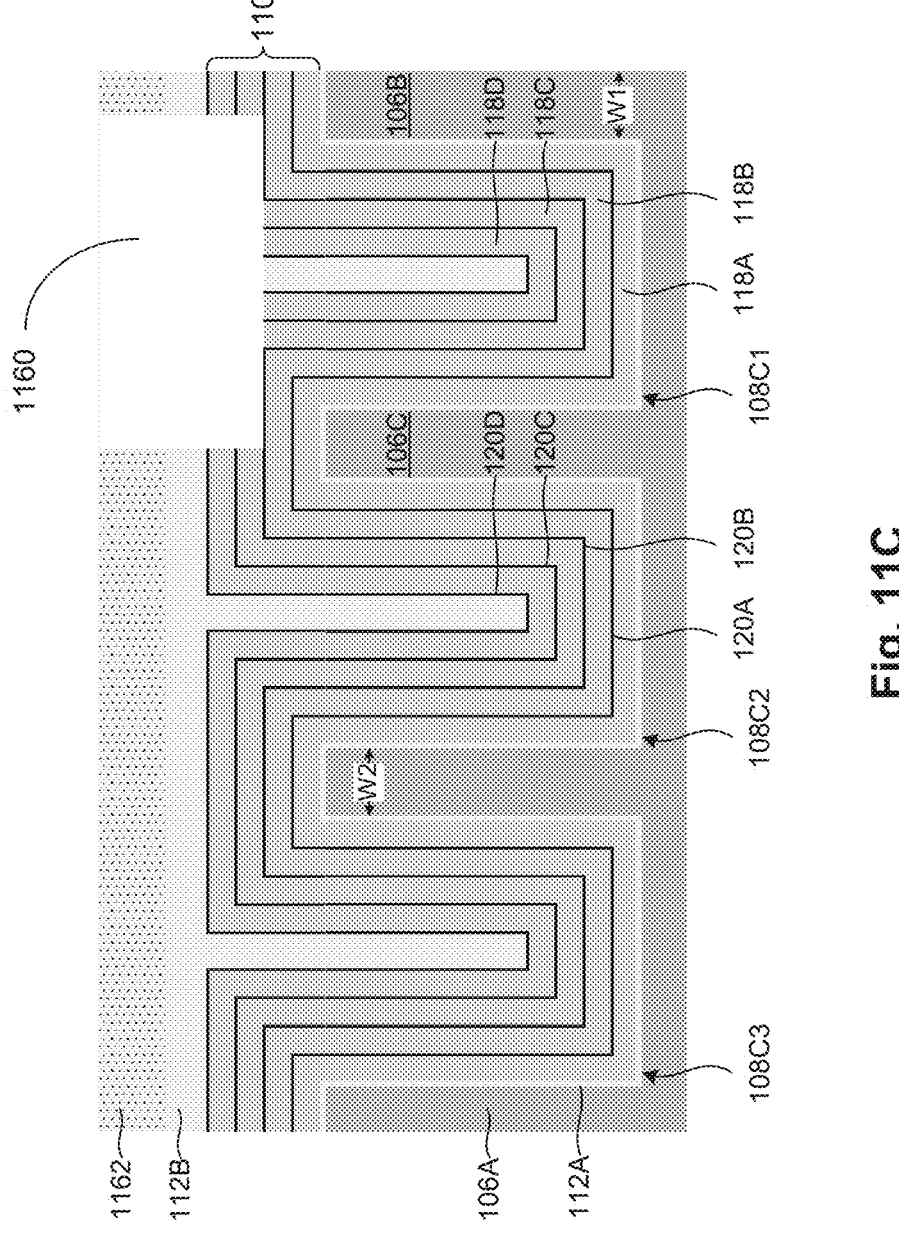
Fig. 11C
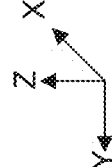

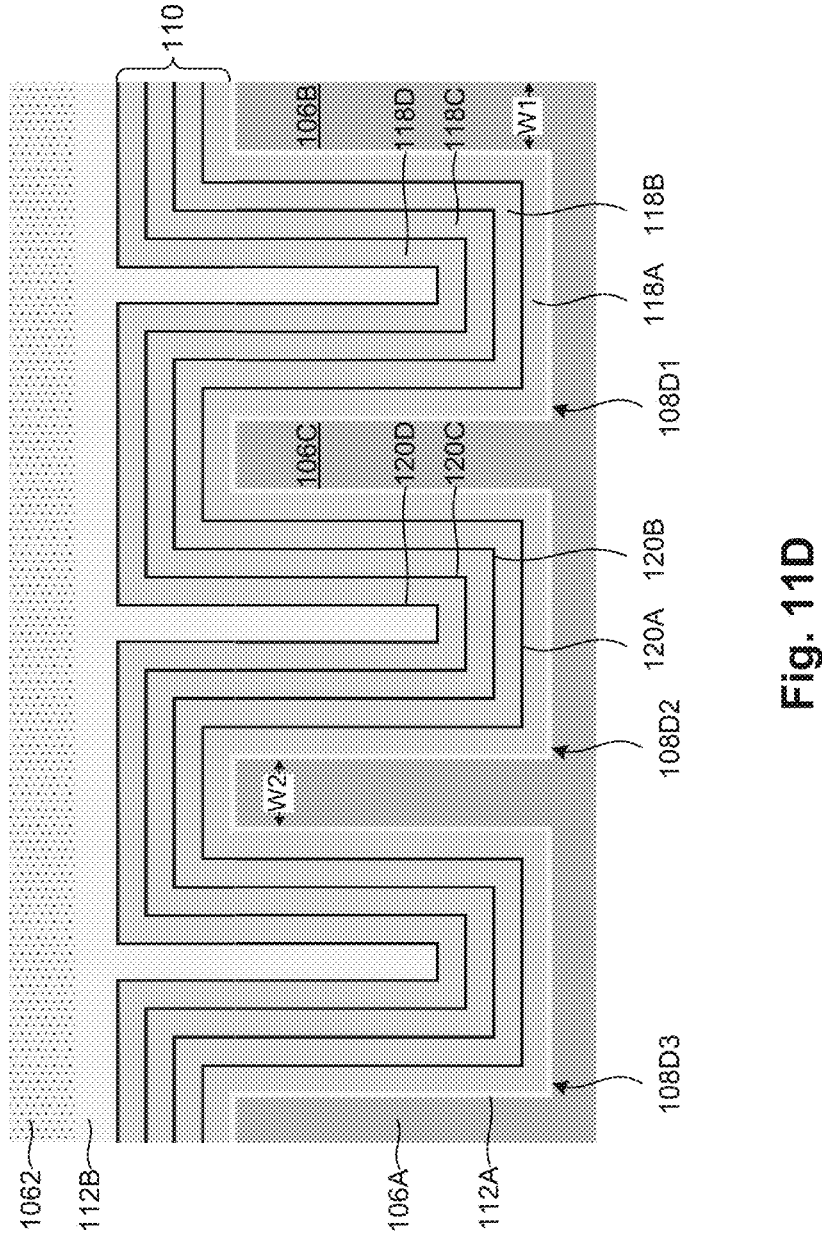
Fig. 11D

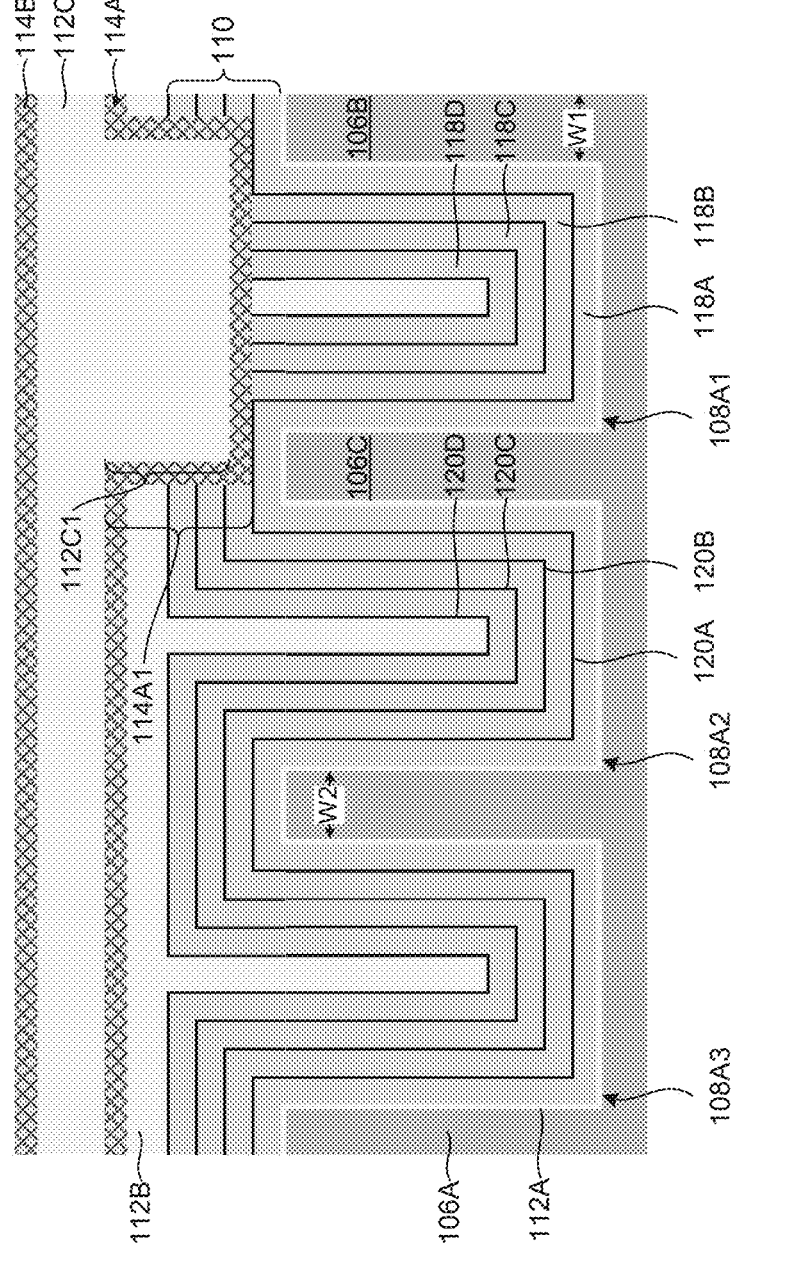
Fig. 12A
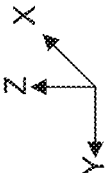

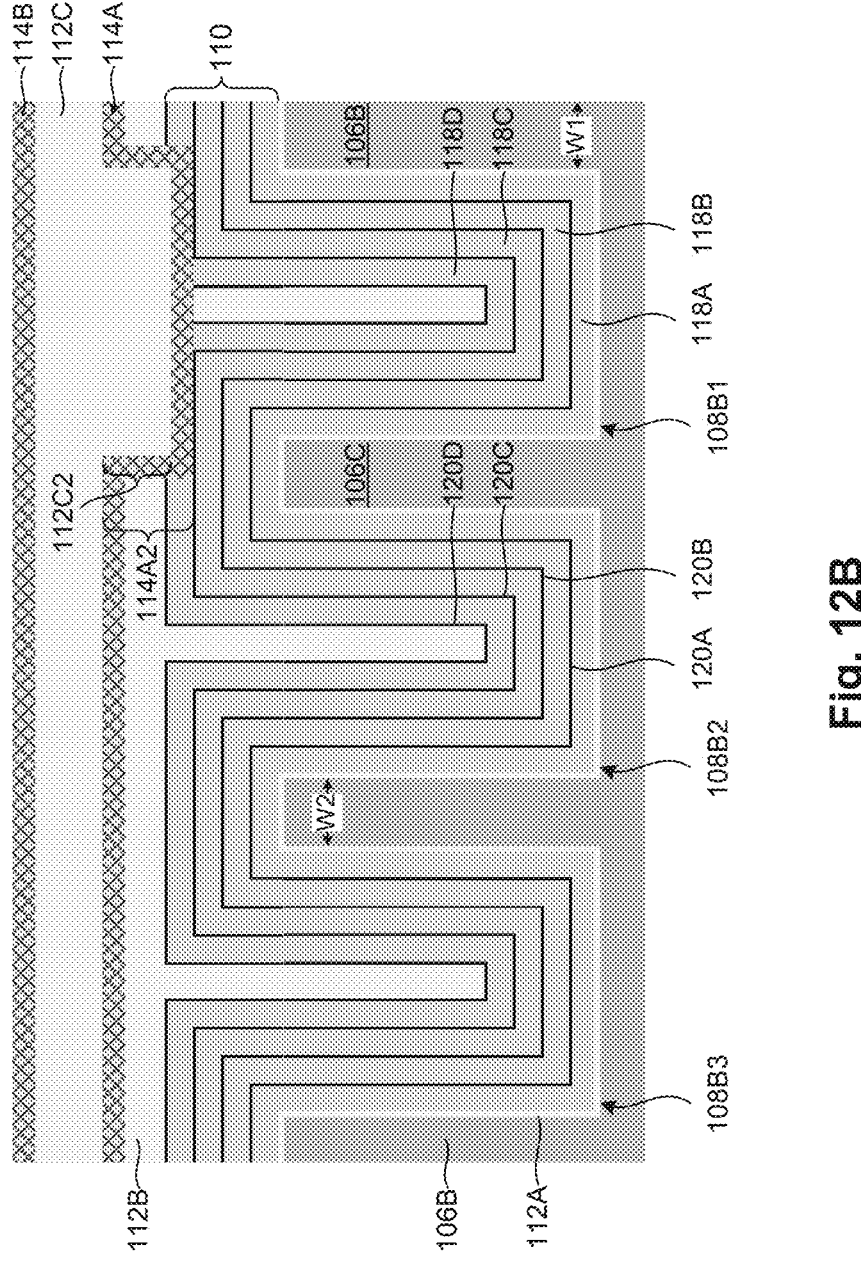
Fig. 12B

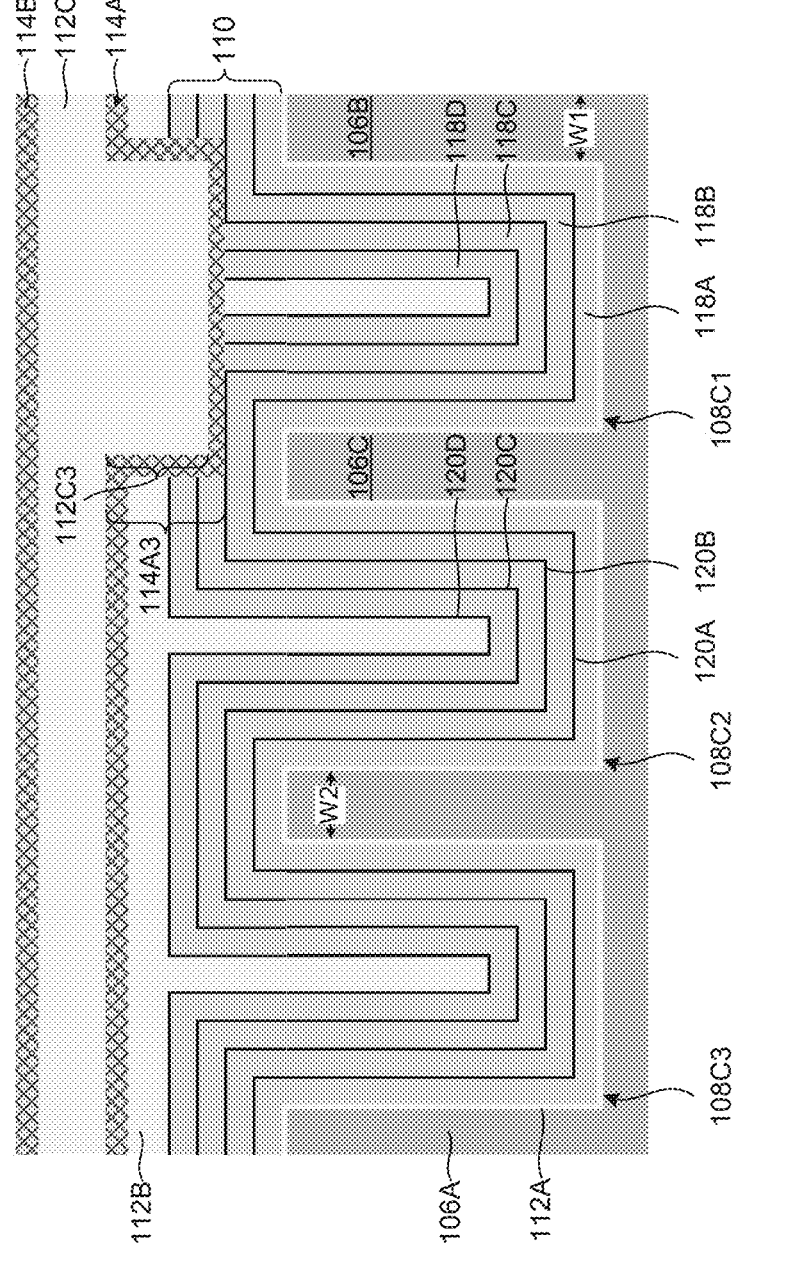
Fig. 12C
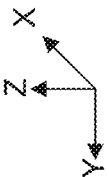

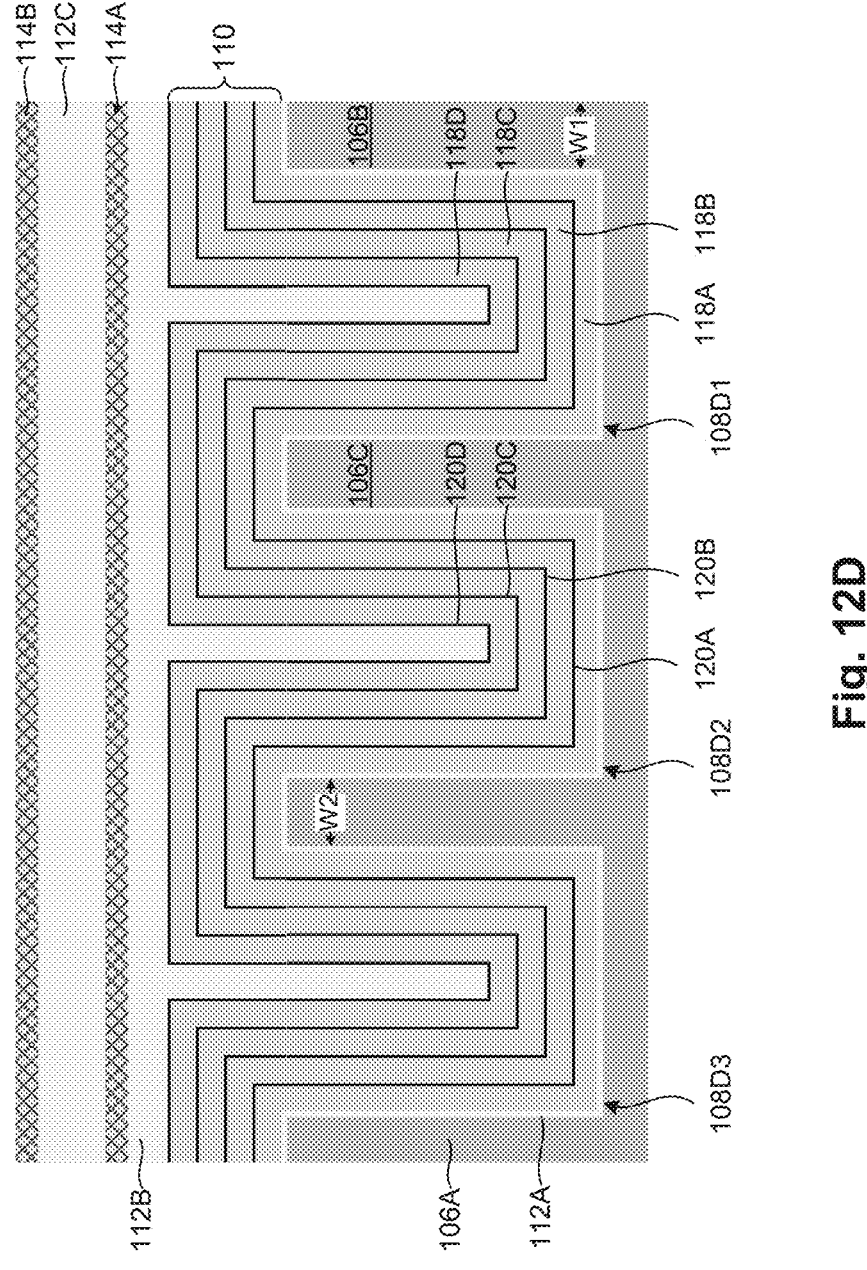
114B
112C
114A
110
106B
118D
118C
W1
118B
118A  118B
108D1
106C
120D
120C
120B
120A  120B
108D2
W2
112B
106A
112A
108D3
Fig. 12D

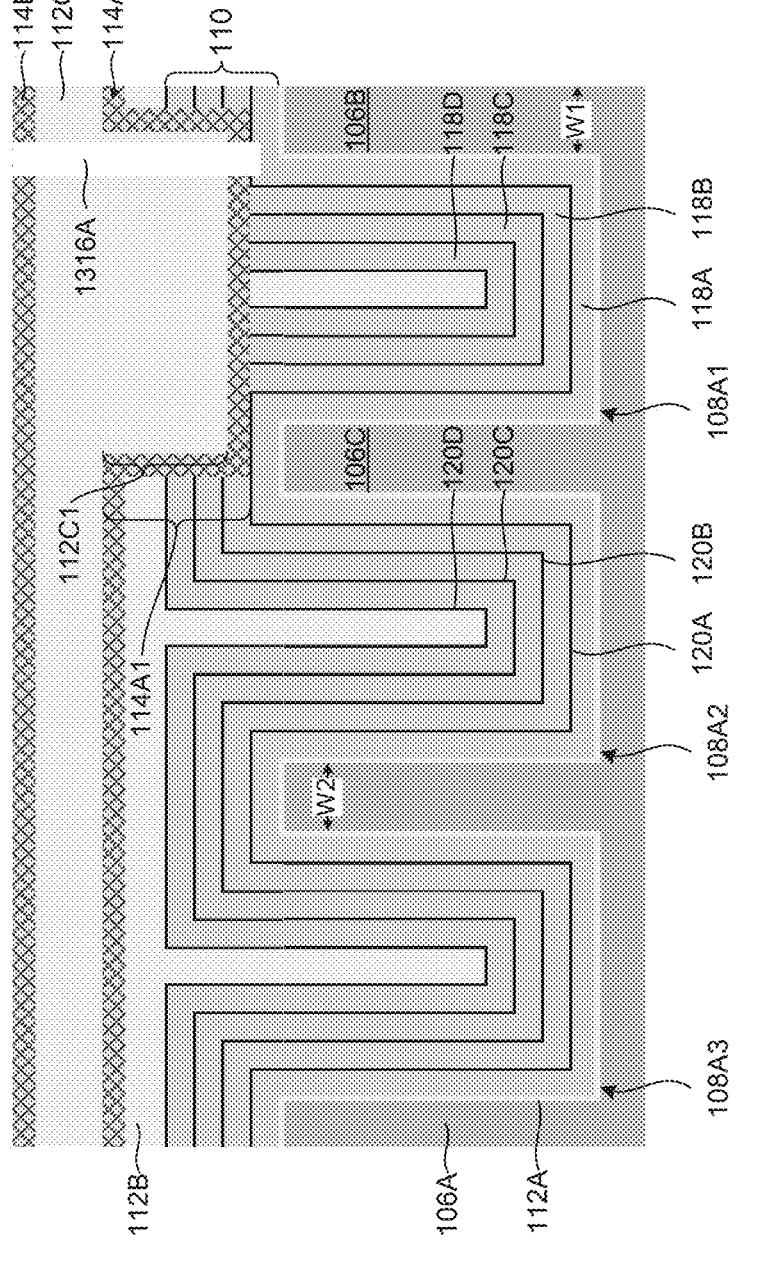
Fig. 13A
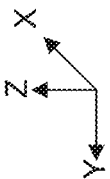

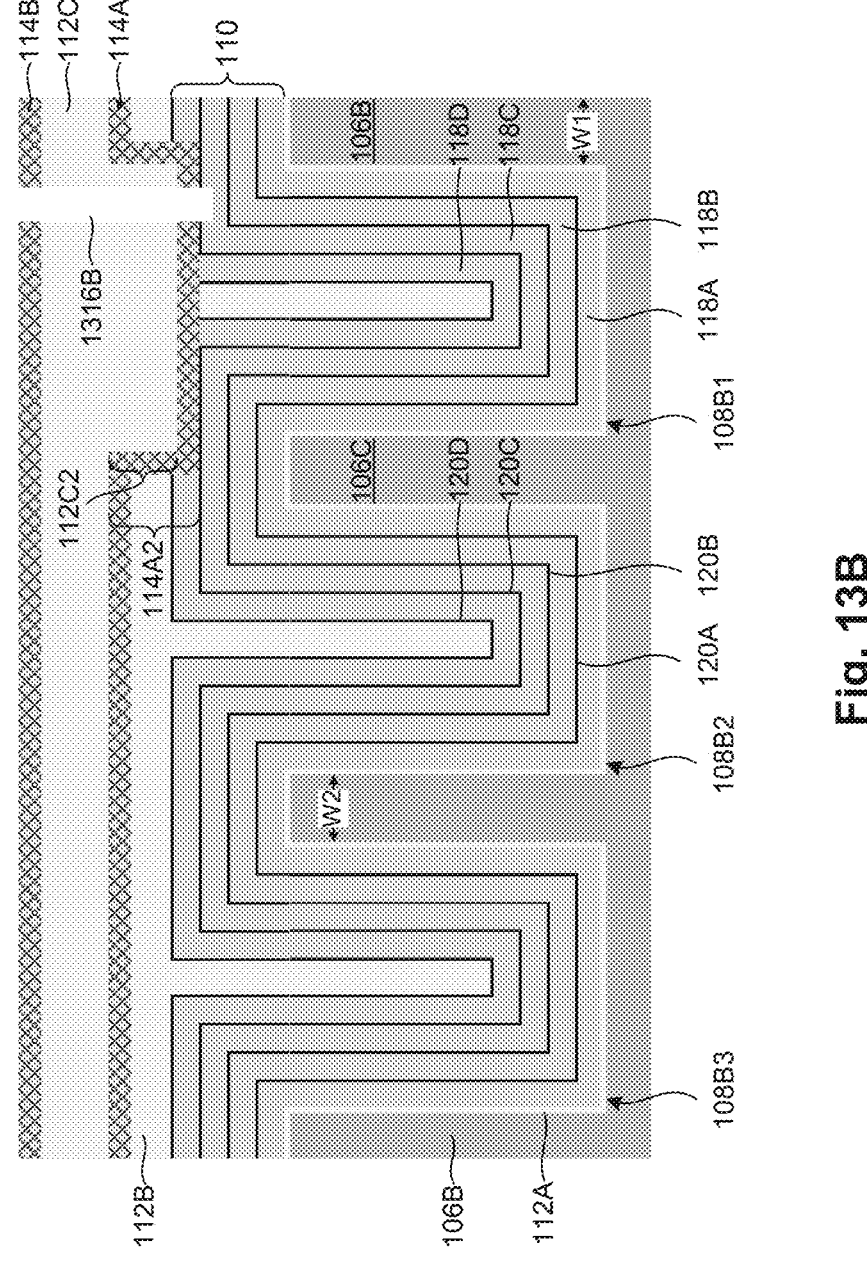
Fig. 13B
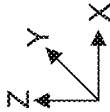

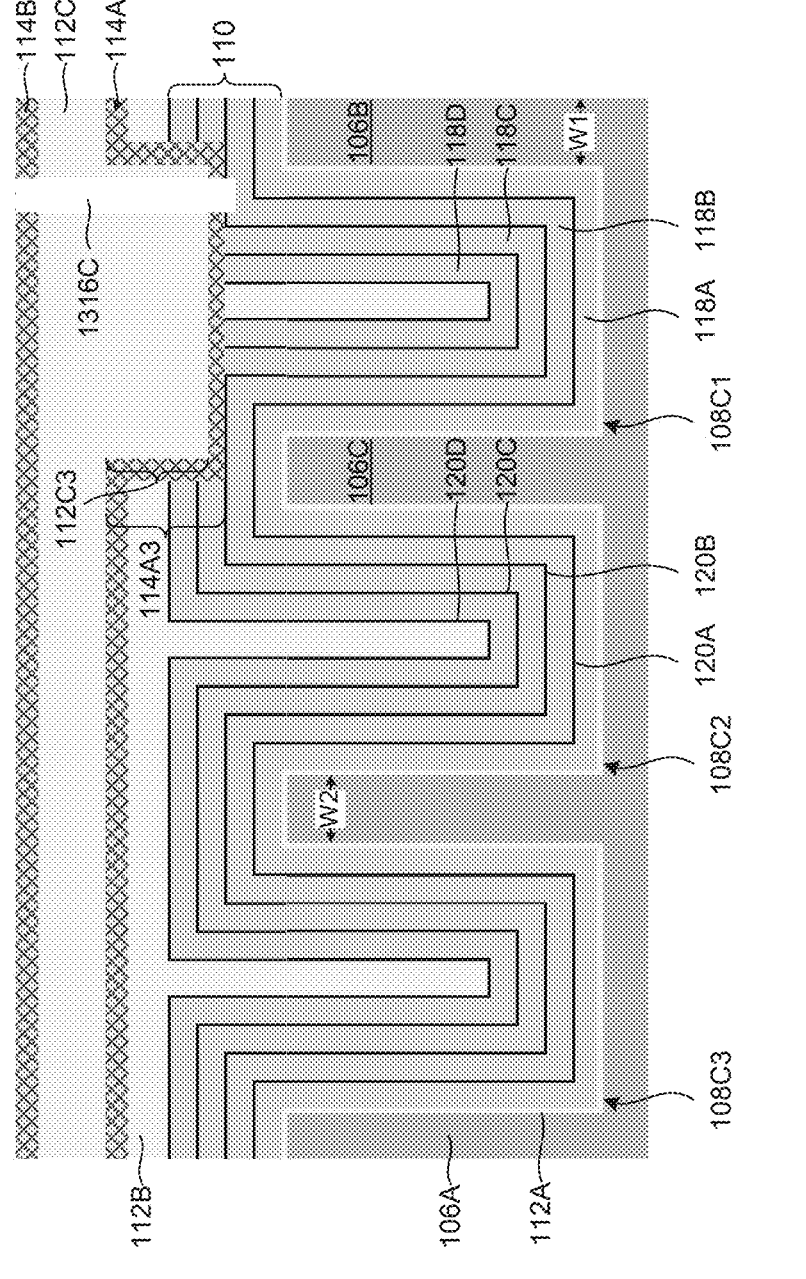
Fig. 13C
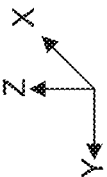

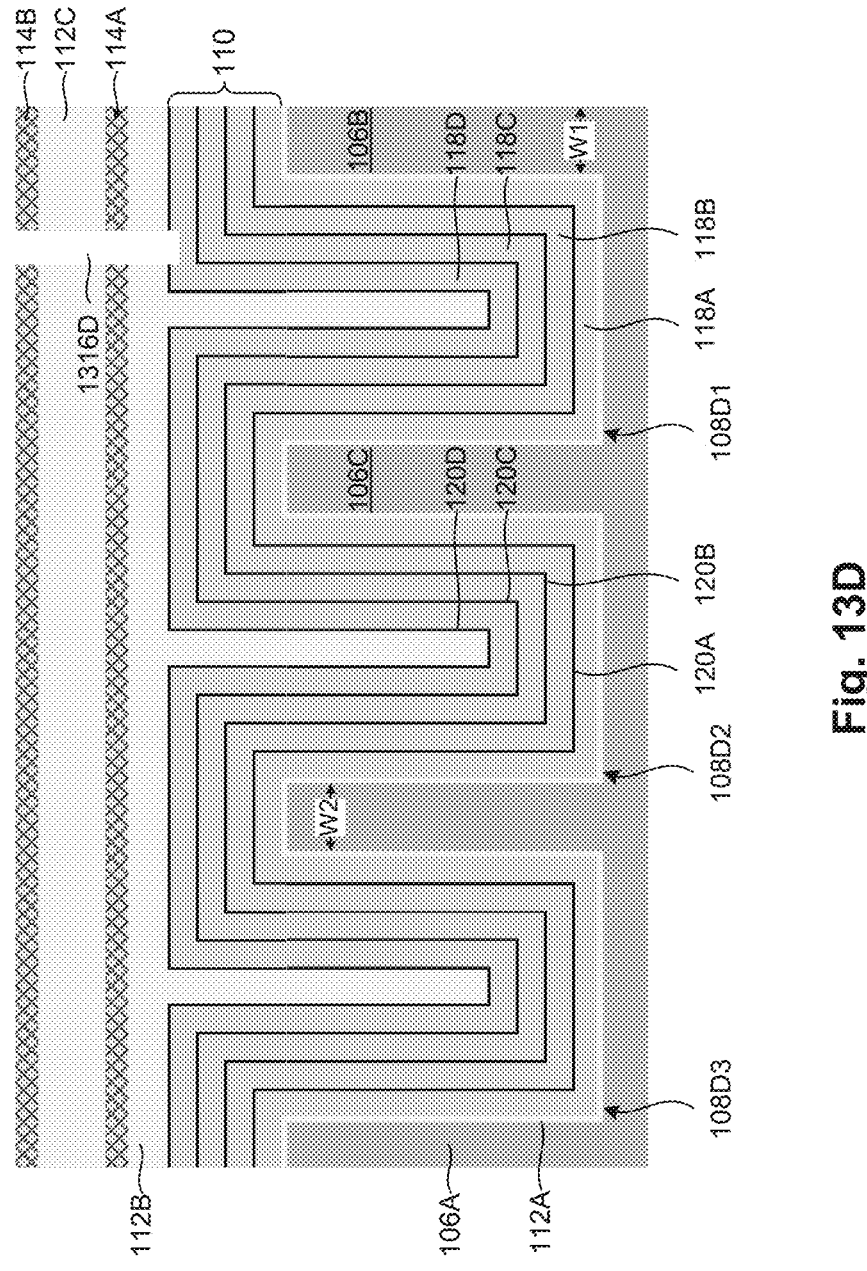
Fig. 13D

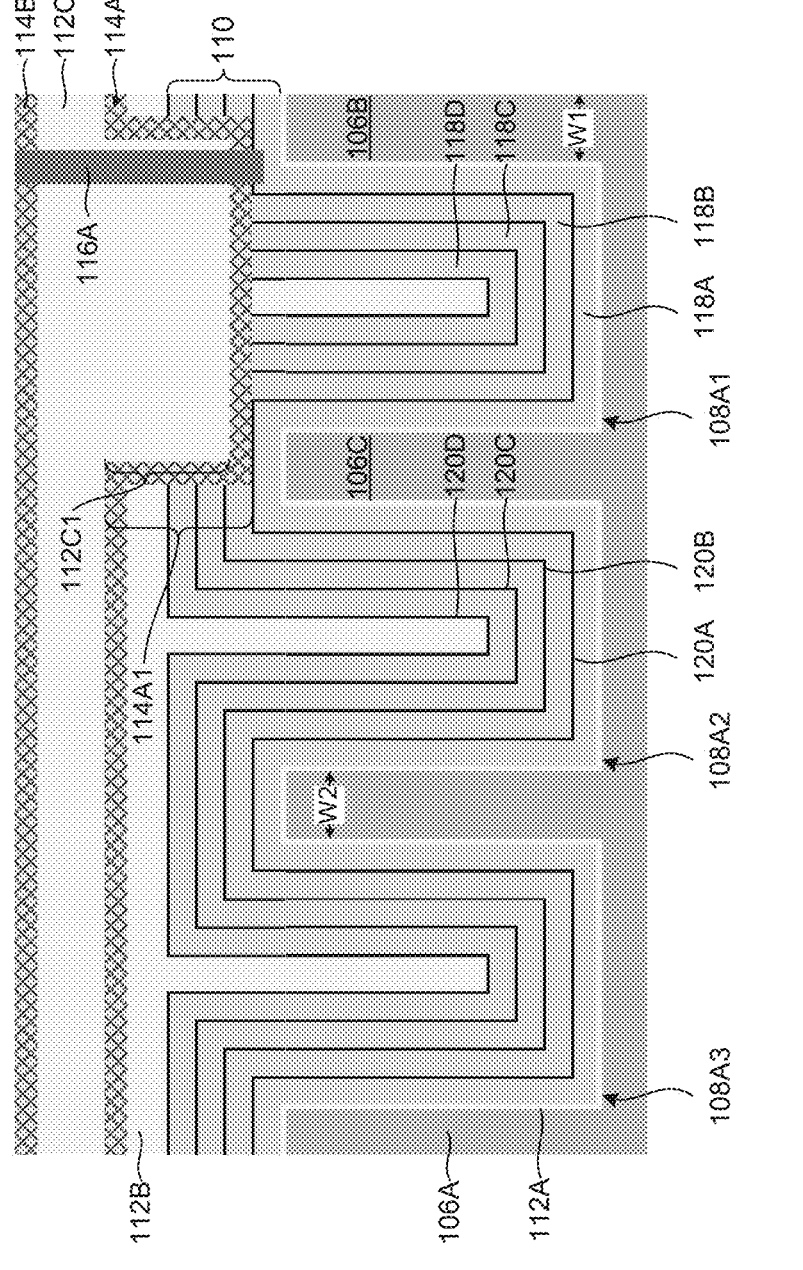
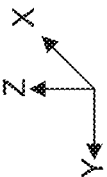
Fig. 14A

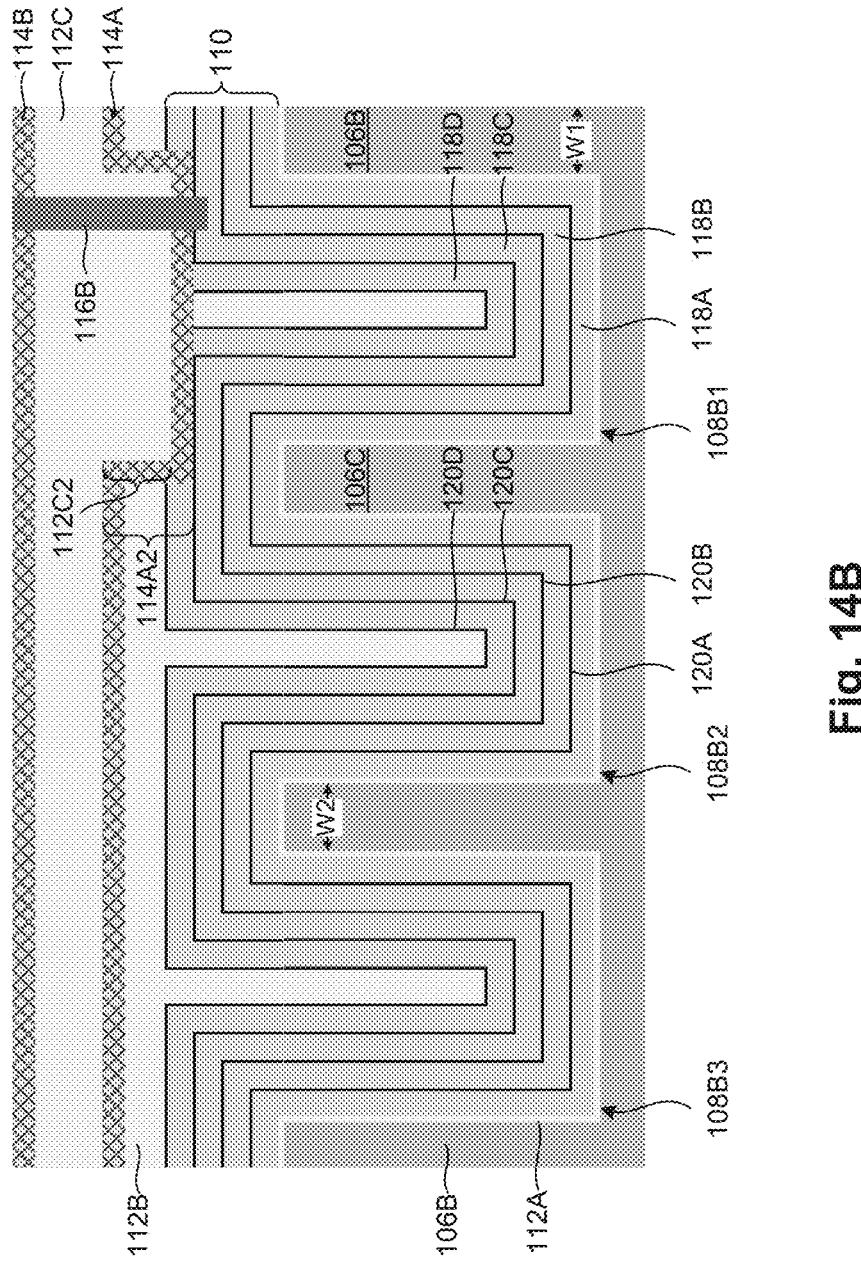
Fig. 14B
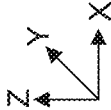

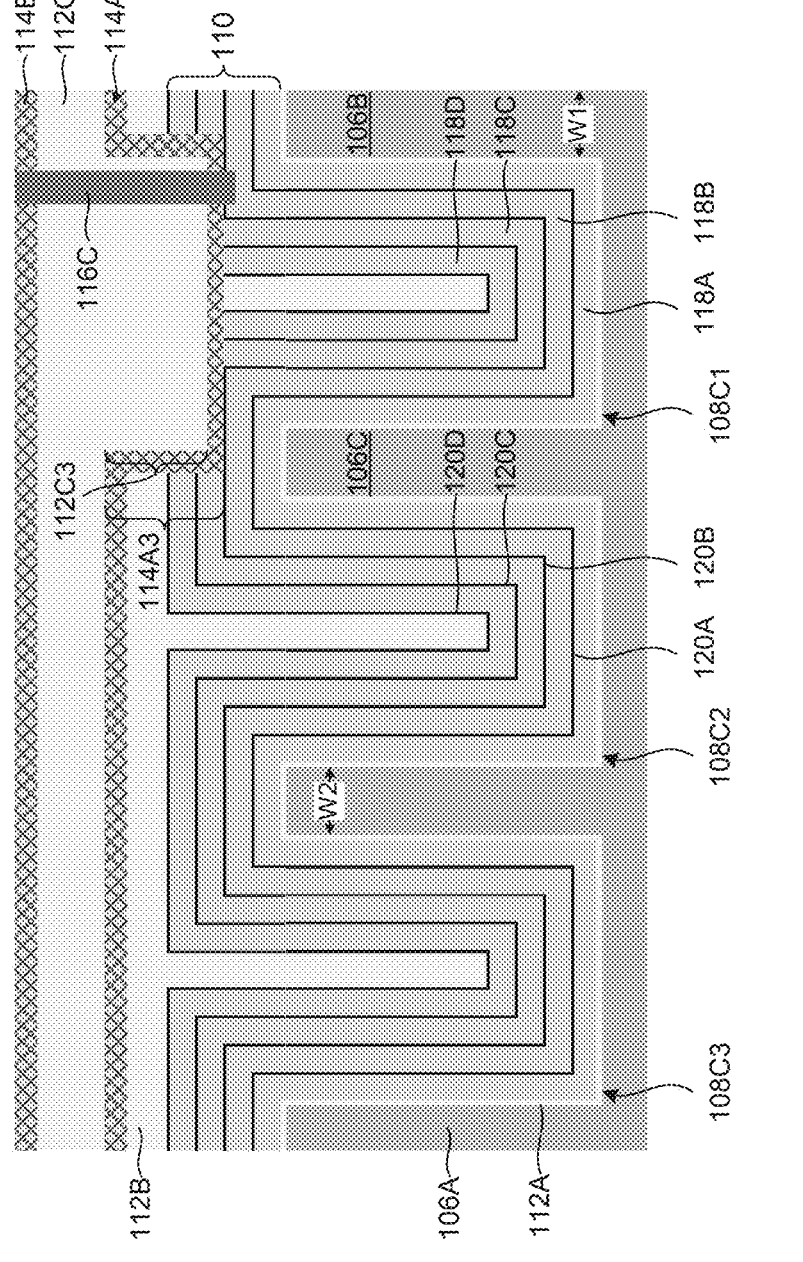
Fig. 14C
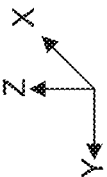

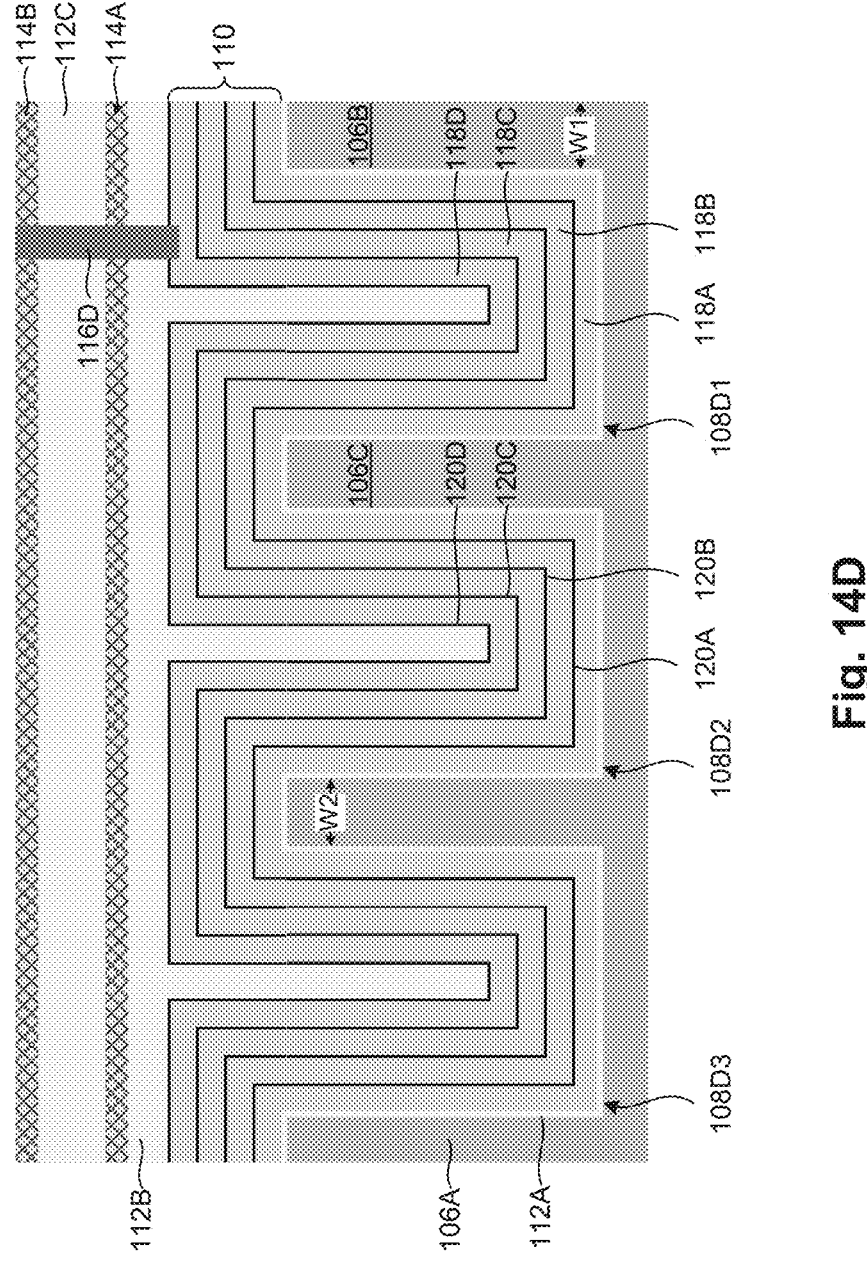
Fig. 14D

122
M2
122
V1
122
M1
114B
112C
114A
110
106B
118D
118C
118B
116A
126A
136A
128B
118A
124
124
124
108A1
106C
120D
120C
112C1
114A1
120B
120A
108A2
112B
106A
112A
108A3
104
W1
W2

122
M2
122
V1
122
M1
114B
112C
114A

110

104

136B
132B
126C
116C
124
124
124

112C3
114A3
112B 106B
118D
118C
106C
120D
120C
106A
112A
←W1→
←W2→

118A  118B
108C1
120A  120B
108C2
108C3

122
M2
122
V1
122
M1
114B
112C
114A
110

136B

126D

134A

116D 124
124
124

104

112B 106B
118D
118C
W1

118A  118B

108D1

106C
120D
120C 120A  120B

108D2

W2

106A

112A

108D3

PASSIVE SEMICONDUCTOR DEVICE

CROSS-REFERENCE TO RELATED APPLICATION

This application claims the benefit of U.S. Provisional Patent Application No. 63/374,432, titled "Passive Semiconductor Devices," filed Sep. 2, 2022, which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of passive and active semiconductor devices, such as capacitors, fin field effect transistors (finFETs), and gate-all-around FETs (GAA FETs). Such scaling down has increased the complexity of manufacturing the passive and active semiconductor devices.

BRIEF DESCRIPTION OF THE DRAWINGS

Aspects of this disclosure are best understood from the following detailed description when read with the accompanying figures.

FIG. 6 is a flow diagram of a method for fabricating a passive semiconductor device coupled to an interconnect structure, in accordance with some embodiments.

FIGS. 7, 8A-8D, 9A-9D, 10A-10D, 11A-11D, 12A-12D, 13A-13D, 14A-14D, and 15A-15D illustrate cross-sectional views of a passive semiconductor device coupled to an interconnect structure at various stages of its fabrication process, in accordance with some embodiments.

Figure 1A:
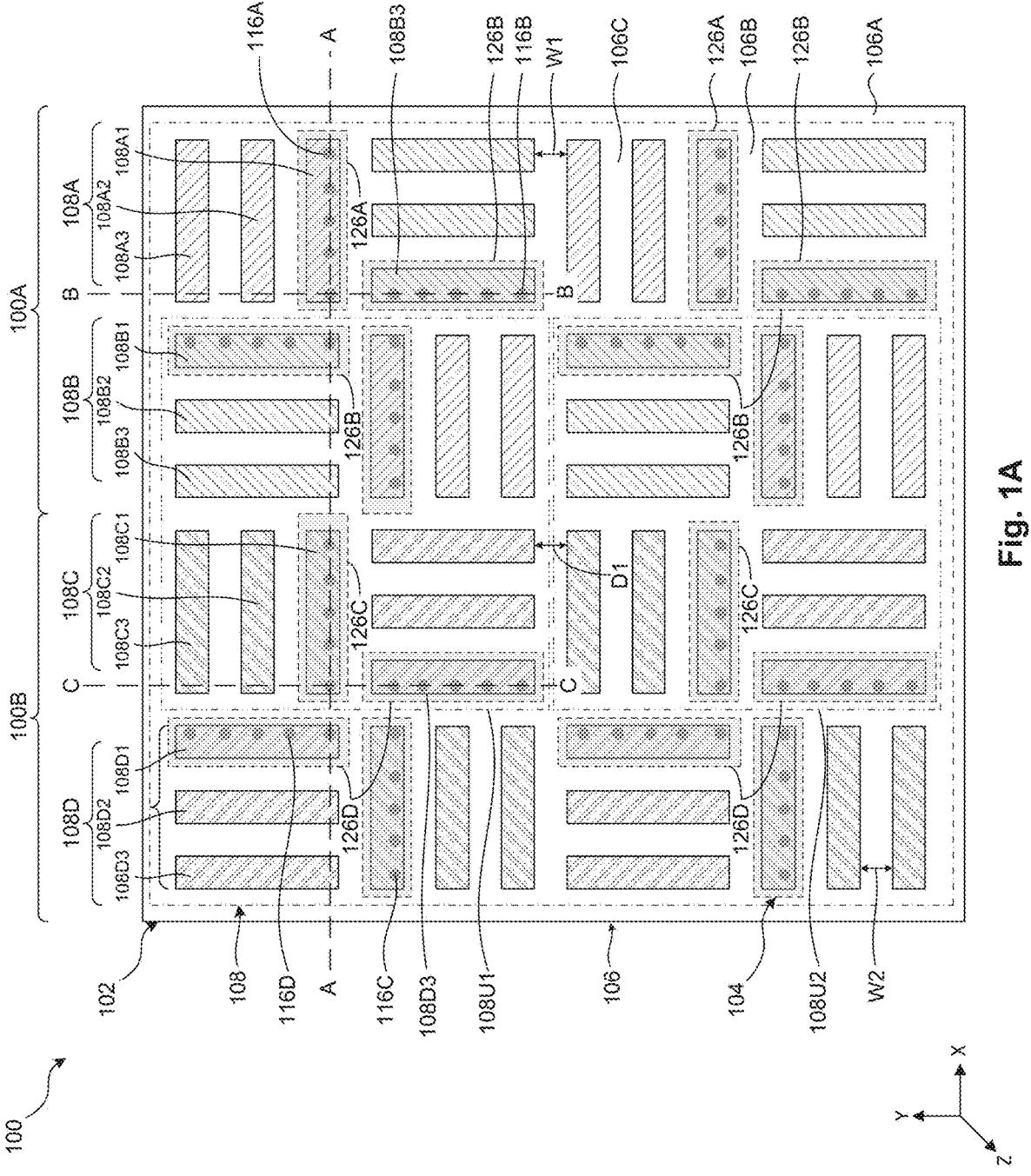
FIGS. 1A-1E illustrate top-down and cross-sectional views of a first configuration of a passive semiconductor device coupled to an interconnect structure, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The present disclosure provides example passive semiconductor devices (e.g., capacitors) coupled to an interconnect structure and example methods of fabricating the same. In some embodiments, the passive semiconductor device can include high density capacitors formed in a stacked configuration. In some embodiments, two or more capacitors are stacked over one another in a metal-insulator-metal (MIM) configuration and electrically connected in a parallel configuration. In some embodiments, portions of the capacitors are disposed in trenches in a substrate of the passive semiconductor device for which the capacitors can be referred to as "trench capacitors" or "deep trench capacitors (DTCs)."

In some embodiments, the passive semiconductor device can include a stack of first, second, third, and fourth conductive layers. The stack can further include a first high-k dielectric layer disposed between the first and second conductive layers, a second high-k dielectric layer disposed between the second and third conductive layers, a third high-k dielectric layer disposed between the third and fourth conductive layers, and a fourth high-k dielectric layer disposed on the fourth conductive layer. The stack is disposed in the trenches and on substrate regions between the trenches. First, second, third, and fourth stack portions can be disposed in first, second, third, and fourth trenches, respectively. Other stack portions are disposed on substrate regions between the trenches.

A first capacitor can be formed between the first and second conductive layers, a second capacitor can be formed between the second and third conductive layers, and a third capacitor can be formed between the third and fourth conductive layers. The first, second, and third capacitors can be electrically connected in parallel to each other. In some embodiments, the first and third conductive layers are electrically connected to a first voltage (e.g., a ground reference voltage, Vss) and the second and fourth conductive layers are electrically connected to a second voltage (e.g., a power supply voltage, Vdd) that is higher than the first voltage.

In some embodiments, the passive semiconductor device can further include first, second, third, and fourth contact structures (e.g., vias) disposed on the first, second, third, and fourth conductive layers in the first, second, third, and fourth trenches, respectively. To form the contact structures overlapping the trenches, each of the contact structures can be formed through the stack on the corresponding conductive layers while being electrically isolated from the other conductive layers. By forming the contact structures overlapping the trenches and not overlapping the substrate regions between the trenches, the distance between adjacent trenches can be reduced or minimized. As a result, the density of the trenches can be increased by about 2 times to about 3 times compared to that of trenches in other passive semiconductor devices formed with contact structures overlapping the substrate regions between the trenches. Increasing the density of the trenches can increase the surface area of the first, second, third, and fourth conductive layers, thus increasing the capacitance of the passive semiconductor device. In some embodiments, the capacitance can be increased by about 20% to about 80% compared to that of the other passive semiconductor devices.

Figure 1B:
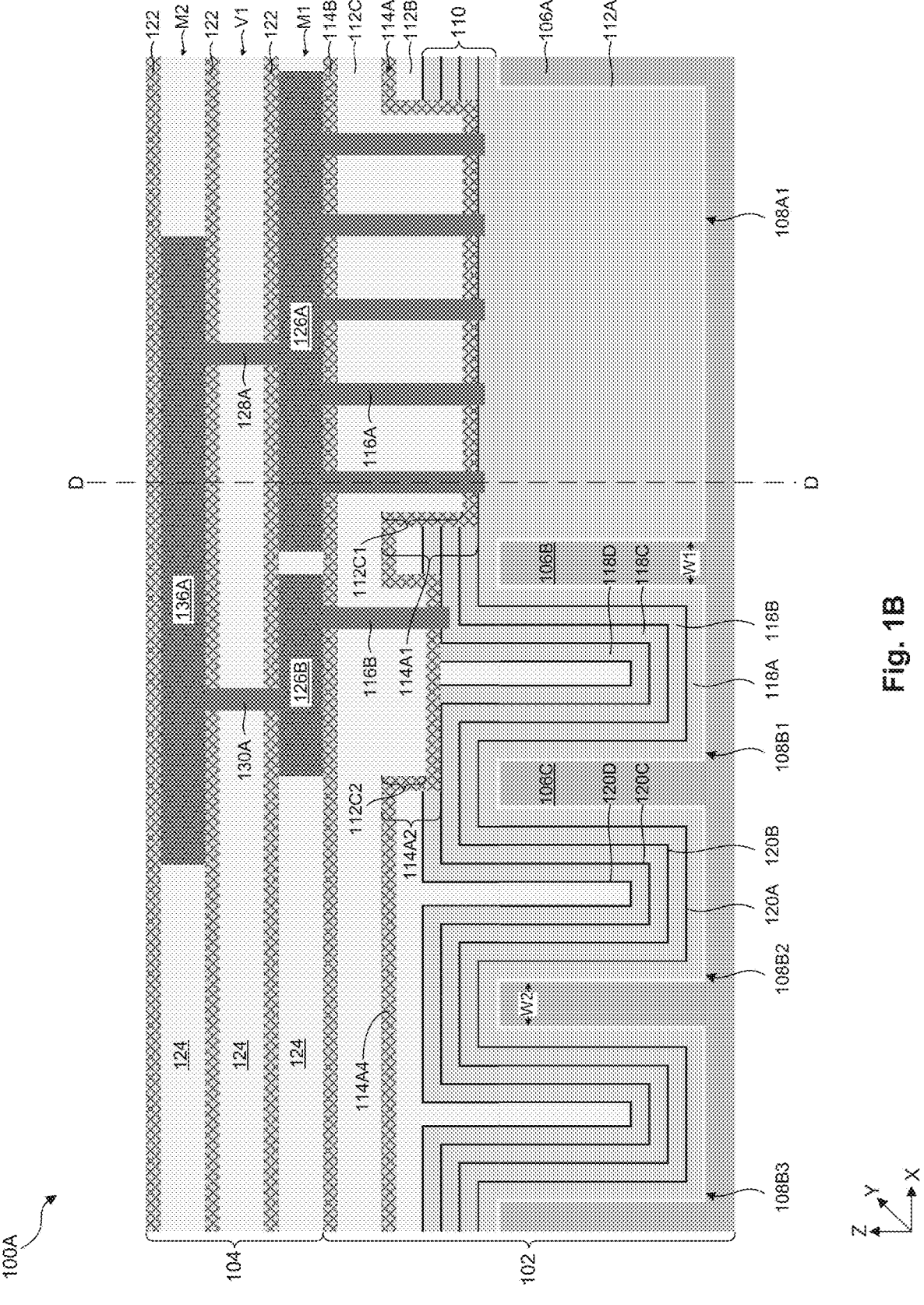
Figure 1C:
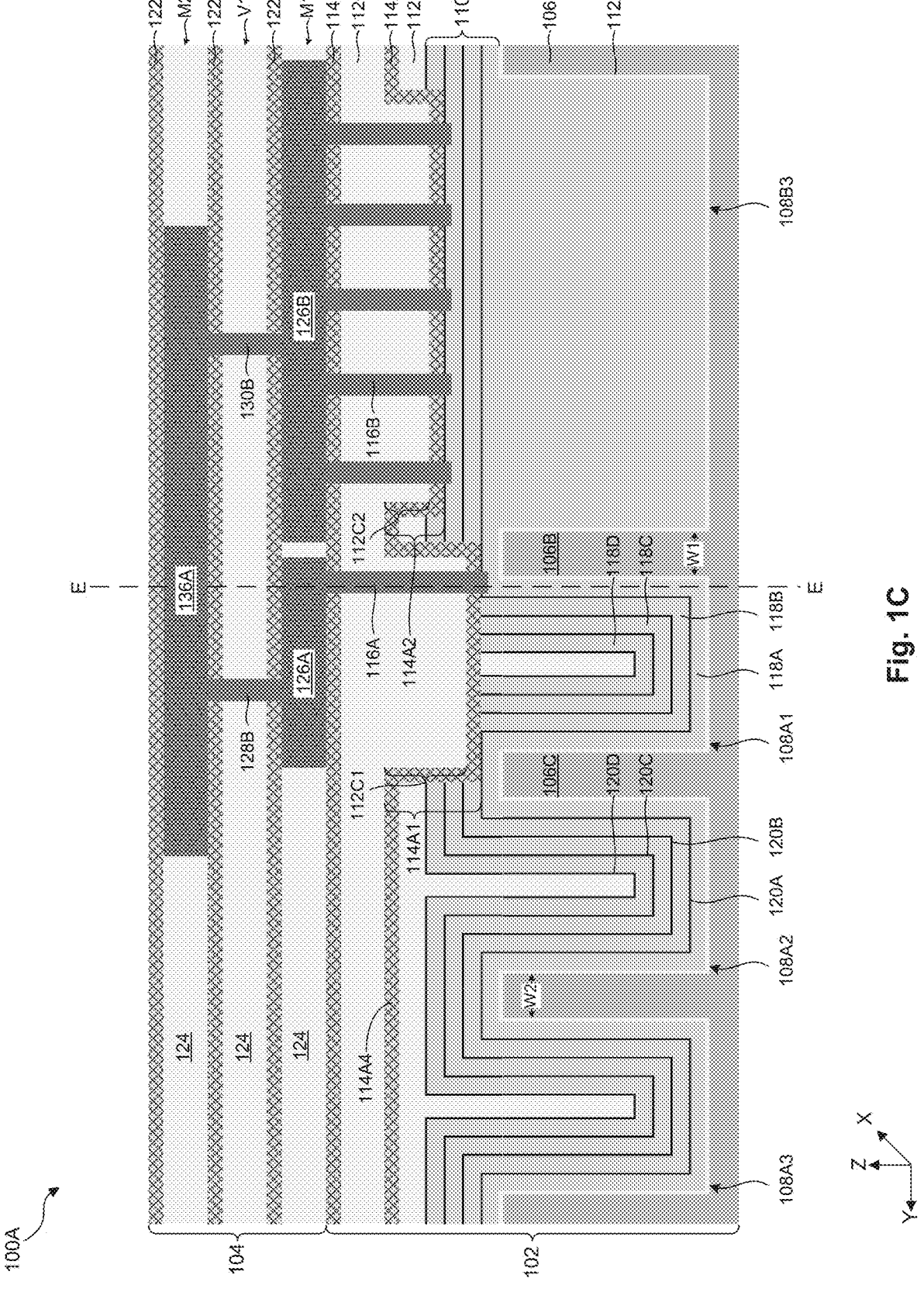
Figure 1D:
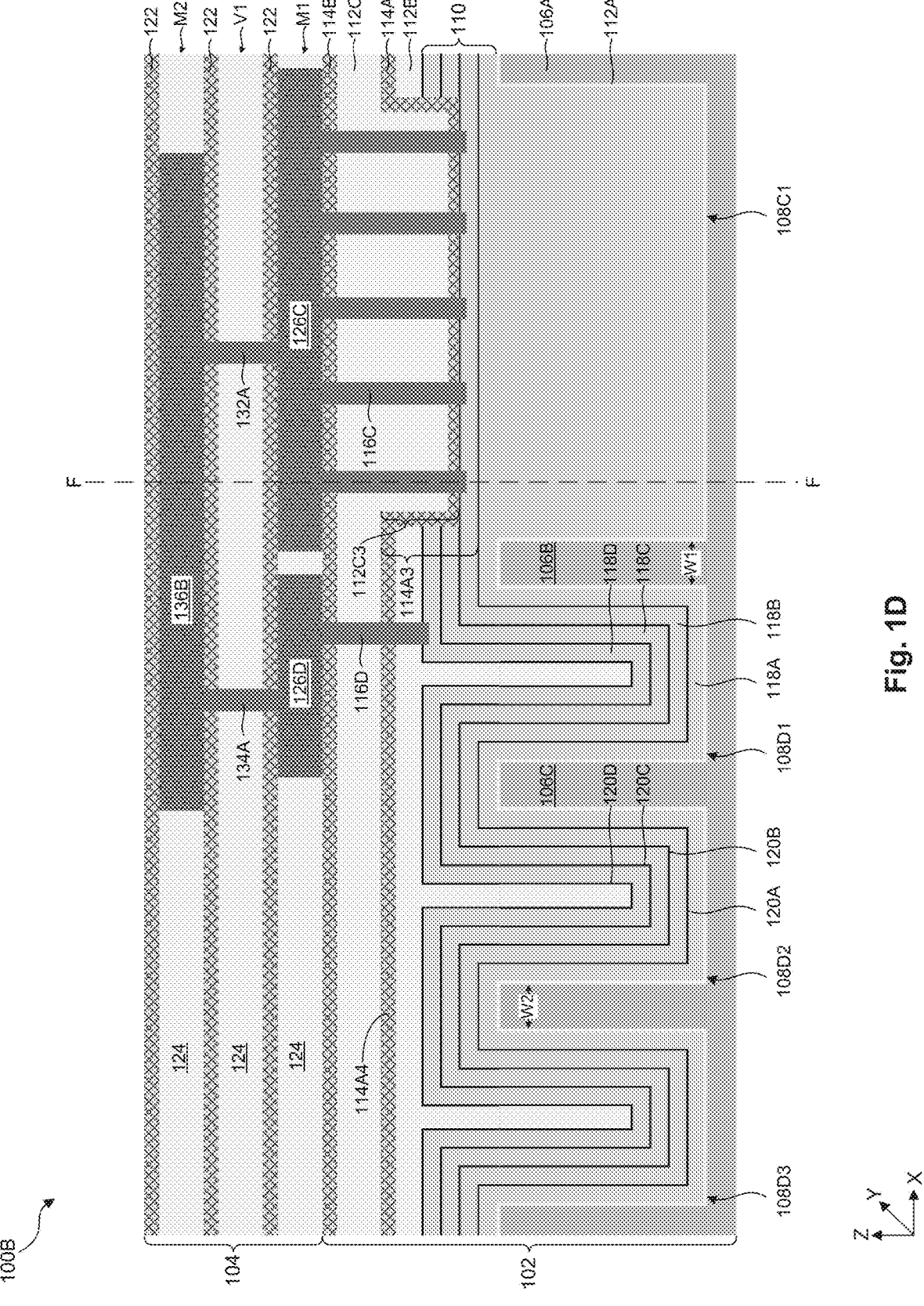
Figure 1E:
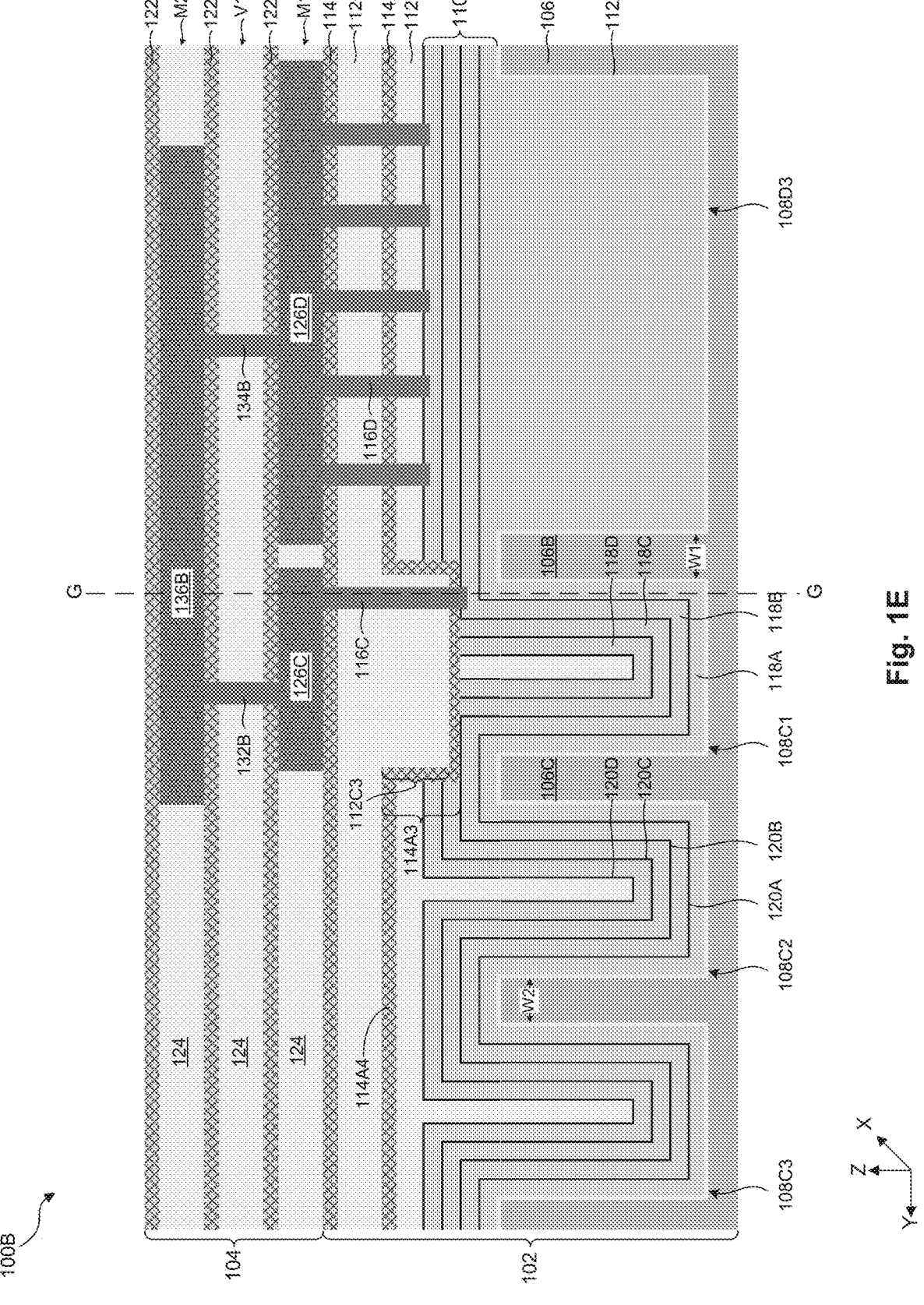

FIG. 1A illustrates a top-down view of a semiconductor structure 100 including a passive semiconductor device 102 and an interconnect structure 104, according to some embodiments. FIG. 1B illustrates a cross-sectional view of region 100A of semiconductor structure 100 along line A-A of FIG. 1A and along line E-E of FIG. 1C, according to some embodiments. FIG. 1C illustrates a cross-sectional view of region 100A of semiconductor structure 100 along line B-B of FIG. 1A and along line D-D of FIG. 1B, according to some embodiments. FIG. 1D illustrates a cross-sectional view of region 100B of semiconductor structure 100 along line A-A of FIG. 1A and along line G-G of FIG. 1E, according to some embodiments. FIG. 1E illustrates a cross-sectional view of region 100B of semiconductor structure 100 along line C-C of FIG. 1A and along line F-F of FIG. 1D, according to some embodiments. FIGS. 1B, 1C, 1D, and 1E illustrate cross-sectional views of passive semiconductor device 102 and interconnect structure 104 with additional structures that are not shown in FIG. 1A for simplicity. The discussion of elements in FIGS. 1A, 1B, 1C, 1D, and 1E with the same annotations applies to each other, unless mentioned otherwise.

Referring to FIGS. 1A, 1B, 1C, 1D, and 1E, interconnect structure 104 can be disposed on passive semiconductor device 102. In some embodiments, passive semiconductor device 102 can include a substrate 106. In some embodiments, substrate 106 can include a semiconductor material, such as silicon, germanium (Ge), silicon germanium (SiGe), a silicon-on-insulator (SOI) structure, and a combination thereof. In some embodiments, substrate 106 can be doped with p-type dopants (e.g., boron, indium, aluminum, or gallium) or n-type dopants (e.g., phosphorus or arsenic).

In some embodiments, passive semiconductor device 102 can further include a trench array 108 disposed in substrate 106 and surrounded by substrate region 106A. In some embodiments, trench array 108 can include first trench groups 108A, second trench groups 108B, third trench groups 108C, and fourth trench groups 108D. Adjacent trench groups can be separated from each other by substrate regions 106B. In some embodiments, each of first trench groups 108A can include trenches 108A1, 108A2, and 108A3. In some embodiments, each of second trench groups 108B can include trenches 108B1, 108B2, and 108B3. In some embodiments, each of third trench groups 108C can include trenches 108C1, 108C2, and 108C3. In some embodiments, each of fourth trench groups 108D can include trenches 108D1, 108D2, and 108D3. The trenches in each of the trench groups can be separated from each other by substrate regions 106C. Though each trench group is shown to have three trenches in FIG. 1A, each trench group can have any number of trenches. Though four trench groups are illustrated in FIG. 1A, trench array 108 can have any number of trench groups with the directional arrangement between trench groups as described below.

In some embodiments, trenches 108A1, 108A2, and 108A3 in first trench groups 108A and trenches 108C1, 108C2, and 108C3 in third trench groups 108C can have elongated sides extending along a first direction (e.g., along an X-axis). In some embodiments, trenches 108B1, 108B2, and 108B3 in second trench groups 108B and trenches 108D1, 108D2, and 108D3 in fourth trench groups 108D can have elongated sides extending along a second direction (e.g., along a Y-axis) that is substantially perpendicular to the first direction. In some embodiments, trench groups 108A, 108B, 108C, and 108D are arranged in trench array 108 such that adjacent trench groups have elongated trench sides in directions substantially perpendicular to each other. Such directional arrangement of trench groups 108A, 108B, 108C, and 108D can reduce stress on substrate regions 106B and 106C during the formation of the trenches to protect the structural integrity of substrate regions 106B and 106C.

In some embodiments, to increase or maximize the density of trenches in passive semiconductor device 102 without compromising the structural integrity of substrate regions 106B and 106C, width W1 of substrate regions 106B and width W2 of substrate regions 106C can be substantially equal to each other and can be less than about 200 nm (e.g., about 20 nm to about 190 nm). Width W1 is also the distance between adjacent trench groups and width W2 is the distance between adjacent trenches in a trench group. In some embodiments, one of each trench groups 108A, 108B, 108C, and 108D adjacent to each other can form a unit, such as units 108U1 and 108U2 shown in FIG. 1A. In some embodiments, a ratio (W1:D1) between width W1 and a distance D1 between adjacent units 108U1 and 108U2 can be about 1:1 to about 1:2 to protect the structural integrity of substrate regions 106B and 106C. The density of trenches in passive semiconductor device 102 can be increased or maximized to increase or maximize the surface area of conductive layers disposed in the trenches, thus increasing the capacitance of passive semiconductor device 102, as described below.

Referring to FIGS. 1B-1E, in some embodiments, passive semiconductor device 102 can further include (i) a capacitive structure 110, (ii) dielectric oxide layers 112A, 112B, and 112C, and (iii) dielectric nitride layers 114A and 114B. These elements of passive semiconductor device 102 are not shown in FIG. 1A for simplicity. Referring to FIGS. 1A-1E, in some embodiments, passive semiconductor device 102 can further include contact structures 116A, 116C, 116B, and 116D (also referred to as "vias 116A, 116C, 116B, and 116D") electrically connected to capacitive structure 110. The discussion of trenches 108A1-108A3, 108B1-108B3, 108C1-108C3, and 108D1-108D3 shown in FIGS. 1B-1E applies to the other trenches 108A1-108A3, 108B1-108B3, 108C1-108C3, and 108D1-108D3 in trench array 108 shown in FIG. 1A but not visible in FIGS. 1B-1E, unless mentioned otherwise.

Capacitive structure 110 can be disposed in or above trenches 108A1-108D3 and on substrate regions 106A-106C. In some embodiments, capacitive structure 110 can include (i) a conductive layer 118A disposed directly on dielectric oxide layer 112A, (ii) a high-k dielectric layer 120A disposed directly on conductive layer 118A, (iii) a conductive layer 118B disposed directly on high-k dielectric layer 120A, (iv) a high-k dielectric layer 120B disposed directly on conductive layer 118B, (v) a conductive layer 118C disposed directly on high-k dielectric layer 120B, (vi) a high-k dielectric layer 120C disposed directly on conductive layer 118C, (vii) a conductive layer 118D disposed directly on high-k dielectric layer 120C, and (viii) a high-k dielectric layer 120D disposed directly on conductive layer 118D. In some embodiments, high-k dielectric layer 120D may be absent. In some embodiments, conductive layers 118A, 118B, 118C, and 118D can include a conductive material, such as titanium nitride (TiN), aluminum, copper, and other suitable conductive materials. In some embodiments, high-k dielectric layer 120A, 120B, 120C, and 120D can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), aluminum oxide ($Al_2O_3$), and other suitable high-k dielectric materials. Conductive layers 118A, 118B, 118C, and 118D are electrically coupled to power sources through contact structures 116A, 116C, 116B, and 116D, respectively, as described below.

Dielectric oxide layer 112A can be disposed in trenches 108A1-108D3 and directly on substrate regions 106A-106C. Dielectric oxide layer 112B can be disposed directly on capacitive structure 110 and in trenches 108A1-108D3. Dielectric oxide layer 112C can be disposed directly on dielectric nitride layer 114A. In some embodiments, dielectric oxide layer 112C have extended dielectric oxide portions 112C1, 112C2, and 112C3. Dielectric oxide portions 112C1 extend into portions of capacitive structure 110 (shown in FIGS. 1B and 1C) disposed in or above trenches 108A1 and into portions of capacitive structure 110 (not shown) disposed in or above trenches 108A3. Dielectric oxide portions 112C2 extend into portions of capacitive structure (shown in FIGS. 1B and 1C) disposed in or above trenches 108B1 and 108B3. Dielectric oxide portions 112C3 extend into portions of capacitive structure 110 (shown in FIGS. 1D and 1E) disposed in or above trenches 108C1 and into portions of capacitive structure 110 (not shown) disposed in or above trenches 108C3. These dielectric oxide portions 112C1, 112C2, and 112C3 can facilitate the selective formation of contact structures 116A, 116B, and 116C on conductive layers 118A, 118C, and 118B, respectively, as described in detail below. In some embodiments, dielectric oxide layers 112A, 112B, and 112C can include silicon oxide ($SiO_2$), undoped silicate glass, or other suitable dielectric oxide materials.

In some embodiments, dielectric nitride layer 114A can have dielectric nitride portions 114A1, 114A2, 114A3, and 114A4. Dielectric nitride portions 114A1 can be disposed in portions of capacitive structure 110 (shown in FIGS. 1B and 1C) disposed in or above trenches 108A1 and into portions of capacitive structure 110 (not shown) disposed in or above trenches 108A3. Dielectric nitride portions 114A2 can be disposed in portions of capacitive structure (shown in FIGS. 1B and 1C) disposed in or above trenches 108B1 and 108B3. Dielectric nitride portions 114A3 can be disposed in portions of capacitive structure 110 (shown in FIGS. 1D and 1E) disposed in or above trenches 108C1 and into portions of capacitive structure 110 (not shown) disposed in or above trenches 108C3. Dielectric nitride portions 114A4 can be disposed directly on dielectric oxide layer 112B.

In some embodiments, bottom surfaces of dielectric nitride portions 114A1 can be disposed directly on portions of high-k dielectric layer 120A (shown in FIGS. 1B and 1C) disposed in or above trenches 108A1 and directly on portions of high-k dielectric layer 120A (not shown) disposed in or above trenches 108A3. In some embodiments, bottom surfaces of dielectric nitride portions 114A2 can be disposed directly on portions of high-k dielectric layer 120C (shown in FIGS. 1B and 1C) disposed in or above trenches 108B1 and 108B3. In some embodiments, bottom surfaces of dielectric nitride portions 114A3 can be disposed directly on portions of high-k dielectric layer 120B (shown in FIGS. 1D and 1E) disposed in or above trenches 108C1 and directly on portions of high-k dielectric layer 120B (not shown) disposed in or above trenches 108C3.

In some embodiments, instead of high-k dielectric layer 120A, bottom surfaces of dielectric nitride portions 114A1 can be disposed directly on portions of conductive layer 118A (not shown) disposed in or above trenches 108A1 and 108A3. In some embodiments, instead of high-k dielectric layer 120C, bottom surfaces of dielectric nitride portions 114A2 can be disposed directly on portions of conductive layer 118C (not shown) disposed in or above trenches 108B1 and 108B3. In some embodiments, instead of high-k dielectric layer 120B, bottom surfaces of dielectric nitride portions 114A3 can be disposed directly on portions of conductive layer 118B (shown in FIGS. 1D and 1E) disposed in or above trenches 108C1 and 108C3.

Dielectric nitride portions 114A1, 114A2, and 114A3 can be disposed directly on sidewalls and bottom surfaces of dielectric oxide portions 112C1, 112C2, and 112C3, respectively. These dielectric nitride portions 114A1, 114A2, and 114A3 can facilitate the selective formation of contact structures 116A, 116B, and 116C on conductive layers 118A, 118C, and 118B, respectively, as described in detail below. In some embodiments, dielectric nitride layer 114B can be disposed directly on dielectric oxide layer 112C. In some embodiments, dielectric nitride layers 114A and 114B can include silicon nitride (SiN), silicon oxynitride (SiON), or other suitable dielectric nitride materials.

Referring to FIGS. 1A-1E, in some embodiments, contact structures 116A, 116C, 116B, and 116D can include a conductive material, such as aluminum, copper, tungsten, and other suitable conductive materials. In some embodiments, contact structures 116A can be disposed directly on portions of conductive layer 118A (shown in FIGS. 1B and 1C) disposed in or above trenches 108A1 and directly on portions of conductive layer 118A (not shown) disposed in or above trenches 108A3. In some embodiments, contact structures 116B can be disposed directly on portions of conductive layer 118C (shown in FIGS. 1B and 1C) disposed in or above trenches 108B1 and 108B3. In some embodiments, contact structures 116C can be disposed directly on portions of conductive layer 118B (shown in FIGS. 1D and 1E) disposed in or above trenches 108C1 and directly on portions of conductive layer 118C (not shown) disposed in or above trenches 108C3. In some embodiments, contact structures 116D can be disposed directly on portions of conductive layer 118D (shown in FIGS. 1D and 1E) disposed in or above trenches 108D1 and 108D3.

Thus, contact structures 116A are formed overlapping trenches 108A1 and 108A3, contact structures 116B are formed overlapping trenches 108B1 and 108B3, contact structures 116C are formed overlapping trenches 108C1 and 108C3, and contact structures 116D are formed overlapping trenches 108D1 and 108D3. With contact structures 116A, 116C, 116B, and 116D formed above trenches 108A1-108D1 and 108A3-108D3, and not above substrate regions 106A, 106B, and/or 106C, trenches 108A1-108D3 can be formed closer to each other than trenches in other passive semiconductor devices with contact structures formed above substrate regions 106A, 106B, and/or 106C. As a result, the density of trenches 108A1-108D3 in trench array 108 can be about 2 times to about 3 times greater than that of trenches in the other passive semiconductor devices. Increasing the density of trenches in trench array 108 increases the surface area of conductive layers 118A, 118B, 118C, and 118D, thus increasing the capacitance of passive semiconductor device 102.

The sidewalls of contact structures 116A extending over conductive layer 118A can be surrounded by and in direct contact with dielectric oxide portions 112C1 and dielectric nitride portions 114A1 (shown in FIGS. 1B and 1C) to electrically isolate contact structures 116A from conductive layers 118B, 118C, and 118D. The sidewalls of contact structures 116B extending over conductive layer 118C can be surrounded by and in direct contact with dielectric oxide portions 112C2 and dielectric nitride portions 114A2 (shown in FIGS. 1B and 1C) to electrically isolate contact structures 116B from conductive layer 118D. The sidewalls of contact structures 116C extending over conductive layer 118B can be surrounded by and in direct contact with dielectric oxide portions 112C3 and dielectric nitride portions 114A3 (shown in FIGS. 1D and 1E) to electrically isolate contact structures 116C from conductive layers 118C and 118D.

In some embodiments, more than one of each contact structures 116A, 116C, 116B, and 116D can be disposed on conductive layers 118A, 118B, 118C, and 118D, respectively. Increasing the number of contact structures 116A, 116C, 116B, and 116D can increase the contact area between contact structures 116A, 116C, 116B, and 116D and conductive layers 118A, 118B, 118C, and 118D, thus improving the electrical connection between capacitive structure 110 and interconnect structure 104. Contact structures 116A and 116B can be electrically connected to a first power source (e.g., a FET or a power supply; not shown) through interconnect structure 104 to provide a first voltage $V_1$ to conductive layers 118A and 118C. On the other hand, contact structures 116C and 116D can be electrically connected to a second power source (not shown) through interconnect structure 104 to provide a second voltage V2 to conductive layers 118B and 118D that is higher or lower than first voltage $V_1$. Thus, the odd-numbered conductive layers, such as conductive layers 118A and 118C of capacitive structure 110 can be electrically connected to the same voltage level (e.g., first voltage $V_1$) and the even-numbered conductive layers, such as conductive layers 118B and 118D of capacitive structure 110 can be electrically connected to the same voltage level (e.g., second voltage V2). And, the odd-numbered conductive layers and the even-numbered conductive layers can be electrically connected to different voltage levels.

Figure 1F:
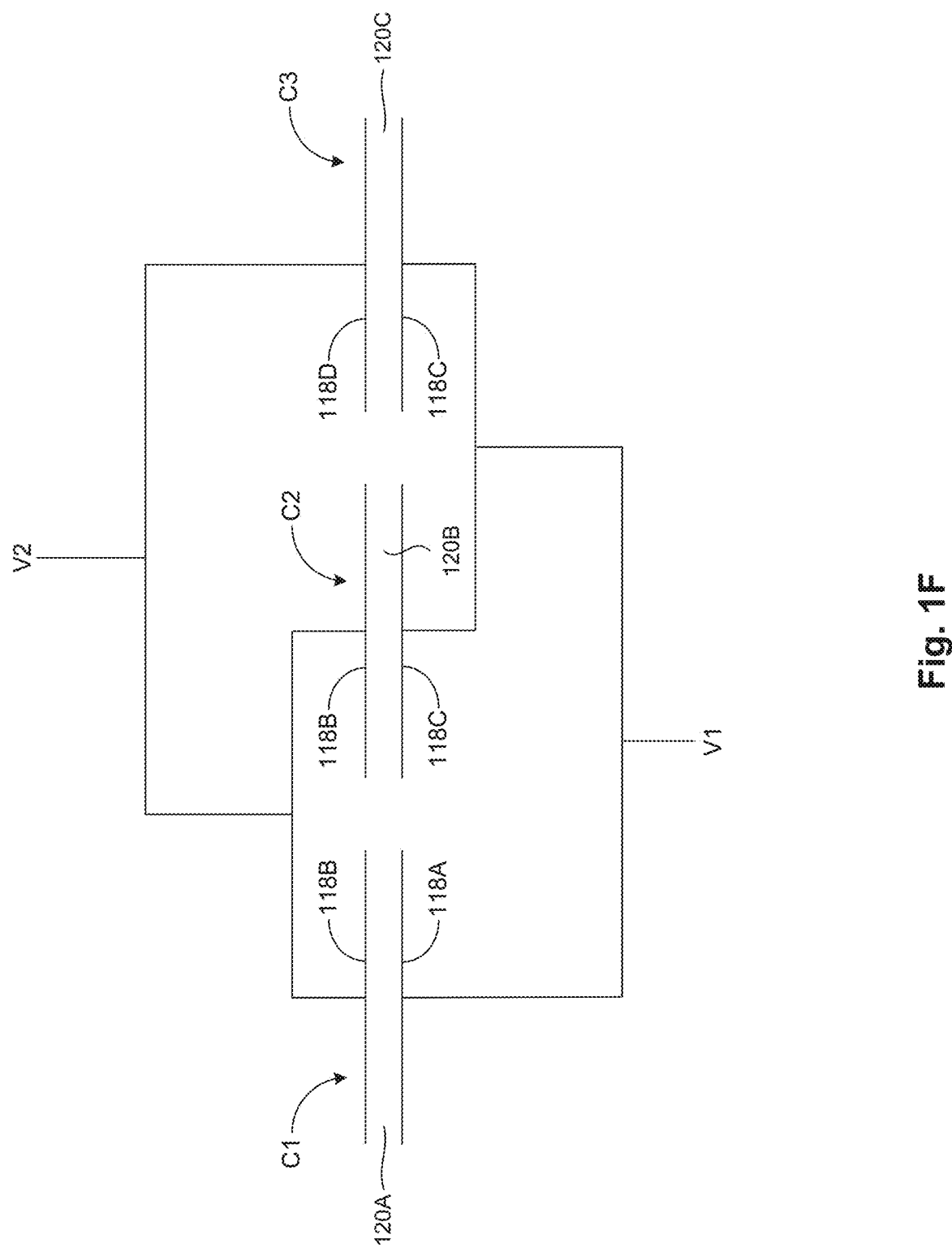
FIG. 1F illustrates an equivalent circuit of a passive semiconductor device coupled to an interconnect structure, in accordance with some embodiments.

In some embodiments, such electrical configuration between conductive layers 118A, 118B, 118C, and 118D can form capacitors C1, C2, and C3 (also referred to as "trench capacitors C1, C2, and C3") connected in parallel, as illustrated with an equivalent circuit of capacitive structure 110 in FIG. 1F. The resistive components of the equivalent circuit are not shown for simplicity. As shown in FIG. 1F, conductive layers 118A and 118B can form the parallel plates of capacitor C1, which are separated by high-k dielectric layer 120A. Conductive layers 118B and 118C can form the parallel plates of capacitor C2, which are separated by high-k dielectric layer 120B. Conductive layers 118C and 118D can form the parallel plates of capacitor C3, which are separated by high-k dielectric layer 120C. Capacitor C1 and capacitor C2 share conductive layer 118B as a common plate and capacitor C2 and capacitor C3 share conductive layer 118C as a common plate. Thus, passive semiconductor device 102 can have capacitors C1, C2, and C3 disposed in a stacked configuration in trenches 108A1-108D3 and connected in parallel to each other. Though passive semiconductor device 102 is shown to have three capacitors C1, C2, and C3, passive semiconductor device 102 can have any number of capacitors formed in trenches 108A1-108D3 in a stacked configuration and connected in parallel to each other.

Referring to FIGS. 1A-1E, in some embodiments, interconnect structure 104 can include metal line layers M1 and M2 and a via layer V1 providing electrical connection between metal line layers M1 and M2. Metal line layer M2 and via layer V1 are not shown in FIG. 1A for simplicity. Though two metal line layers M1 and M2 and one via layer V1 are discussed, interconnect structure 104 can have any number of metal line layers and via layers. In some embodiments, interconnect structure 104 can further include etch stop layers (ESLs) 122 and ILD layers 124. In some embodiments, ESLs 122 can include a dielectric material, such as aluminum oxide ($Al_xO_y$), nitrogen doped silicon carbide (SiCN), and oxygen doped silicon carbide (SiCO) with a dielectric constant ranging from about 4 to about 10. In some embodiments, ILD layers 124 can include a low-k (LK) or extra low-k (ELK) dielectric material with a dielectric constant lower than that of silicon oxide (e.g., dielectric constant between about 2 and about 3.7). In some embodiments, the LK or ELK dielectric material can include silicon oxycarbide (SiOC), nitrogen doped silicon carbide (SiCN), silicon oxycarbon nitride (SiCON), or oxygen doped silicon carbide.

In some embodiments, metal line layer M1 can include metal lines 126A, 126B, 126C, and 126D electrically connected to contact structures 116A,116B, 116C, and 116D, respectively. Metal lines 126A and 126C can have elongated sides extending along a first direction (e.g., along an X-axis) and metal lines 126B and 126D can have elongated sides extending along a second direction (e.g., along a Y-axis) that is substantially perpendicular to the first direction. Thus, the directional arrangement of metal lines 126A, 126B, 126C, and 126D can be similar to the directional arrangement of trenches in trench groups 108A, 108B, 108C, and 108D, respectively, as shown in FIG. 1A. Such directional arrangement of metal lines 126A, 126B, 126C, and 126D can reduce tensile stress induced in substrate 106 during the formation of metal lines 126A, 126B, 126C, and 126D, thus reducing warpage of substrate 106.

Metal lines 126A can be formed overlapping trenches 108A1 and 108A3 for adequate contact area between metal lines 126A and contact structures 116A. Similarly, metal lines 126B can be formed overlapping trenches 108B1 and 108B3 for adequate contact area between metal lines 126B and contact structures 116B. Metal lines 126C can be formed overlapping trenches 108C1 and 108C3 for adequate contact area between metal lines 126C and contact structures 116C. Metal lines 126D can be formed overlapping trenches 108D1 and 108D3 for adequate contact area between metal lines 126D and contact structures 116D.

In some embodiments, via layer V1 can include (i) metal vias 128A and 128B electrically connected to metal lines 126A, (ii) metal vias 130A and 130B electrically connected to metal lines 126B, (iii) metal vias 132A and 132B electrically connected to metal lines 126C, and (iv) metal vias 134A and 134B electrically connected to metal lines 126D. In some embodiments, metal line layer M2 can include (i) metal lines 136A electrically connected to metal vias 128A, 128B, 130A, and 130B, and (ii) metal lines 136B electrically connected to metal vias 132A, 132B, 134A, and 134B. In some embodiments, metal lines 126A-126D, 136A-136B, and metal vias 128A-128B, 130A-130B, 132A-132B, and 134A-134B can include an electrically conductive material, such as copper (Cu), ruthenium (Ru), cobalt (Co), molybdenum (Mo), a Cu alloy (e.g., Cu—Ru, Cu—Al, or copper-manganese (CuMn)), and other suitable conductive materials.

Metal line 136A can be electrically connected to the first power source (e.g., a FET or a power supply; not shown) to provide first voltage $V_1$ to (i) conductive layer 118A through vias 128A-128B, metal lines 126A, and contact structures 116A, and (ii) conductive layer 118C through vias 130A-130B, metal lines 126B, and contact structures 116B. Similarly, metal line 136B can be electrically connected to the second power source (e.g., a FET or a power supply; not shown) to provide second voltage V2 to (i) conductive layer 118C through vias 132A-132B, metal lines 126C, and contact structures 116C, and (ii) conductive layer 118D through vias 134A-134B, metal lines 126D, and contact structures 116D. In some embodiments, trench groups (e.g., trench groups 108A and 108B) having conductive layers (e.g., conductive layers 118A and 118C) electrically connected to the same voltage level (e.g., voltage $V_1$) can be disposed adjacent (or directly next to) each other for the ease of fabricating the metal lines (e.g., metal line 136A) shared between the trench groups.

Figure 2A:
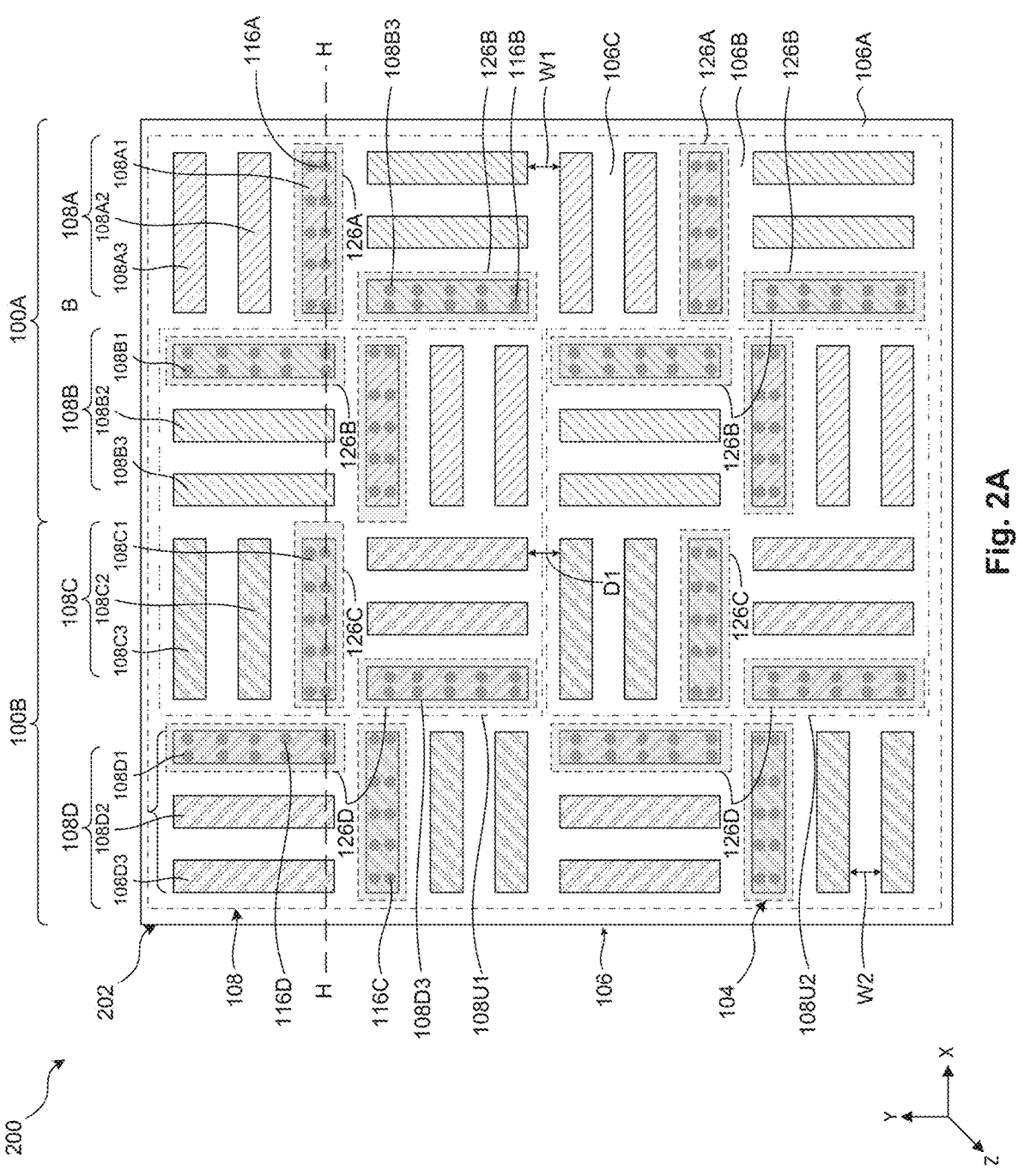
FIGS. 2A-2C illustrate top-down and cross-sectional views of a second configuration of a passive semiconductor device coupled to an interconnect structure, in accordance with some embodiments.
Figure 2B:
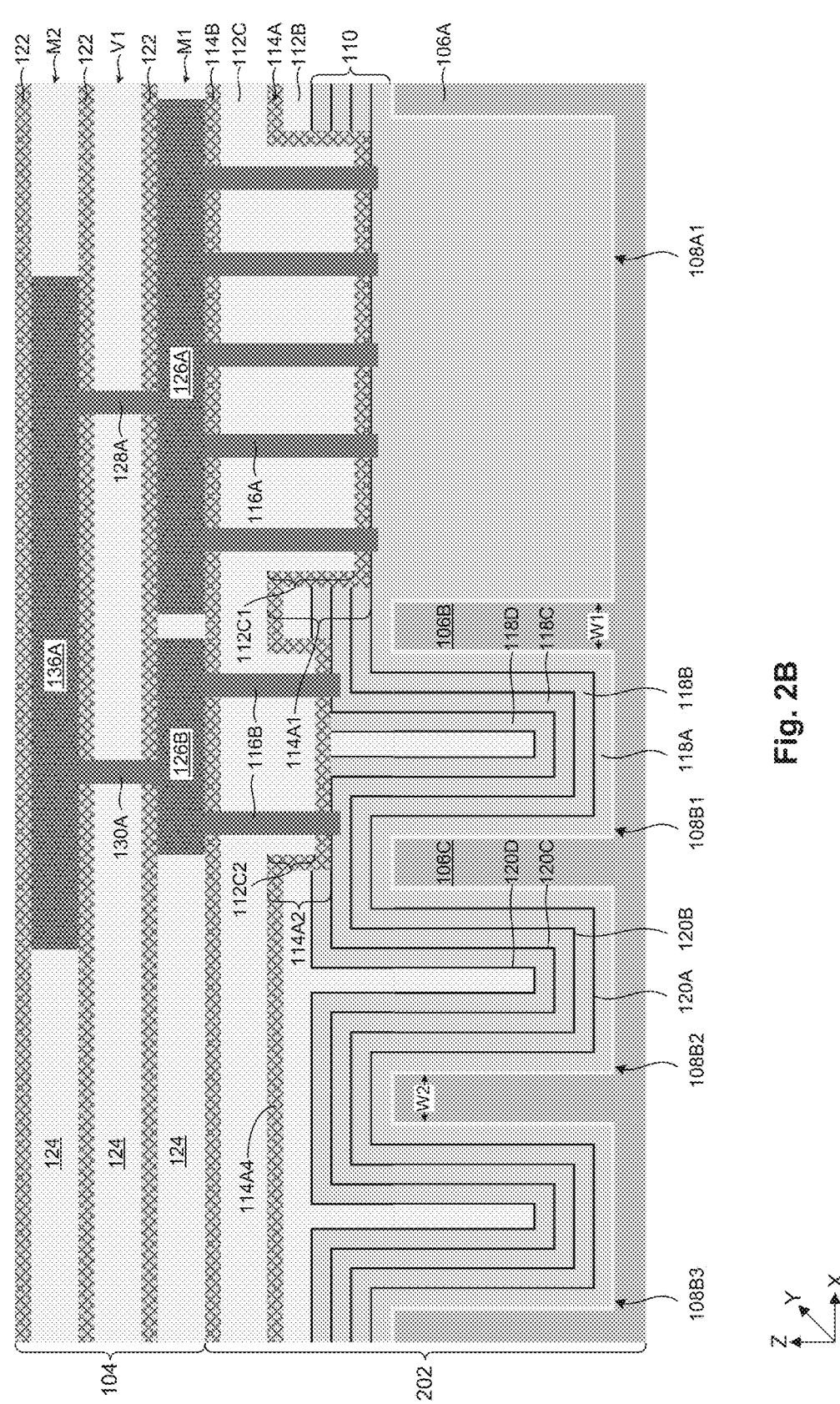
Figure 2C:
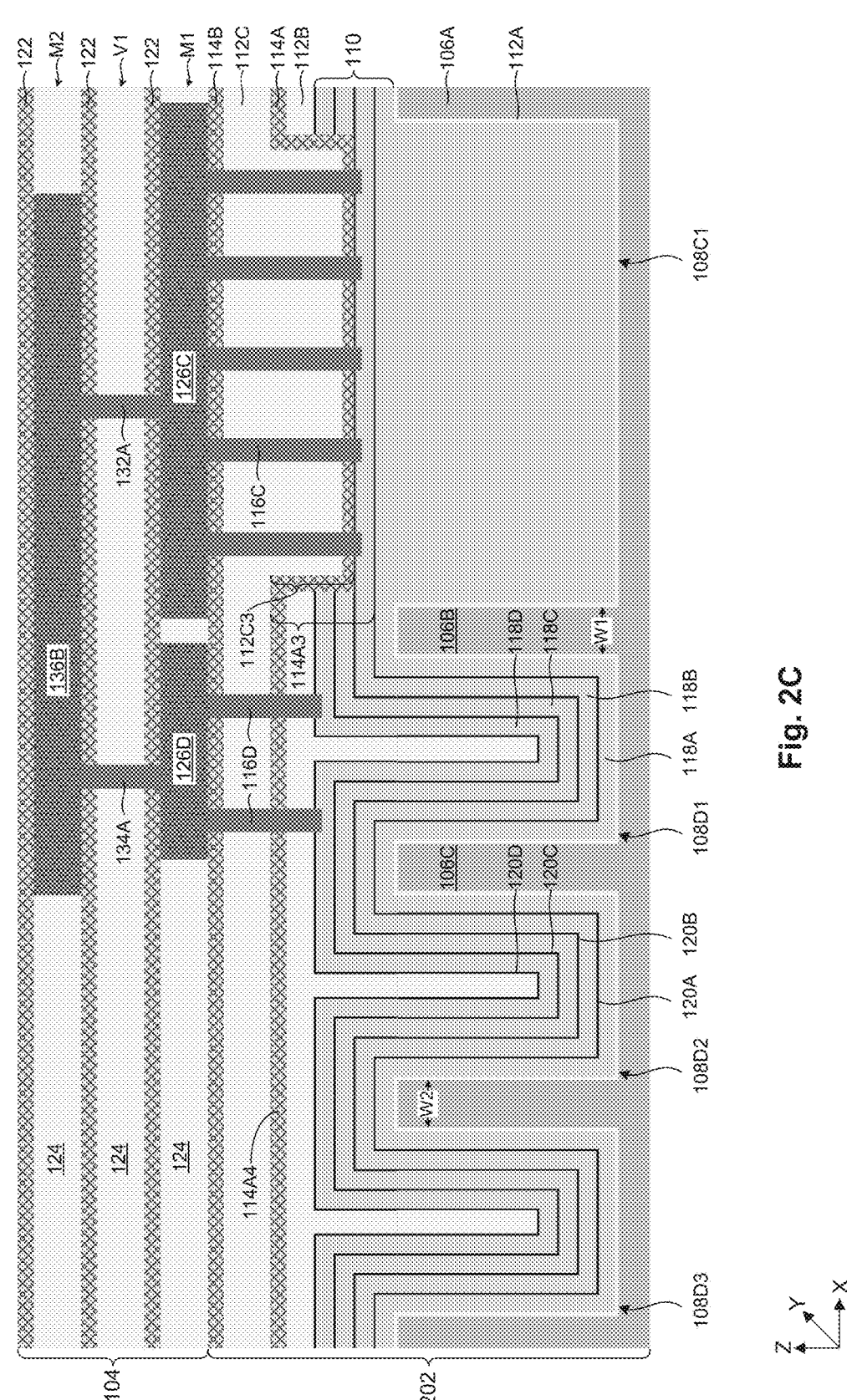

FIG. 2A illustrates a top-down view of a semiconductor structure 200 including a passive semiconductor device 202 and an interconnect structure 104, according to some embodiments. FIG. 2B illustrates a cross-sectional view of region 100A of semiconductor structure 200 along line H-H of FIG. 2A, according to some embodiments. FIG. 2C illustrates a cross-sectional view of region 100B of semiconductor structure 200 along line H-H of FIG. 2A, according to some embodiments. FIGS. 2B and 2C illustrate cross-sectional views of passive semiconductor device 202 and interconnect structure 104 with additional structures that are not shown in FIG. 2A for simplicity. The discussion of elements in FIGS. 1A-1E and 2A-2C with the same annotations applies to each other, unless mentioned otherwise.

The discussion of passive semiconductor device 102 applies to passive semiconductor device 202, unless mentioned otherwise. Passive semiconductor device 202 can include more than one row of contact structures 116A, 116B, 116C, and 116D, unlike passive semiconductor device 102. In some embodiments, two rows of contact structures 116A can be disposed directly on portions of conductive layer 118A disposed in or above trenches 108A1 and 108A3. In some embodiments, two rows of contact structures 116B can be disposed directly on portions of conductive layer 118C disposed in or above trenches 108B1 and 108B3. In some embodiments, two rows of contact structures 116C can be disposed directly on portions of conductive layer 118B disposed in or above trenches 108C1 and 108C3. In some embodiments, two rows of contact structures 116D can be disposed directly on portions of conductive layer 118D disposed in or above trenches 108D1 and 108D3. With the additional rows of contact structures 116A, 116B, 116C, and 116D, the contact area between interconnect structure 104 and conductive layers 118A, 118B, 118C, and 118D can be increased, thus increasing electrical conductivity between passive semiconductor device 202 and interconnect structure 104.

Figure 3A:
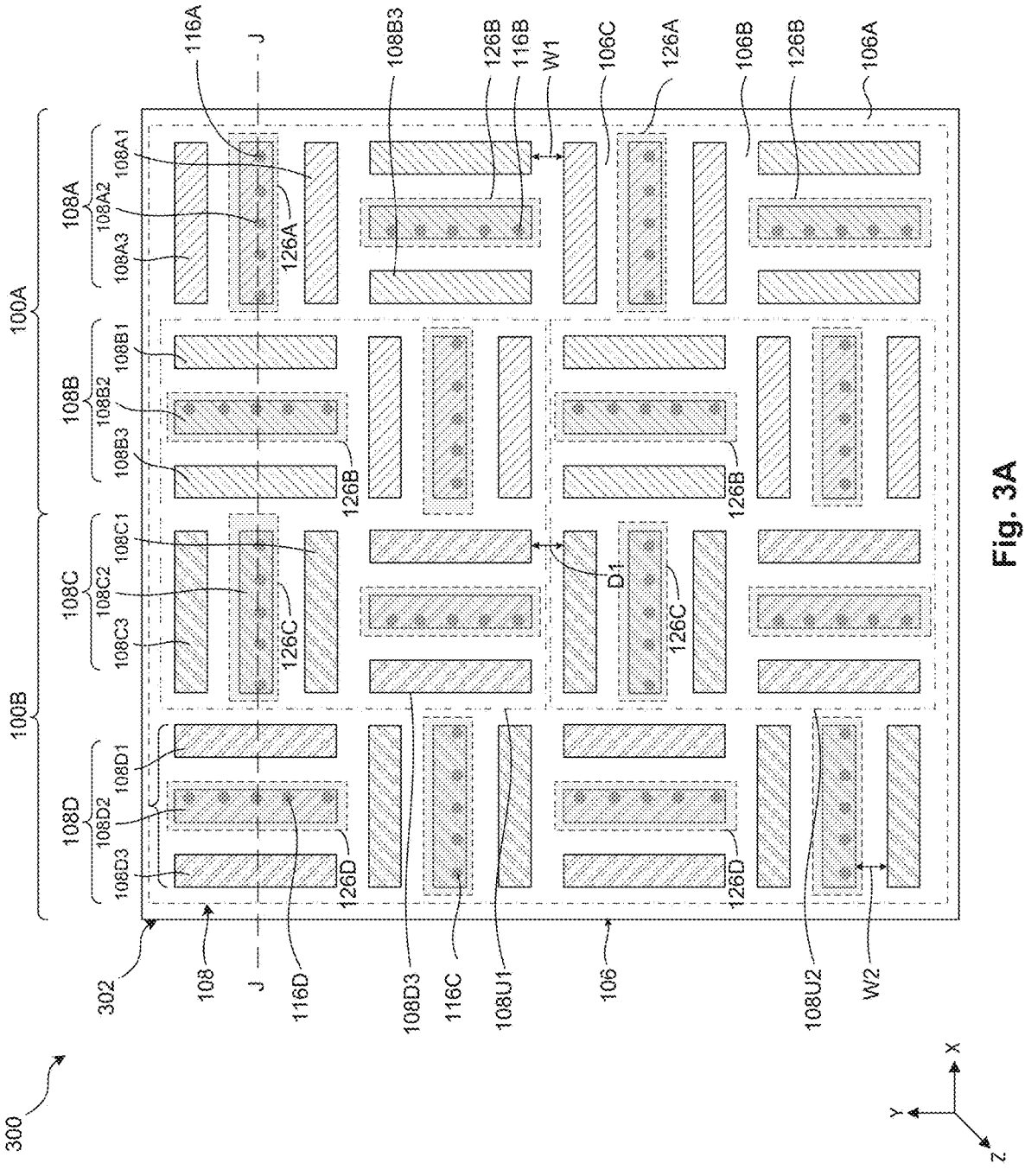
FIGS. 3A-3C illustrate top-down and cross-sectional views of a third configuration of a passive semiconductor device coupled to an interconnect structure, in accordance with some embodiments.
Figure 3B:
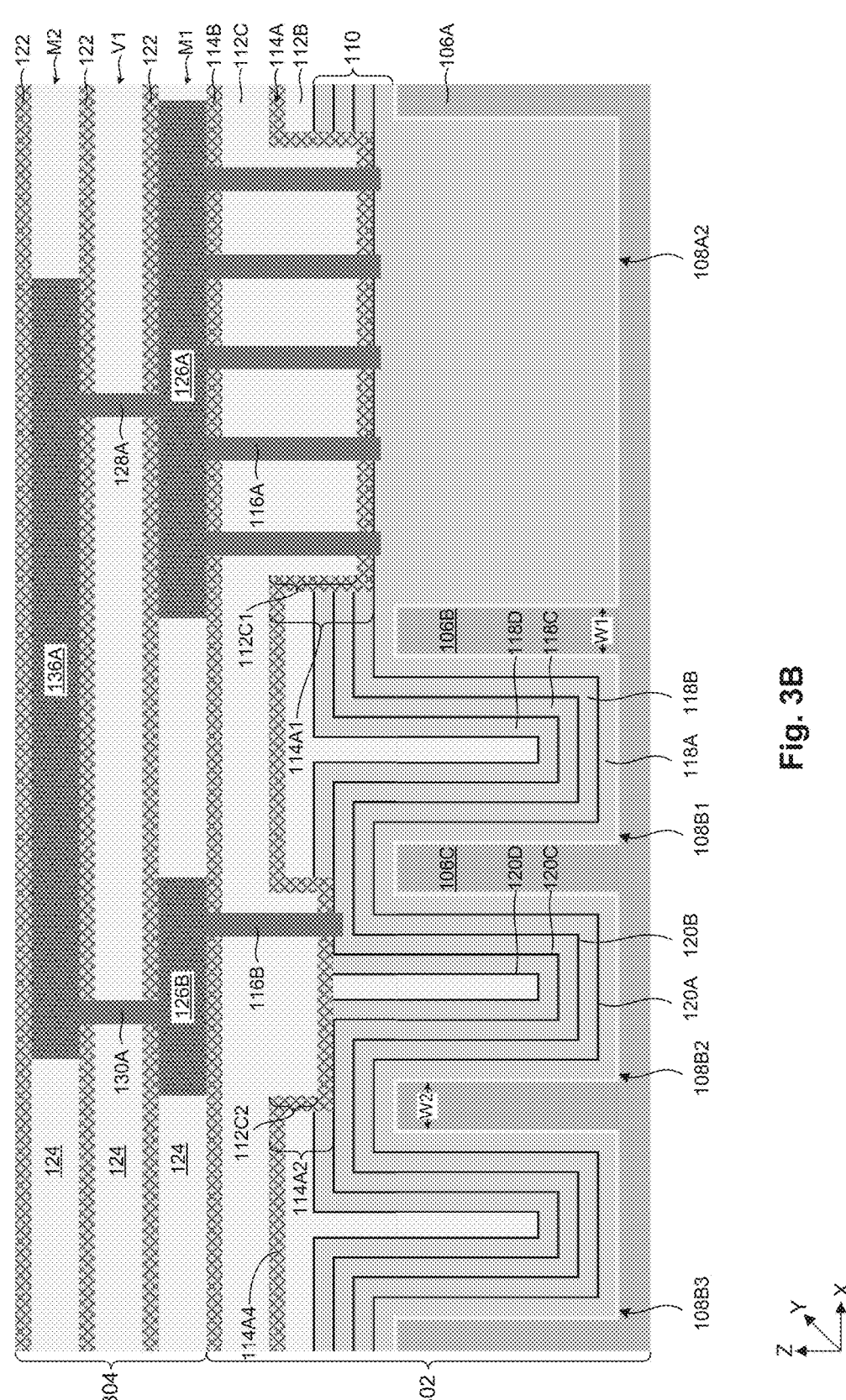
Figure 3C:
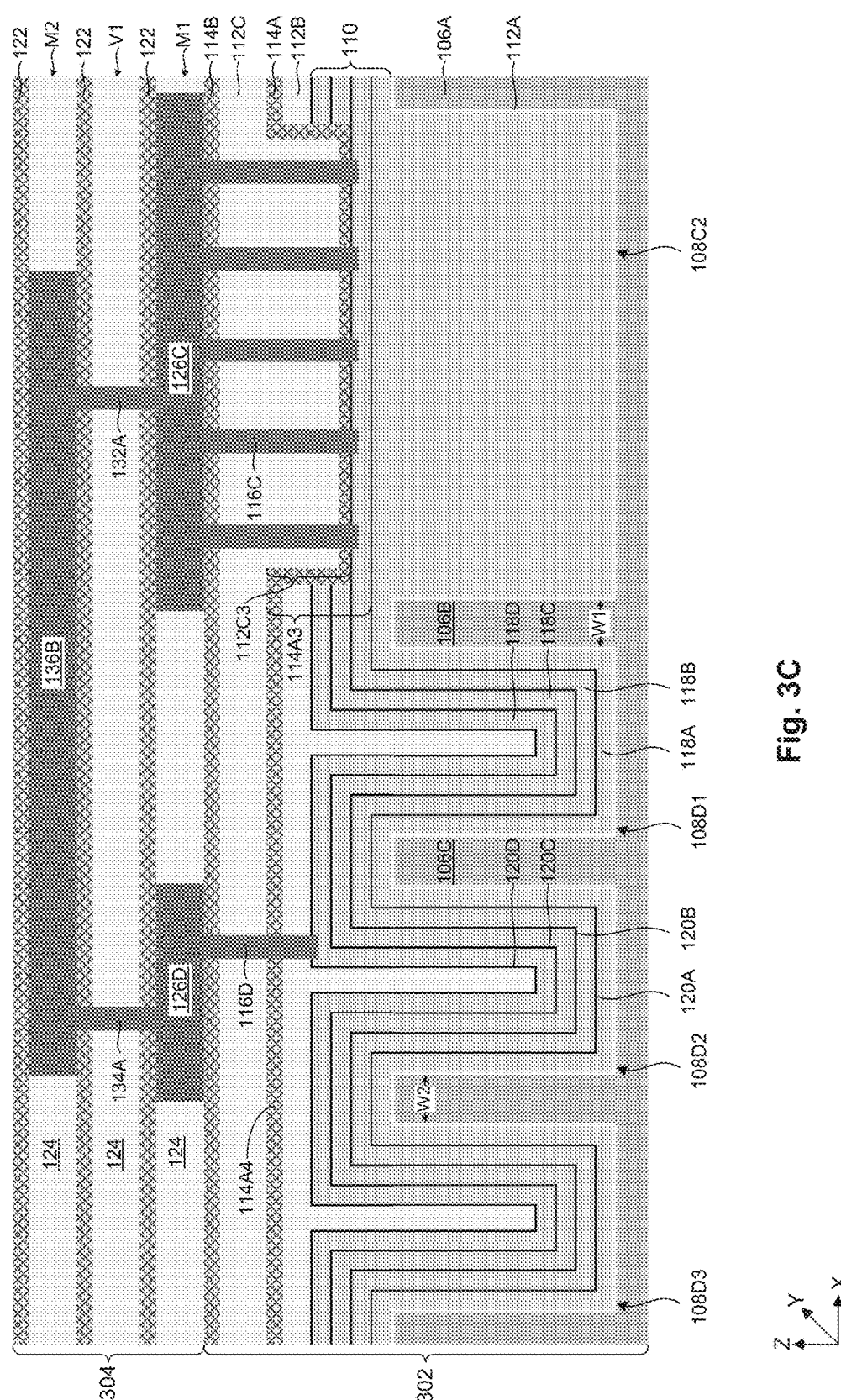

FIG. 3A illustrates a top-down view of a semiconductor structure 300 including a passive semiconductor device 302 and an interconnect structure 304, according to some embodiments. FIG. 3B illustrates a cross-sectional view of region 100A of semiconductor structure 300 along line J-J of FIG. 3A, according to some embodiments. FIG. 3C illustrates a cross-sectional view of region 100B of semiconductor structure 300 along line J-J of FIG. 3A, according to some embodiments. FIGS. 3B and 3C illustrate cross-sectional views of passive semiconductor device 302 and interconnect structure 304 with additional structures that are not shown in FIG. 3A for simplicity. The discussion of elements in FIGS. 1A-1F, 2A-2C, and 3A-3C with the same annotations applies to each other, unless mentioned otherwise.

The discussion of passive semiconductor device 102 applies to passive semiconductor device 302 and the discussion of interconnect structure 104 applies to interconnect structure 304, unless mentioned otherwise. Unlike passive semiconductor device 102, contact structures 116A can be formed overlapping trenches 108A2, contact structures 116B can be formed overlapping trenches 108B2, contact structures 116C can be formed overlapping trenches 108C2, and contact structures 116D can be formed overlapping trenches 108D2 in passive semiconductor device 302. Such configuration of contact structures 116A, 116B, 116C, and 116D can increase the distance between contact structures in different trench groups for the ease of fabricating contact structures 116A, 116B, 116C, and 116D. Thus, contact structures 116A are disposed directly on portions of conductive layer 118A disposed in or above trenches 108A2, contact structures 116B are disposed directly on portions of conductive layer 118C disposed in or above trenches 108B2, contact structures 116C are disposed directly on portions of conductive layer 118B disposed in or above trenches 108C2, and contact structures 116D are disposed directly on portions of conductive layer 118D disposed in or above trenches 108D2.

Also, dielectric oxide portions 112C1 and dielectric nitride portions 114A1 are disposed overlapping trenches 108A2 and surrounding contact structures 116A to electrically isolate contact structures 116A from conductive layers 118B, 118C, and 118D. Dielectric oxide portions 112C2 and dielectric nitride portions 114A2 are disposed overlapping trenches 108B2 and surrounding contact structures 116B to electrically isolate contact structures 116B from conductive layers 118D. Dielectric oxide portions 112C3 and dielectric nitride portions 114A3 are disposed overlapping trenches 108C2 and surrounding contact structures 116C to electrically isolate contact structures 116C from conductive layers 118C and 118D.

In some embodiments, metal lines 126A can be formed overlapping trenches 108A2, metal lines 126B can be formed overlapping trenches 108B2, metal lines 126C can be formed overlapping trenches 108C2, and metal lines 126D can be formed overlapping trenches 108D2 in interconnect structure 304 to achieve adequate contact area with contact structures 116A, 116B, 116C, and 116D.

Figure 4A:
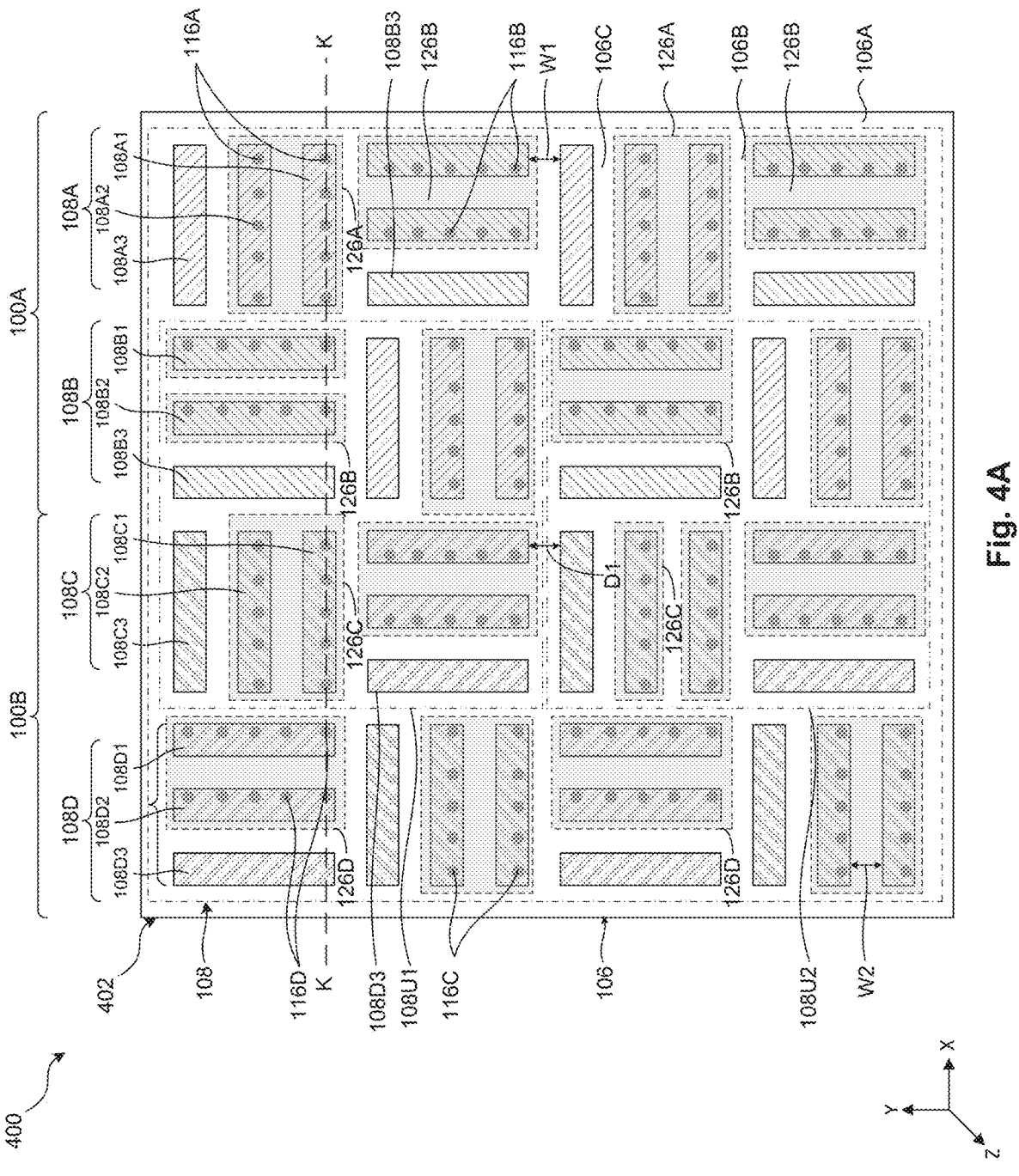
FIGS. 4A-4C illustrate top-down and cross-sectional views of a fourth configuration of a passive semiconductor device coupled to an interconnect structure, in accordance with some embodiments.
Figure 4B:
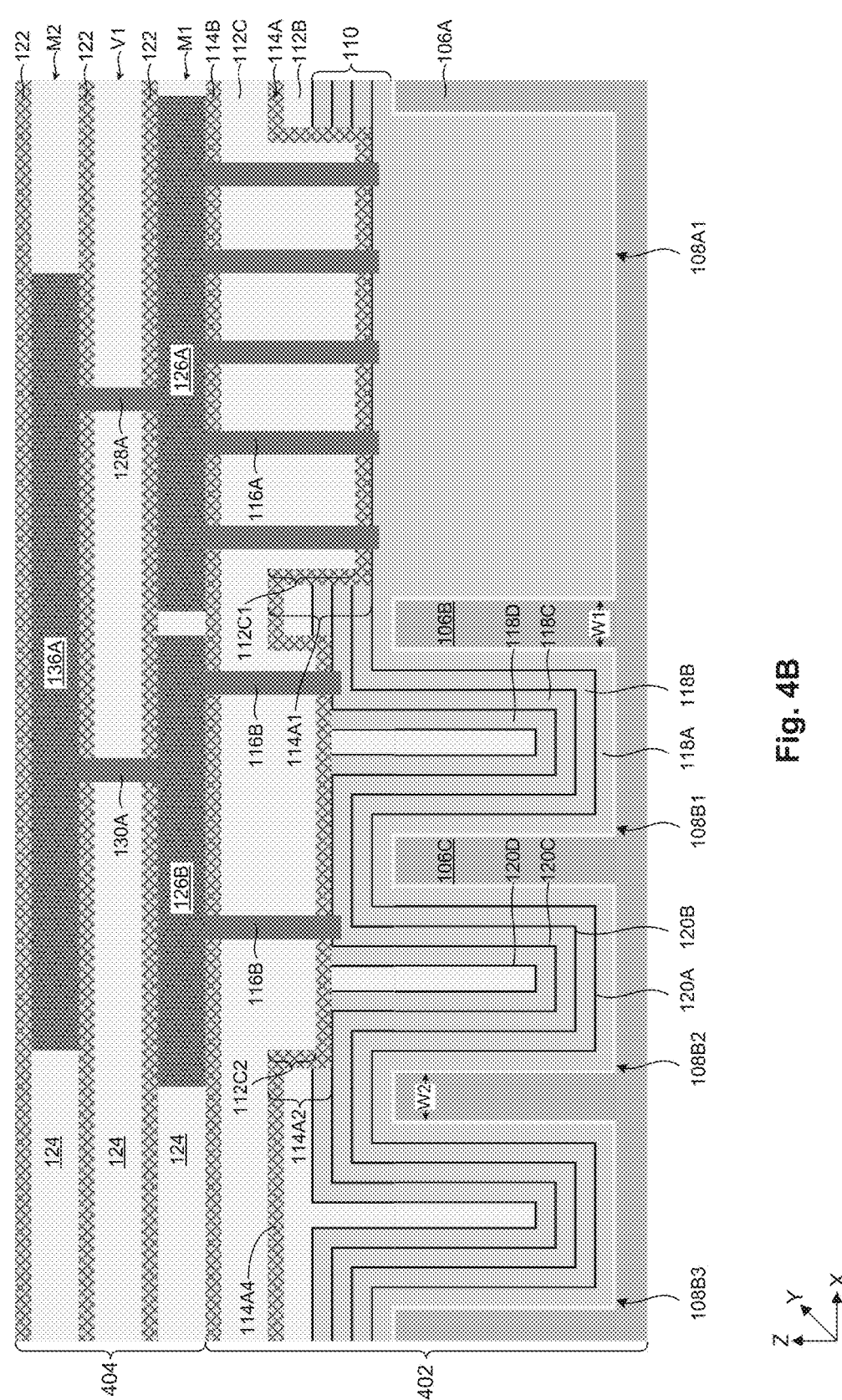
Figure 4C:
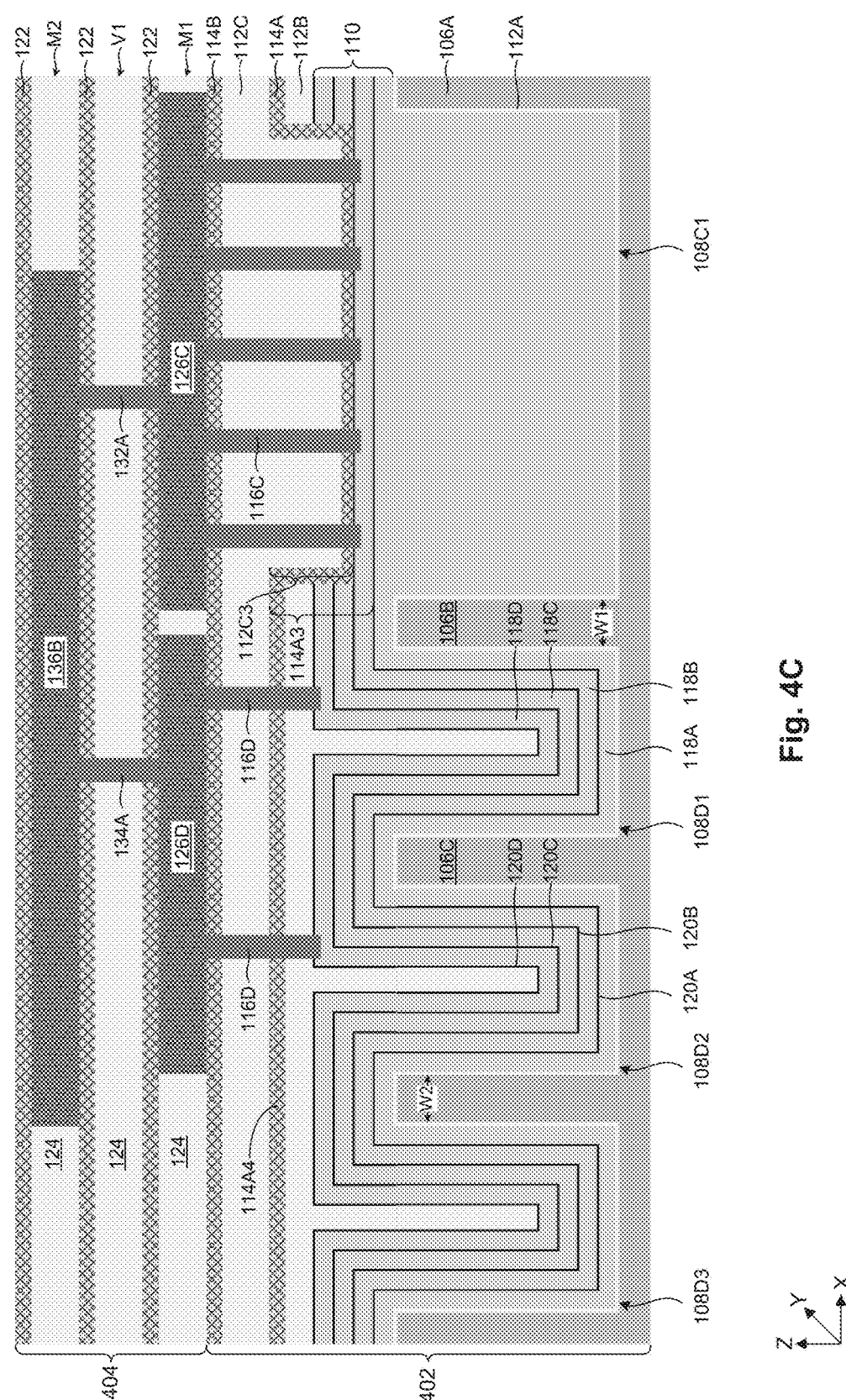

FIG. 4A illustrates a top-down view of a semiconductor structure 400 including a passive semiconductor device 402 and an interconnect structure 404, according to some embodiments. FIG. 4B illustrates a cross-sectional view of region 100A of semiconductor structure 400 along line K-K of FIG. 4A, according to some embodiments. FIG. 4C illustrates a cross-sectional view of region 100B of semiconductor structure 400 along line K-K of FIG. 4A, according to some embodiments. FIGS. 4B and 4C illustrate cross-sectional views of passive semiconductor device 402 and interconnect structure 404 with additional structures that are not shown in FIG. 4A for simplicity. The discussion of elements in FIGS. 1A-1F, 2A-2C, 3A-3C, and 4A-4C with the same annotations applies to each other, unless mentioned otherwise.

The discussion of passive semiconductor device 102 applies to passive semiconductor device 402 and the discussion of interconnect structure 104 applies to interconnect structure 404, unless mentioned otherwise. Passive semiconductor device 402 can have contact structures disposed on portions of conductive layers disposed in or above two or more trenches of each trench group to increase the electrical conductivity between passive semiconductor device 402 and interconnect structure 404. For example, contact structures 116A can be disposed directly on portions of conductive layer 118A disposed in or above trenches 108A1 and 108A2, contact structures 116B can be disposed directly on portions of conductive layer 118C disposed in or above trenches 108B1 and 108B2, contact structures 116C can be disposed directly on portions of conductive layer 118B disposed in or above trenches 108C1 and 108C2, and contact structures 116D can be disposed directly on portions of conductive layer 118D disposed in or above trenches 108D1 and 108D2 in passive semiconductor device 402. Thus, contact structures 116A are formed overlapping trenches 108A1 and 108A2, contact structures 116B are formed overlapping trenches 108B1 and 108B2, contact structures 116C are formed overlapping trenches 108C1 and 108C2, and contact structures 116D are formed overlapping trenches 108D1 and 108D2.

Also, dielectric oxide portions 112C1 and dielectric nitride portions 114A1 are disposed overlapping trenches 108A1 and 108A2 and surrounding contact structures 116A to electrically isolate contact structures 116A from conductive layers 118B, 118C, and 118D. Dielectric oxide portions 112C2 and dielectric nitride portions 114A2 are disposed overlapping trenches 108B1 and 108B2 and surrounding contact structures 116B to electrically isolate contact structures 116B from conductive layers 118D. Dielectric oxide portions 112C3 and dielectric nitride portions 114A3 are disposed overlapping trenches 108C1 and 108C2 and surrounding contact structures 116C to electrically isolate contact structures 116C from conductive layers 118C and 118D.

In some embodiments, metal lines 126A can be formed overlapping trenches 108A1 and 108A2, metal lines 126B can be formed overlapping trenches 108B1 and 108B2, metal lines 126C can be formed overlapping trenches 108C1 and 108C2, and metal lines 126D can be formed overlapping trenches 108D1 and 108D2 in interconnect structure 404, unlike interconnect structure 104.

In some embodiments, one or more of semiconductor structures 100, 200, 300, and/or 400 can be implemented as elements of an interposer structure of an IC chip package 500, as described below with reference to FIG. 5.

Figure 5:
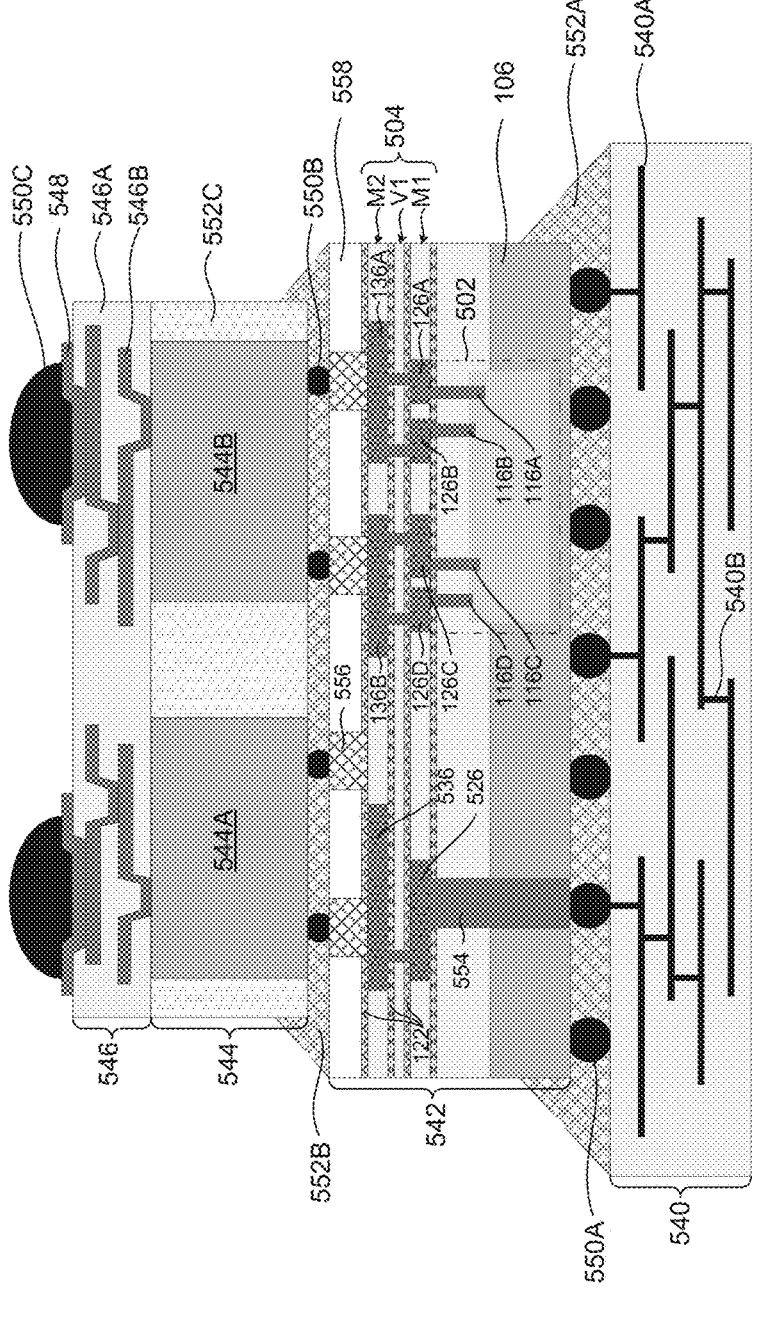
FIG. 5 illustrates a cross-sectional view of an integrated circuit (IC) chip package including a passive semiconductor device, in accordance with some embodiments.

FIG. 5 illustrates a cross-sectional view of an IC chip package 500, according to some embodiments. In some embodiments, IC chip package 500 can have a chip-on-wafer-on-substrate (CoWoS) structure. In some embodiments, IC chip package 500 can include (i) a package substrate 540, (ii) an interposer structure 542, (iii) a chip layer 544, (iv) a redistribution layers (RDL) structure 546, (v) metal contact pads 548, (vi) conductive bonding structures 550A, 550B, and 550C, and (vii) encapsulating layers 552A, 552B, and 552C. The discussion of elements in FIGS. 1A-1F, 2A-2C, 3A-3C, 4A-4C, and 5 with the same annotations applies to each other, unless mentioned otherwise.

In some embodiments, package substrate 540 can be a laminate substrate (core-less) or can have cores (not shown). Package substrate 540 can include conductive lines 540A and conductive vias 540B that are electrically connected to conductive bonding structures 550A. Package substrate 540 can have a surface area greater than a surface area of interposer structure 542. Package substrate 540 can be disposed on and electrically connected to a circuit board (not shown) and can electrically connect IC chip package 500 to external devices through the circuit board.

In some embodiments, interposer structure 542 can include (i) a semiconductor substrate 106, (ii) passive semiconductor device 502, (iii) a conductive through-via 554, (iv) an interconnect structure 504, (v) metal contact pads 556, and (vi) a dielectric layer 558. Though one passive semiconductor device 502 and one conductive through-via 554 are shown in FIG. 5, interposer structure 542 can include any number of passive semiconductor devices and conductive through-vias. Passive semiconductor device 502 can represent passive semiconductor device 102, 202, 302, or 402 and interconnect structure 504 can represent interconnect structure 104, 304, or 404. Interconnect structure can include metal lines 526 and 536 electrically connected to conductive through-via 554. In some embodiments, conductive through-vias 554 and metal contact pads 556 can include a metal (such as copper and aluminum), a metal alloy (such as copper alloy and aluminum alloy), or a combination thereof.

Conductive through-via 554 can be electrically connected to package substrate 540 through conductive bonding structures 550A. Passive semiconductor device 502 and conductive through-via 554 can be electrically connected to the components of chip layer 544 through interconnect structure 504, metal contact pads 556, and conductive bonding structures 550B. In some embodiments, conductive bonding structures 550A and 550B can include solder bumps.

In some embodiments, encapsulating layer 552A can be disposed between package substrate 540 and interposer structure 542 and can surround conductive bonding structures 550A. In some embodiments, encapsulating layer 552A can be disposed between interposer structure 542 and chip layer 544 and can surround conductive bonding structures 550B. In some embodiments, encapsulating layers 552A and 552B can include a molding compound, a molding underfill, an epoxy, or a resin.

In some embodiments, chip layer 544 can include IC chips 544A and 544B separated from each other by encapsulating layer 552C. In some embodiments, encapsulating layer 552C can include a molding compound, a molding underfill, an epoxy, or a resin. In some embodiments, IC chips 544A and 544B can include active devices (e.g., MOSFETs, finFETs, and GAA FETs). The active devices can be electrically coupled to passive semiconductor device 502 through interconnect structure 504, metal contact pads 556, and conductive bonding structures 550B.

In some embodiments, RDL structure 546 can be disposed on and electrically connected to IC chips 544A and 544B. RDL structure 546 can include a dielectric layer 546A and RDLs 546B disposed in dielectric layer 546A. RDLs 546B can be configured to fan out IC chips 544A and 544B such that electrical connections on each of IC chips 544A and 544B can be redistributed to a greater area than the individual IC chips, and consequently increase the number of electrical connections. In some embodiments, RDLs 546B can be electrically connected to conductive bonding structures 550C through metal contact pads 548. In some embodiments, metal contact pads 548 and RDLs 546B can include a metal (such as copper and aluminum), a metal alloy (such as copper alloy and aluminum alloy), or a combination thereof.

FIG. 6 is a flow diagram of an example method 600 for fabricating semiconductor structure 100, according to some embodiments. For illustrative purposes, the operations illustrated in FIG. 6 will be described with reference to the example fabrication process for fabricating semiconductor structure 100 as illustrated in FIGS. 7, 8A-8D, 9A-9D, 10A-10D, 11A-11D, 12A-12D, 13A-13D, 14A-14D, and 15A-15D. FIGS. 7 and 8A-15A are cross-sectional views of trench group 108A of semiconductor structure 100 along line B-B of FIG. 1A at various stages of its fabrication, according to some embodiments. FIGS. 8B-15B are cross-sectional views of trench group 108B of semiconductor structure 100 along line A-A of FIG. 1A at various stages of its fabrication, according to some embodiments. FIGS. 8C-15C are cross-sectional views of trench group 108C of semiconductor structure 100 along line C-C of FIG. 1A at various stages of its fabrication, according to some embodiments. FIGS. 8D-15D are cross-sectional views of trench group 108D of semiconductor structure 100 along line A-A of FIG. 1A at various stages of its fabrication, according to some embodiments. Operations can be performed in a different order or not performed depending on specific applications. It should be noted that method 600 may not produce a complete semiconductor structure 100. Accordingly, it is understood that additional processes can be provided before, during, and after method 600, and that some other processes may only be briefly described herein. Elements in FIGS. 7, 8A-8D, 9A-9D, 10A-10D, 11A-11D, 12A-12D, 13A-13D, 14A-14D, and 15A-15D with the same annotations as elements in FIGS. 1A-1F are described above.

Referring to FIG. 6, in operation 605, first, second, third, and fourth groups of trenches are formed in a substrate. For example, as shown in FIG. 7, trench group 108A with trenches 108A1, 108A2, and 108A3 are formed in substrate 106. Though not shown in FIG. 7, trench group 108B with trenches 108B1, 108B2, and 108B3, trench group 108C with trenches 108C1, 108C2, and 108C3, and trench group 108D with trenches 108D1, 108D2, and 108D3 are formed in substrate 106 at the same time as trench group 108A. The cross-sectional view of trench group 108B along line A-A, of trench group 108C along line-C-C, and of trench group 108D along line A-A is similar to the cross-sectional view of trench group 108A shown in FIG. 7. Trenches 108A1-108D3 can be formed of substantially equal height and with an aspect ratio greater than about 20 (e.g., between about 20 to about 40). In some embodiments, difference in heights between trenches can be less than about 20 nm.

Referring to FIG. 6, in operation 610, a first dielectric oxide layer is formed in the first, second, third, and fourth groups of trenches and on substrate regions between the trenches. For example, as shown in FIGS. 8A-8D, dielectric oxide layer 112A is formed in trenches 108A1, 108A2, 108A3, 108B1, 108B2, 108B3, 108C1, 108C2, 108C3, 108D1, 108D2, and 108D3 and on substrate regions 106A, 106B, and 106C. In some embodiments, the formation of dielectric oxide layer 112A can include depositing a substantially conformal layer of silicon oxide or other suitable dielectric oxide material using a chemical vapor deposition (CVD) process or an atomic layer deposition (ALD) process.

Referring to FIG. 6, in operation 615, a capacitive structure is formed on the first dielectric oxide layer. For example, as shown in FIGS. 8A-8D, capacitive structure 110 is formed on dielectric oxide layer 112A. The formation of capacitive structure 110 can include sequential operations of (i) depositing conductive layer 118A substantially conformally on dielectric oxide layer 112A, (ii) depositing high-k dielectric layer 120A substantially conformally on conductive layer 118A, (iii) depositing conductive layer 118B substantially conformally on high-k dielectric layer 120A, (iv) depositing high-k dielectric layer 120B substantially conformally on conductive layer 118B, (v) depositing conductive layer 118C substantially conformally on high-k dielectric layer 120B, (vi) depositing high-k dielectric layer 120C substantially conformally on conductive layer 118C, and (vii) depositing conductive layer 118D substantially conformally on high-k dielectric layer 120C. In some embodiments, high-k dielectric layer 120D is deposited substantially conformally on conductive layer 118D. In some embodiments, depositing conductive layers 118A, 118B, 118C, and 118D can include depositing layers of titanium nitride or other suitable electrically conductive material using a CVD process or an ALD process. In some embodiments, depositing high-k dielectric layers 120A, 120B, 120C, and 120D can include depositing layers of hafnium oxide or other suitable high-k dielectric material using a CVD process or an ALD process.

Referring to FIG. 6, in operation 620, a second dielectric oxide layer is formed on the capacitive structure. For example, as shown in FIGS. 8A-8D, dielectric oxide layer 112B is deposited directly on capacitive structure 110 and fills the regions in trenches 108A1, 108A2, 108A3, 108B1, 108B2, 108B3, 108C1, 108C2, 108C3, 108D1, 108D2, and 108D3 that are unoccupied by capacitive structure 110. In some embodiments, the formation of dielectric oxide layer 112B can include depositing a layer of silicon oxide or other suitable dielectric oxide material using a CVD process or other suitable oxide deposition process.

Referring to FIG. 6, in operation 625, a first opening is formed in a first portion of the capacitive structure in a trench of the first group of trenches. For example, as shown in FIGS. 9A-9D, a first opening 960 is selectively formed in a first portion of capacitive structure 110 disposed in trench 108A1, while other portions of capacitive structure 110 are protected from etching with a masking layer 962. In some embodiments, the formation of first opening 960 can include etching conductive layers 118B, 118C, and 118D and high-k dielectric layers 120B, 120C, and 120D from the first portion of capacitive structure 110. In some embodiments, the etching process is terminated when high-k dielectric layer 120A is exposed in first opening 960, as shown in FIG. 9A. In some embodiments, the etching process is terminated after removing high-k dielectric layer 120A from the first portion of capacitive structure 110 and conductive layer 118A is exposed (not shown) in first opening 960.

Referring to FIG. 6, in operation 630, a second opening is formed in a second portion of the capacitive structure in a trench of the second group of trenches. For example, as shown in FIGS. 10A-10D, a second opening 1060 is selectively formed in a second portion of capacitive structure 110 disposed in trench 108B1, while other portions of capacitive structure 110 are protected from etching with a masking layer 1062. In some embodiments, the formation of second opening 1060 can include etching conductive layer 118D and high-k dielectric layer 120D from the second portion of capacitive structure 110. In some embodiments, the etching process is terminated when high-k dielectric layer 120C is exposed in second opening 1060, as shown in FIG. 10B. In some embodiments, the etching process is terminated after removing high-k dielectric layer 120C from the second portion of capacitive structure 110 and conductive layer 118C is exposed (not shown) in second opening 1060.

Figure 11A:
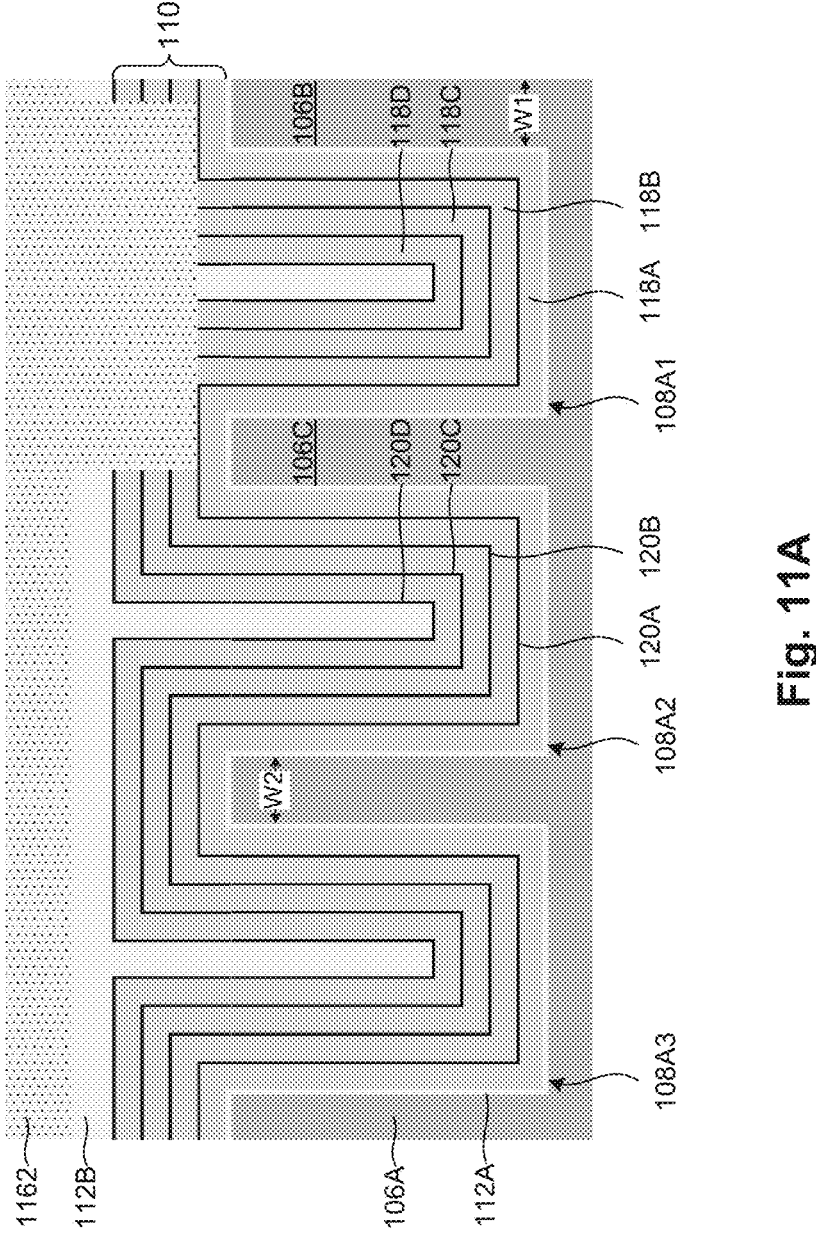
Figure 11B:
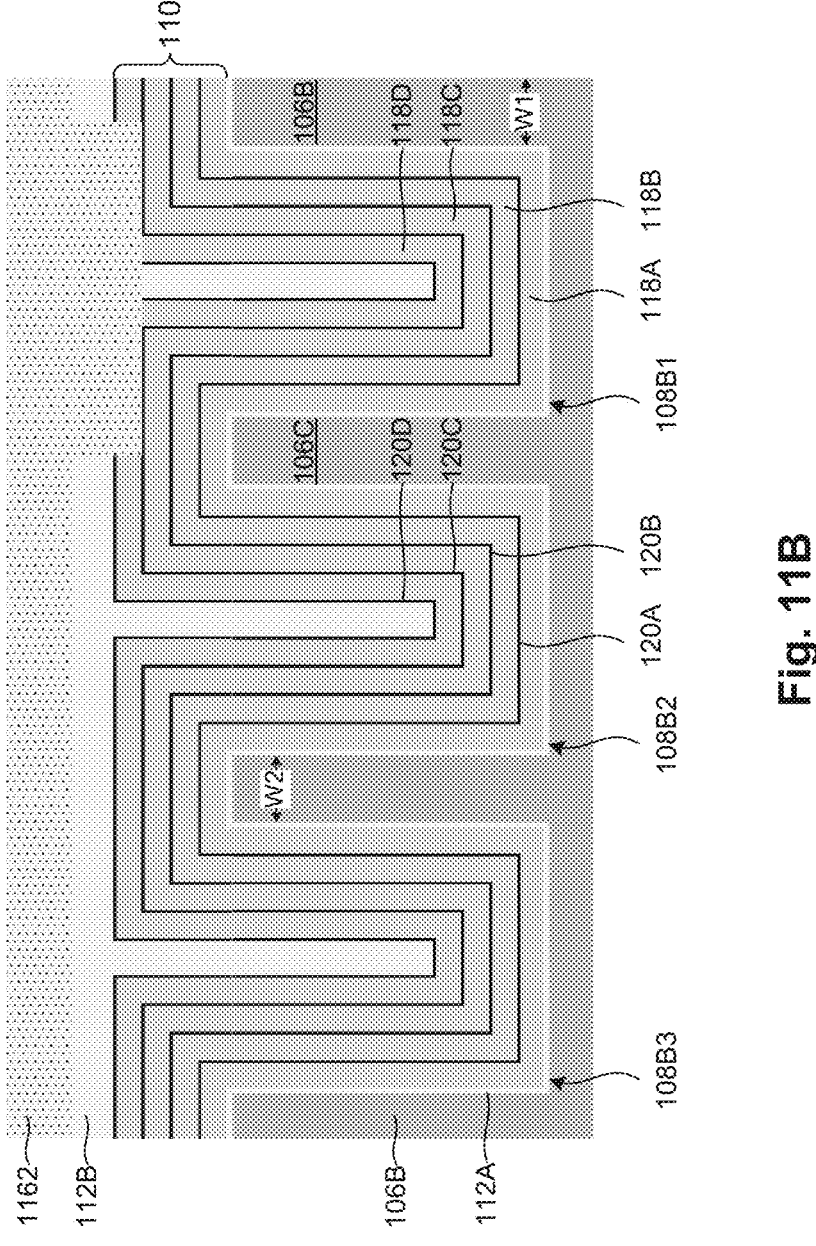
Figure 15A:
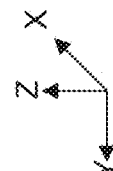
Figure 15B:
Figure 15C:
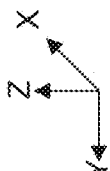
Figure 15D:

Referring to FIG. 6, in operation 635, a third opening is formed in a third portion of the capacitive structure in a trench of the third group of trenches. For example, as shown in FIGS. 11A-11D, a third opening 1160 is selectively formed in a third portion of capacitive structure 110 disposed in trench 108C1, while other portions of capacitive structure 110 are protected from etching with a masking layer 1162. In some embodiments, the formation of third opening 1160 can include etching conductive layers 118C and 118D and high-k dielectric layers 120C and 120D from the third portion of capacitive structure 110. In some embodiments, the etching process is terminated when high-k dielectric layer 120B is exposed in third opening 1160, as shown in FIG. 11C. In some embodiments, the etching process is terminated after removing high-k dielectric layer 120B from the third portion of capacitive structure 110 and conductive layer 118B is exposed (not shown) in third opening 1160.

Referring to FIG. 6, in operation 640, a dielectric nitride layer is formed on the second dielectric oxide layer and in the first, second, and third openings. For example, as shown in FIGS. 12A-12D, dielectric nitride layer 114A is substantially conformally formed on dielectric oxide layer 112B and in first, second, and third openings 960, 1060, and 1160. In some embodiments, the formation of dielectric nitride layer 114B can include depositing a layer of silicon nitride, silicon oxynitride, or other suitable dielectric nitride material using a CVD process or an ALD process. The formation of dielectric nitride layer 114A can be followed by the deposition of dielectric oxide layer 112C on dielectric nitride layer 114A, which can be followed by the deposition of dielectric nitride layer 114B on dielectric oxide layer 112C.

Referring to FIG. 6, in operation 645, first, second, third, and fourth contact openings are formed on the first, second, third, and fourth portions of the capacitive structure. For example, as shown in FIGS. 13A-13D, contact openings 1316A, 1316B, 1316C, and 1316D are formed on the first, second, third, and fourth portions of capacitance structure 110 disposed in trenches 108A1, 108B1, 108C1, and 108D1, respectively. The formation of contact openings 1316A, 1316B, 1316C, and 1316D can include sequential operations of (i) etching through dielectric nitride layer 114B, dielectric oxide portion 112C1, dielectric nitride portion 114A1, and high-k dielectric layer 120A to expose conductive layer 118A through contact opening 1316A, as shown in FIG. 13A, (ii) etching through dielectric nitride layer 114B, dielectric oxide portion 112C2, dielectric nitride portion 114A2, and high-k dielectric layer 120C to expose conductive layer 118C through contact opening 1316B, as shown in FIG. 13B, (iii) etching through dielectric nitride layer 114B, dielectric oxide portion 112C3, dielectric nitride portion 114A3, and high-k dielectric layer 120B to expose conductive layer 118B through contact opening 1316C, as shown in FIG. 13C, and (iv) etching through dielectric nitride layer 114B, dielectric oxide layer 112C, dielectric nitride portion 114A4, and high-k dielectric layer 120D to expose conductive layer 118D through contact opening 1316D, as shown in FIG. 13D.

Referring to FIG. 6, in operation 650, first, second, third, and fourth contact structures are formed on the first, second, third, and fourth portions of the capacitive structure. For example, as shown in FIGS. 14A-14D, contact structures 116A, 116B, 116C, and 116D are formed on the first, second, third, and fourth portions of capacitance structure 110 disposed in trenches 108A1, 108B1, 108C1, and 108D1, respectively. The formation of contact structures 116A, 116B, 116C, and 116D can include sequential operations of (i) depositing a conductive material (not shown) on the structures of FIGS. 13A-13D to fill contact openings 1316A, 1316B, 1316C, and 1316D, and (ii) performing a chemical mechanical polishing (CMP) process on the deposited conductive material to substantially coplanarize top surfaces of contact structures 116A, 116B, 116C, and 116D with top surface of dielectric nitride layer 114B, as shown in FIGS. 14A-14D.

Referring to FIG. 6, in operation 655, an interconnect structure is formed on the first, second, third, and fourth contact structures. For example, as shown in FIGS. 15A-15D, interconnect structure 104 is formed on contact structures 116A, 116B, 116C, and 116D.

The present disclosure provides example passive semiconductor devices (e.g., passive semiconductor device 102, 202, 302, and 402) coupled to an interconnect structure (e.g., interconnect structure 104, 304, and 404) and example methods (e.g., method 600) of fabricating the same. In some embodiments, the passive semiconductor device can include high density capacitors (e.g., capacitors C1, C2, and C3) formed in a stacked configuration. In some embodiments, two or more capacitors are stacked over one another in a metal-insulator-metal (MIM) configuration and electrically connected in a parallel configuration. In some embodiments, portions of the capacitors are disposed in trenches (e.g., trenches 108A1-108D3) in a substrate (e.g., substrate 106) of the passive semiconductor device for which the capacitors can be referred to as "trench capacitors" or "deep trench capacitors (DTCs)."

In some embodiments, the passive semiconductor device can include a stack of first, second, third, and fourth conductive layers (e.g., conductive layers 118A, 118B, 118C, and 118D). The stack can further include a first high-k dielectric layer (e.g., high-k dielectric layer 120A) disposed between the first and second conductive layers, a second first high-k dielectric layer (e.g., high-k dielectric layer 120B) disposed between the second and third conductive layers, a third high-k dielectric layer (e.g., high-k dielectric layer 120C) disposed between the third and fourth conductive layers, and a fourth high-k dielectric layer (e.g., high-k dielectric layer 120D) disposed on the fourth conductive layer. The stack is disposed in the trenches and on substrate regions between the trenches. First, second, third, and fourth stack portions can be disposed in first, second, third, and fourth trenches, respectively. Other stack portions are disposed on substrate regions between the trenches.

A first capacitor (e.g., capacitor C1) can be formed between the first and second conductive layers, a second capacitor (e.g., capacitor C2) can be formed between the second and third conductive layers, and a third capacitor (e.g., capacitor C3) can be formed between the third and fourth conductive layers. The first, second, and third capacitors can be electrically connected in parallel to each other. In some embodiments, the first and third conductive layers are electrically connected to a first voltage (e.g., a ground reference voltage, Vss) and the second and fourth conductive layers are electrically connected to a second voltage (e.g., a power supply voltage, Vdd) that is higher than the first voltage.

In some embodiments, the passive semiconductor device can further include first, second, third, and fourth contact structures (e.g., contact structures 116A, 116B, 116C, and 116D) disposed on the first, second, third, and fourth conductive layers in the first, second, third, and fourth trenches, respectively. To form the contact structures overlapping the trenches, each of the contact structures can be formed through the stack on the corresponding conductive layers while being electrically isolated from the other conductive layers. By forming the contact structures overlapping the trenches and not overlapping the substrate regions between the trenches, the distance between adjacent trenches can be reduced or minimized. As a result, the density of the trenches can be increased by about 2 times to about 3 times compared to that of trenches in other passive semiconductor devices formed with contact structures overlapping the substrate regions between the trenches. Increasing the density of the trenches can increase the surface area of the first, second, third, and fourth conductive layers, thus increasing the capacitance of the passive semiconductor device. In some embodiments, the capacitance can be increased by about 20% to about 80% compared to that of the other passive semiconductor devices.

In some embodiments, a semiconductor device includes a substrate, first and second trenches disposed in the substrate and separated from each other by a substrate region of the substrate, first, second, and third conductive layers disposed in the first and second trenches and on the substrate region in a stacked configuration, a nitride layer, a first contact structure configured to provide a first voltage to the first conductive layer, and a second contact structure configured to provide a second voltage to the second conductive layer. The nitride layer includes a first nitride portion and a second nitride portion disposed on the first and second trenches and on the substrate region. The first nitride portion is disposed on a top surface of the first conductive layer and on sidewalls of the second and third conductive layers. The second nitride portion is disposed on a top surface of the second conductive layer and on sidewalls of the third conductive layers.

In some embodiments, a structure includes a semiconductor device and an interconnect structure disposed on the semiconductor device. The semiconductor device includes first and second trenches disposed in a substrate, a first capacitor, and a second capacitor. The first capacitor includes first and second conductive layers disposed in the first and second trenches. The second capacitor includes the second conductive layer and a third conductive layer disposed in the first and second trenches. The semiconductor device further includes a first contact structure disposed on the first conductive layer and overlapping the first trench and a second contact structure disposed on the second conductive layer and overlapping the second trench. The interconnect structure is configured to provide a first voltage to the first conductive layer and a second voltage to the second conductive layer. The first and second voltages are different from each other.

In some embodiments, a method includes forming first and second trenches in a substrate, forming a stack of conductive layers in the first and second trenches, forming first and second openings overlapping the first and second trenches, respectively, and in the stack of conductive layers, forming a dielectric layer with a first dielectric portion in the first opening and a second dielectric portion in the second opening, and forming first and second contact structures on first and second layers, respectively, in the stack of conductive layers.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   first and second trenches disposed in the substrate and separated from each other by a substrate region of the substrate;
   first, second, and third conductive layers disposed in the first and second trenches and on the substrate region in a stacked configuration;
   a nitride layer comprising a first nitride portion and a second nitride portion disposed on the first and second trenches and on the substrate region,
   wherein the first nitride portion is disposed on and in contact with a top surface of a portion of the first conductive layer that is in the first trench and on sidewalls of the second and third conductive layers, and
   wherein the second nitride portion is disposed on a top surface of the second conductive layer and on sidewalls of the third conductive layers;
   a first contact structure electrically connected to the first conductive layer; and
   a second contact structure electrically connected to the second conductive layer.

2. The semiconductor device of claim 1, wherein the first contact structure is configured to provide a first voltage to the first conductive layer and the second contact structure is configured to provide a second voltage to the second conductive layer.

3. The semiconductor device of claim 1, wherein the first contact structure overlaps the first trench and the second contact structure overlaps the second trench.

4. The semiconductor device of claim 1, wherein the first nitride portion surrounds the first contact structure and the second nitride portion surrounds the second contact structure.

5. The semiconductor device of claim 1, further comprising a high-k dielectric layer disposed between the first and second conductive layers, wherein the first nitride portion is disposed on the high-k dielectric layer.

6. The semiconductor device of claim 1, further comprising a high-k dielectric layer disposed between the second and third conductive layers, wherein the second nitride portion is disposed on the high-k dielectric layer.

7. The semiconductor device of claim 1, further comprising an oxide layer disposed between the first conductive layer and the first trench.

8. The semiconductor device of claim 1, further comprising a third trench disposed between the first and second trenches, wherein an elongated side of the third trench is substantially perpendicular to elongated sides of the first and second trenches.

9. The semiconductor device of claim 8, wherein the first, second, and third conductive layers are disposed in the third trench.

10. The semiconductor device of claim 8, further comprising a third contact structure overlapping the third trench and configured to provide a first voltage to the third conductive layer.

11. A structure, comprising:
a semiconductor device, comprising:
    first and second trenches disposed in a substrate;
    a first capacitor comprising first and second conductive layers disposed in the first and second trenches;
    a second capacitor comprising the second conductive layer and a third conductive layer disposed in the first and second trenches;
    a first contact structure extending into the first conductive layer and overlapping the first trench; and
    a second contact structure extending into the second conductive layer and overlapping the second trench; and
an interconnect structure disposed on the semiconductor device.

12. The structure of claim 11, wherein the interconnect structure comprises a metal line electrically connected to the first contact structure and configured to provide a first voltage to the first conductive layer.

13. The structure of claim 12, wherein the interconnect structure comprises a metal line electrically connected to the second contact structure and configured to provide a second voltage to the second conductive layer, the first and second voltages being different from each other.

14. The structure of claim 11, wherein the interconnect structure comprises a first metal line overlapping the first trench and a second metal line overlapping the second trench.

15. The structure of claim 11, wherein the interconnect structure comprises a metal line electrically connected to the first conductive layer, and wherein an elongated side of the metal line and an elongated side of the first trench extends in a same direction.

16. The structure of claim 11, wherein the semiconductor device further comprises a nitride layer with first and second nitride portions disposed on the first and second trenches, wherein the first nitride portion is disposed on the first conductive layer and on sidewalls of the second and third conductive layers, and wherein the second nitride portion is disposed on the second conductive layer and on sidewalls of the third conductive layer.

17. A semiconductor device, comprising:
a substrate;
first and second trenches disposed in the substrate and separated from each other by a substrate region of the substrate;
first, second, and third conductive layers disposed in the first and second trenches and on the substrate region in a stacked configuration; and
a dielectric layer comprising a first dielectric portion and a second dielectric portion disposed on the first and second trenches and on the substrate region,
    wherein the first dielectric portion is disposed on and in contact with a top surface of a portion of the first conductive layer that is in the first trench and on sidewalls of the second and third conductive layers, and
    wherein the second dielectric portion is disposed on a top surface of the second conductive layer and on sidewalls of the third conductive layers.

18. The semiconductor device of claim 17, wherein the dielectric layer comprises a silicon nitride layer or a silicon oxynitride layer.

19. The semiconductor device of claim 17, further comprising an oxide layer disposed between the first conductive layer and the first trench.

20. The semiconductor device of claim 17, further comprising a high-k dielectric layer disposed between the second and third conductive layers, wherein the second dielectric portion is disposed on the high-k dielectric layer.

* * * * *